United States Patent
Funyuu et al.

(10) Patent No.: US 10,840,451 B2
(45) Date of Patent: Nov. 17, 2020

(54) ORGANIC ELECTRONIC MATERIAL, INK COMPOSITION CONTAINING SAME, AND ORGANIC THIN FILM, ORGANIC ELECTRONIC ELEMENT, ORGANIC ELETROLUMINESCENT ELEMENT, LIGHTING DEVICE, AND DISPLAY DEVICE FORMED THEREWITH

(71) Applicant: Hitachi Chemical Company, Ltd., Tokyo (JP)

(72) Inventors: Shigeaki Funyuu, Tsukuba (JP); Kenichi Ishitsuka, Ibaraki (JP); Yousuke Hoshi, Ibaraki (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 158 days.

(21) Appl. No.: 15/873,994

(22) Filed: Jan. 18, 2018

(65) Prior Publication Data

US 2018/0145257 A1    May 24, 2018

Related U.S. Application Data

(62) Division of application No. 14/724,132, filed on May 28, 2015, now Pat. No. 9,929,346, which is a division
(Continued)

(30) Foreign Application Priority Data

Jun. 1, 2009 (JP) .................................. 2009-131931

(51) Int. Cl.
*H01L 51/50* (2006.01)
*H01L 51/00* (2006.01)
(Continued)

(52) U.S. Cl.
CPC .......... *H01L 51/0035* (2013.01); *C08G 61/12* (2013.01); *C08G 61/124* (2013.01);
(Continued)

(58) Field of Classification Search
CPC . H01L 51/00; H01L 51/0034; H01L 51/0035; H01L 51/0043; H01L 51/0044;
(Continued)

(56) References Cited

U.S. PATENT DOCUMENTS 5,707,779 A   1/1998  Naito
6,372,154 B1  4/2002  Li
(Continued)

FOREIGN PATENT DOCUMENTS

DE  10 2004 009355 A1   9/2005
EP       0 637 899 A1   2/1995
(Continued)

OTHER PUBLICATIONS

Gross et al.,Combinatorial optimization of polymeric anodes for use in organic light-emitting diodes. Symposium on Integrated Optics, 2001, 102-108 (Year: 2001).*
(Continued)

*Primary Examiner* — Gregory D Clark
(74) *Attorney, Agent, or Firm* — Fitch, Even, Tabin & Flannery, L.L.P.

(57) ABSTRACT

Provided are: an organic electronic material which can be easily multilayered and that can be used in substrates, such as resin, that cannot be processed at high temperatures; an ink composition containing the same; an organic thin film formed using said organic electronic material or said ink composition; and an organic electronic element and an organic EL element that are formed using said organic thin film and that have a superior luminous efficacy and emission lifespan than conventional elements. Specifically, provided (Continued)

are: an organic electronic material that is characterized by containing an oligomer or a polymer having a structure that branches into three or more directions and has at least one polymerizable substituent; an ink composition containing said organic electronic material; and an organic thin film prepared using the aforementioned organic electronic material. Further, provided are an organic electronic element and an organic electroluminescent element containing said organic thin film.

25 Claims, 1 Drawing Sheet

Related U.S. Application Data of application No. 13/375,757, filed as application No. PCT/JP2010/059121 on May 28, 2010, now abandoned.

(51) Int. Cl.
- C08G 61/12 (2006.01)
- C09D 11/52 (2014.01)
- C08G 73/02 (2006.01)
- C09D 165/00 (2006.01)
- C09K 11/06 (2006.01)
- H01L 51/52 (2006.01)

(52) U.S. Cl.
CPC .......... C08G 73/0266 (2013.01); C09D 11/52 (2013.01); C09D 165/00 (2013.01); C09K 11/06 (2013.01); H01L 51/0003 (2013.01); H01L 51/0036 (2013.01); H01L 51/0039 (2013.01); H01L 51/0043 (2013.01); C08G 2261/131 (2013.01); C08G 2261/132 (2013.01); C08G 2261/135 (2013.01); C08G 2261/1424 (2013.01); C08G 2261/1434 (2013.01); C08G 2261/1644 (2013.01); C08G 2261/312 (2013.01); C08G 2261/3142 (2013.01); C08G 2261/3162 (2013.01); C08G 2261/3241 (2013.01); C08G 2261/354 (2013.01); C08G 2261/364 (2013.01); C08G 2261/411 (2013.01); C08G 2261/512 (2013.01); C08G 2261/76 (2013.01); C09K 2211/1425 (2013.01); C09K 2211/1433 (2013.01); C09K 2211/1466 (2013.01); H01L 51/0037 (2013.01); H01L 51/0097 (2013.01); H01L 51/5012 (2013.01); H01L 51/5056 (2013.01); H01L 51/5088 (2013.01); H01L 51/5221 (2013.01); H01L 2251/5338 (2013.01)

(58) Field of Classification Search
CPC ............... H01L 51/5056; H01L 51/506; H01L 51/5088
See application file for complete search history.

(56) References Cited

U.S. PATENT DOCUMENTS

| | | | | |
|---|---|---|---|---|
| 8,431,434 | B2* | 4/2013 | Tessler | B82Y 10/00 257/40 |
| 2002/0001732 | A1* | 1/2002 | Schoo | C07C 17/093 428/690 |
| 2005/0046336 | A1 | 3/2005 | Utsumi et al. | |
| 2007/0029556 | A1* | 2/2007 | Su | H01L 51/002 257/79 |
| 2007/0132375 | A1* | 6/2007 | Bachmann | H01L 51/5256 313/505 |
| 2007/0272917 | A1 | 11/2007 | Cupertino et al. | |

| | | | |
|---|---|---|---|
| 2009/0321723 | A1 | 12/2009 | Hoshi et al. |
| 2010/0045174 | A1 | 2/2010 | Okabe et al. |
| 2012/0091443 | A1 | 4/2012 | Okabe et al. |

FOREIGN PATENT DOCUMENTS

| | | |
|---|---|---|
| EP | 1 275 652 A2 | 1/2003 |
| EP | 1 398 336 A1 | 3/2004 |
| JP | 09-255774 | 9/1997 |
| JP | 10-509996 | 9/1998 |
| JP | 2003-007763 | 1/2003 |
| JP | 2004-505169 | 2/2004 |
| JP | 2004-199935 | 7/2004 |
| JP | 2005-179634 | 7/2005 |
| JP | 2005-239789 A | 9/2005 |
| JP | 2006-510231 A | 3/2006 |
| JP | 2007-504656 | 3/2007 |
| JP | 2007-110097 | 4/2007 |
| JP | 2007-119763 | 5/2007 |
| JP | 2007-514298 | 5/2007 |
| JP | 2008-509565 | 3/2008 |
| JP | 2008-179790 | 8/2008 |
| JP | 2008-198989 | 8/2008 |
| JP | 2008-218983 A | 9/2008 |
| JP | 2008-227483 | 9/2008 |
| JP | 2006-248241 A | 10/2008 |
| JP | 2008-244471 A | 10/2008 |
| JP | 2008-280506 A | 11/2008 |
| JP | 2009-501240 | 1/2009 |
| JP | 2009-071222 | 4/2009 |
| JP | 2009-117800 A | 5/2009 |
| JP | 2009-521118 | 5/2009 |
| JP | 2007-527119 | 9/2009 |
| TW | 200904940 | 2/2009 |
| WO | 2002-100129 A2 | 12/2002 |
| WO | 03/006468 A2 | 1/2003 |
| WO | 02/10129 A2 | 2/2004 |
| WO | 2004/055129 A1 | 7/2004 |
| WO | 2004/072123 A2 | 8/2004 |
| WO | 2004/072171 A2 | 8/2004 |
| WO | 2004-072172 A2 | 8/2004 |
| WO | 2004/092245 A1 | 10/2004 |
| WO | 2005/008924 A1 | 1/2005 |
| WO | 2005/024970 A1 | 3/2005 |
| WO | 2005/024971 A1 | 3/2005 |
| WO | 2005/053056 A1 | 6/2005 |
| WO | 2005/083812 A2 | 9/2005 |
| WO | 2006/025611 A1 | 3/2006 |
| WO | 2006/131185 | 12/2006 |
| WO | 2008/010487 A1 | 1/2008 |
| WO | 2006/108430 A1 | 9/2008 |
| WO | 2009/067419 A1 | 5/2009 |

OTHER PUBLICATIONS

Tessler; Electronic Formulations—Photopatterning of Liminescent Conjugated Polymers, Advanced Functional Materials, 2006, 16, 2095-2102 (Year: 2006).*

Tang et al, Spectrum-stable hyperbranched polyfluorene with photocrosslinkable group; 2007; Polymer 48(15), 4412-4418 (Year: 2007).*

B. Ma et al., "New Thermally Cross-Linkable Polymer and its Application as a Hole-Transporting Layer for Solution Processed Multilayer Organic Light Emitting Diodes," Chem. Mater., vol. 19, No. 19, pp. 4827-4832, Sep. 1, 2007.

Bacher et al., Synthesis and Characterization of Photo-Cross-Linkable Hole-Conducting Polymers, Macromolecules, vol. 38, No. 5, pp. 1640-1647, Jan. 1, 2005.

Chinese Official Action dated Nov. 24, 2014, for CN Application No. 201080024331.9.

C. David Muller, "Multi-Colour Organic Light-Emitting Displays by Solution Processing," Nature, vol. 421, No. 6925, pp. 829-833, Feb. 20, 2003.

Duo-Feng Tang, et al., "Spectrum-Stable Hyperbranched Polyfluorene with Photocrosslinkable Group," Polymer, vol. 48, pp. 4412-4418, 2007.

(56) References Cited

OTHER PUBLICATIONS

European Official Action dated Mar. 12, 2015, in connection with European Patent Application No. 10783337.8.
H. Yan et al., High-Performance Hole-Transport Layers for Polymer Light-Emitting Diodes, Implementation of Organosiloxane Cross-Linking Chemistry in Polymeric Electroluminescent Devices, J. Am. Chem. Soc. 127, pp. 3172-3183 (2005).
International Preliminary Report on Patentability, dated Dec. 22, 2011, in corresponding PCT Application No. PCT/JP2010/059121.
International Search Report for Application PCT/JP2010/059121 dated Sep. 7, 2010.
Japanese Official Action dated Aug. 5, 2014, for JP Application No. 2011-518434.
Japanese Official Action dated Nov. 18, 2014, for JP Application No. 2014-004107.
Japanese Official Action dated May 11, 2015, in connection with Japanese Application No. 2014-004107, and English language translation thereof.
M. Bayer et al., "Crosslinkable Hole-Transport Materials for Preparation of Multilayer Organic Light Emitting Devices JY Spin-Coating", Macromol. Rapid Common., vol. 20, No. 4, pp. 224-228, 1999.
M.S. Liu et al., "Thermally Cross-Linkable Hole-Transporting Materials for Improving Hole Injection in Multilayer Blue-Emitting Phosphorescent Polymer Light-Emitting Diodes," Macromolecules, vol. 41, No. 24, pp. 9570-9580, Dec. 23, 2008.
Office Action from Japanese Patent Office in counterpart Japanese Office Action 2011-518434 dated Jan. 29, 2013.
Office Action from Japanese Patent Office in counterpart Japanese Application No. 2011-518434, dated Nov. 12, 2013, 3 pages in Japanese and 7 pages in its English translation.
Office Action from Japanese Patent Office in counterpart Japanese Application No. 2011-518434, dated Jan. 29, 2013.
Office Action from Korean Patent Office in counterpart Korean Application No. 10-2011-7030441, dated May 14, 2013.
Office Action from State Intellectual Property Office of People's Republic of China in a corresponding Patent Application No. 201080024331.9 dated Jan. 13, 2014, 7 pages in Chinese with 8 pages of English translation.
Office Action dated Apr. 5, 2016, for counterpart Chinese Application No. 201080024331.9, together with English language translation thereof.
Office Action dated Jul. 29, 2015, for Chinese Application No. 201080024331.9, together with English language translation thereof; 11 pages.
Office Action dated Mar. 30, 2016, for counterpart Taiwanese Application No. 099117420, together with English language translation thereof.
Office Action dated May 16, 2016, for Taiwanese Application No. 104141126, together with English language translation thereof.
Office Action dated May 31, 2016, for Japanese Application No. 2014-225127, together with English language translation thereof.
Office Action dated Oct. 27, 2015, for Japanese Application No. 2014-225127, together with English language translation thereof.
Supplementary European Search Report from European Patent Office in counterpart European Application No. 10 78 3337, dated Nov. 20, 2013, pp. 1-14.
T. Braig, et al., "Crosslinkable Hole-Transport Polymers by Palladium-Catalyzed C—N-coupling reaction," Macromol. Rapid Common., vol. 21, No. 9, pp. 583-589, (2000).
Taiwanese Official Action dated Aug. 20, 2014, for TW Application No. 099117420.
Taiwanese Official Action dated Jun. 11, 2015, in connection with TW Application No. 099117420, and English language translation thereof.
Y Goto et al., "All-Wet-Process Organic Electroluminescent Device Using Electron Transporting and Alcohol-Soluble Organic Semiconductor", IDW '04 Proceedings of the 11th International Display Workshop, pp. 1343-1346 (2004).

\* cited by examiner

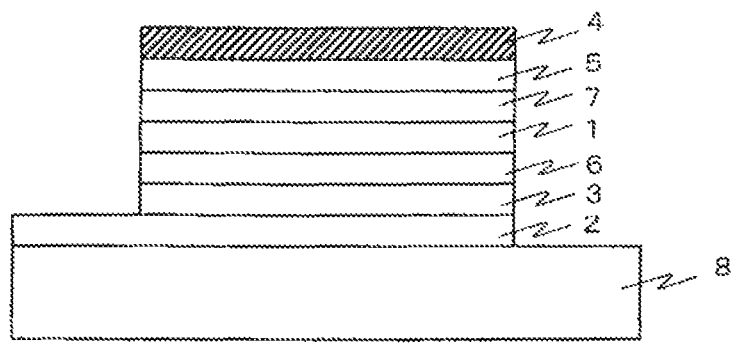

ORGANIC ELECTRONIC MATERIAL, INK COMPOSITION CONTAINING SAME, AND ORGANIC THIN FILM, ORGANIC ELECTRONIC ELEMENT, ORGANIC ELETROLUMINESCENT ELEMENT, LIGHTING DEVICE, AND DISPLAY DEVICE FORMED THEREWITH

This application is a divisional application of pending U.S. application Ser. No. 14/724,132, filed in the U.S. Patent and Trademark Office on May 28, 2015, which is a divisional application of U.S. application Ser. No. 13/375,757, filed in the U.S. Patent and Trademark Office on Dec. 1, 2011, the entire contents of each of which are incorporated herein by reference.

TECHNICAL FIELD

The present invention relates to an organic electronic material and an ink composition containing the material, and an organic thin film, an organic electronic element, an organic electroluminescent element (hereinafter, also referred to as organic EL element), a lighting device and a display device, all of which use the organic electronic material and the ink composition.

BACKGROUND ART

Organic electronic elements are elements that carry out an electrical operation using organic substances, and are expected to exhibit features such as energy saving, low price, and flexibility. Thus, more attention is being paid to organic electronic elements as a technology replacing the traditional inorganic semiconductors that are mainly composed of silicon.

Examples of the organic electronic elements include organic EL elements, organic transistors, and organic solar cells.

Among the organic electronic elements, the organic EL elements are attracting attention for their use as, for example, large-sized solid state light sources as a substitute for incandescent lamps and gas-filled lamps. Furthermore, the organic EL elements are also receiving attention as the most promising self-emissive displays substituting for liquid crystal displays (LCD) in the field of flat panel display (FPD), and thus, productization of the organic EL elements is in progress.

The organic EL elements are largely classified into two classes such as low molecular weight type organic EL elements and polymer type organic EL elements, on the basis of the material used and the film forming method. The polymer type organic EL elements are such that since the organic material is composed of a polymeric material, film formation can be conveniently achieved during printing, inkjetting or the like as compared with the low molecular weight type organic EL elements which require a vacuum system for film formation, and therefore, the polymer type organic EL elements are elements indispensable for large-sized organic EL displays of the future.

Vigorous research has been conducted so far on the low molecular weight type organic EL elements and the polymer type organic EL elements, but there still are problems of low light emission efficiency and a short element lifetime. As a means to address these problems, the low molecular weight type organic EL elements are fabricated to have a multilayer structure.

FIG. 1 shows an example of a multilayered organic EL element. In FIG. 1, a layer which is in charge of light emission is indicated as a light emitting layer 1, and in case that the organic EL element has other layers, a layer that is in contact with an anode 2 is indicated as a hole injection layer 3, while a layer that is in contact with a cathode 4 is indicated as an electron injection layer 5. Furthermore, if another layer is present between the light emitting layer 1 and the hole injection layer 3, the layer is indicated as a hole transport layer 6. If another layer is present between the light emitting layer 1 and the electron injection layer 5, the layer is indicated as an electron transport layer 7. In FIG. 1, reference numeral 8 indicates a substrate.

Since film formation during the production of low molecular weight type organic EL elements is dominantly carried out by a vapor deposition method, a multilayer structure can be easily achieved by performing vapor deposition while sequentially changing the compounds used. On the other hand, in the case of the polymer type organic EL elements, since film formation is carried out using a wet process such as printing or inkjetting, there occurs a problem that when an upper layer is applied, the lower layer undergoes dissolution.

Therefore, providing a multilayer structure in the polymer type organic EL elements is more difficult than in the case of the low molecular weight type organic EL elements, and the effects of enhancing the light emission efficiency and improving the lifetime could not be obtained.

In order to cope with this problem, several methods have been hitherto suggested. One of them is a method of using the difference in solubility. For example, an element having a two-layer structure of a hole injection layer formed from water-soluble polythiophene:polystyrene sulfonate (PEDOT:PSS), and a light emitting layer formed by using an aromatic organic solvent such as toluene. In this case, since the PEDOT:PSS layer does not dissolve in an aromatic solvent such as toluene, it is possible to produce a two-layer structure.

However, when water-soluble PEDOT:PSS is used, the moisture remaining in the thin film needs to be removed, and this removal of moisture is difficult and causes deterioration of the properties of the organic electronic element. Further, for the removal of moisture, it is necessary to dry the element at high temperature for a long time period, so that production of an organic electronic element on a resin substrate is difficult, or significant restrictions are imposed on the process, such as reduced pressure conditions.

Furthermore, there has been disclosed, as an example using an organic solvent, a method of selecting a solvent that does not affect a lower layer that has been formed earlier (see Patent Document 1).

However, in such a method, the solvent that can be used is limited to a solvent that does not dissolve the lower layer, and therefore, there is a problem that only a narrow choice of materials is available. Further, a certain degree of erosion occurs in the lower layer at the time of the formation of an upper layer.

Furthermore, Non-Patent Document 1 suggests an element having a three-layer structure which uses compounds having largely different solubility.

Patent Document 2 also discloses an element having, on a PEDOT:PSS layer, a three-layer structure into which a layer called interlayer has been introduced.

In order to overcome such problems, Non-Patent Documents 2 to 4 and Patent Document 3 disclose methods of making a thin film insoluble to a solvent by utilizing a polymerization reaction of a siloxane compound, an oxetane group, a vinyl group or the like and thereby changing the solubility of the compound.

Methods for providing a multilayer structure as such are important. However, there is the problem described above that is attributable to the moisture remaining in the thin film when water-soluble PEDOT:PSS is used, or there are problems that there are restrictions on the material that can be used, in order to utilize the difference in solubility, that siloxane compounds are unstable to moisture in air, and that the properties of the element are not satisfactory.

Further, in the case of utilizing a polymerization reaction, it is necessary to add an appropriate polymerization initiator that generates an acid, a base, a radical or the like, and to thereby initiate the polymerization reaction through stimulation such as light or heat.

As a cause for initiating the polymerization reaction, heating or a combined use of light irradiation and heating is generally used, and in order to bring the polymerization reaction to a sufficient extent, it is needed to heat the reaction system at a temperature of 120° C. or higher (Non-Patent Document 4 and Non-Patent Document 5).

Here, there is a need to apply a substrate made of an inexpensive and flexible resin in the production of a flexible organic EL element in view of reducing the production cost for organic EL elements. However, since such a substrate undergoes softening, decomposition or degeneration due to high temperature, there is a problem that the method of bringing the polymerization reaction cannot be utilized.

In addition, a method of using a crosslinking reaction has been suggested as another method of producing a multilayer structure. Patent Document 4 discloses a method of crosslinking triphenylamine-containing ether polyether ketone by ultraviolet irradiation, and thereby making the compound insoluble. In order to make the compound sufficiently insoluble through this method, there is a problem that ultraviolet irradiation for a long time period is required, and decomposition of triphenylamine or the like occurs.

Furthermore, Patent Document 5, Patent Document 6, Non-Patent Document 6, and Non-Patent Document 7 disclose the production of a multilayer structure through crosslinking of an oxetane group. In these methods, photoinitiators are used, and therefore, there is a concern for deterioration due to light. Furthermore, there is a problem that sufficient insolubilization at low temperature does not proceed, and, and the application of resin substrates which require low temperature curing is restricted, or there is a problem that at the time of forming an upper layer, the upper layer and the lower layer are intermixed, causing deterioration of the organic EL characteristics. Moreover, the photoinitiators used in these methods are general iodonium salts or sulfonium salts, and there is a concern for the influence of these compounds on the EL characteristics.

On the other hand, an investigation is being conducted on the use of an iodonium salt or sulfonium salt having the same structure as that of the photoinitiators in the hole transport layer or the light emitting layer, for the purpose of lowering the driving voltage, which is a problem for organic EL elements.

Patent Document 7 discloses an ionic compound, but this has the same structure as that of the photoinitiator described above, and thus there is a concern for the influence of the compound on the properties of the organic EL elements. Furthermore, there are no descriptions on crosslinking or lamination.

Patent Document 8 discloses a polymer illuminant composition containing a polymer illuminant and an ion pair. There is a description that a light emitting element having a much longer lifetime may be obtained by incorporating an ion pair having a specific structure according to the disclosure, but there are no descriptions on the injection and transport of charges. There are also no descriptions on crosslinking or lamination.

CITATION LIST

Patent Documents

Patent Document 1: Japanese Patent Application Laid-Open (JP-A) No. 2003-07763
Patent Document 2: JP-A No. 2007-119763
Patent Document 3: WO 2008/010487
Patent Document 4: Japanese Patent No. 3643433
Patent Document 5: JP-A No. 2004-199935
Patent Document 6: Japanese Patent Application National Publication (Laid-Open) No. 2007-514298
Patent Document 7: WO 05/08924
Patent Document 8: JP-A No. 2005-179634

Non-Patent Documents

Non-Patent Document 1: Y. Goto, T. Hayashida, M. Noto, IDW '04 Proceedings of the 11th International Display Workshop, 1343-1346 (2004)
Non-Patent Document 2: H. Yan, P. Lee, N. R., Armstrong A. Graham, G. A. Evemenko, P. Dutta, T. J. Marks, J. Am. Chem. Soc., 127, 3172-4183 (2005)
Non-Patent Document 3: E. Bacher, M. Bayerl, P. Rudati, N. Reckfuss, C. David, K. Meerholz, O. Nuyken, Macromolecules 38, 1640 (2005)
Non-Patent Document 4: M. S. Liu, Y. H. Niu, J. W. Ka, H. L. Yip, F. Huang, J. Luo, T. D. Wong, A. K. Y. Jen, Macromolecules, 41, 9570 (2008)
Non-Patent Document 5: B. Ma, F. Lauterwasser, L. Deng, C. S. Zonte, B. J. Kim, J. M. J. Frchet, C. Borek, M. E. Thompson, Chem. Mater., 19(19), 4827 (2007)
Non-Patent Document 6: Macromol. Rapid Commun., 20, 224-228 (1999)
Non-Patent Document 7: Nature, 421 (2003) 829-833

DISCLOSURE OF THE INVENTION

Problem to be Solved by the Invention

In order to achieve an increase in the efficiency and an extension of the lifetime of an organic EL element, it is desirable to provide a multilayer structure for the organic layers and to separate the functions among the respective layers. However, in the case of producing an organic EL element by a coating method, in order to provide a multilayer structure for the organic layers using a wet process which facilitates film formation even in large-sized elements, it is necessary to prevent the lower layer from dissolving when the upper layer is formed. Furthermore, there is a problem that when a film that is insoluble in solvents is formed on a flexible substrate using a polymerization reaction, heating at higher temperature cannot be applied.

In view of the problems described above, an object of the present invention is to provide an organic electronic material which can be easily produced to have a multilayer structure and can also be used on a substrate that cannot be treated at high temperature, such as a resin, and an ink composition containing the organic electronic material. Another object of the present invention is to provide an organic thin film which is formed by using the organic electronic material or the ink composition, an organic electronic element which uses the organic thin film and has superior light emission efficiency and a superior emission lifetime than conventional electronic elements, an organic EL element, a lighting device, and a display device which includes the organic EL element and the lighting device.

Furthermore, another object of the present invention is to provide, in view of the problems described above, an organic electronic material with which an organic electronic element capable of lowering of the driving voltage or stable long-term driving, can be produced. Still another object of the present invention is to provide an organic electronic material that can be cured at low temperature by a coating method, and a multilayer organic electronic element using the organic electronic material. Still another object of the present invention is to provide an organic electroluminescent element, a display element, and a lighting device.

Means for Solving the Problem

The inventors of the present invention conductive a thorough investigation, and as a result, they found that an organic electronic material containing a polymer or oligomer which has a structure branching in three or more directions and has at least one or more polymerizable substituents, and an ink composition containing the organic electronic material, can stably and easily form a thin film, and that the solubility changes through a polymerization reaction. The inventors also found that when an organic thin film formed by using the organic electronic material or the ink composition is used in an organic electronic element, particularly an organic EL element, a lighting device, and a display device including the elements, the organic thin film can lower the driving voltage and increase the light emission efficiency. Thus, the inventors finally completed the present invention.

Furthermore, the inventors conducted a thorough investigation, and as a result, they found that when an ionic compound having a particular counter cation, which is not the iodonium or sulfonium used as a general photoinitiator, and a charge transporting compound are contained, lowering of the driving voltage or stable long-term driving can be achieved, thus completing the present invention.

That is, the present invention provides the following items.

(1) An organic electronic material containing a polymer or oligomer which has a structure branching in three or more directions and has at least one polymerizable substituent.

(2) The organic electronic material as set forth in the item (1), wherein the polymer or oligomer contains at least any one of the structures of the following formulas (1) to (10) as a unit serving as the starting point for forming the branched structure.

[Chemical Formula 1]

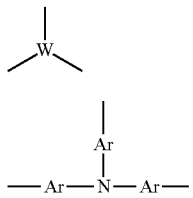

(1)

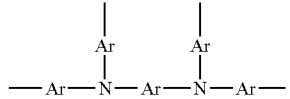

(2)

-continued

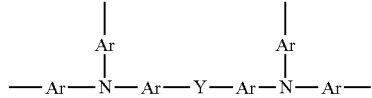

(3)

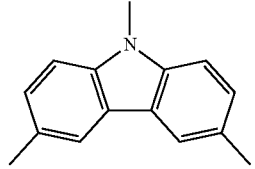

(4)

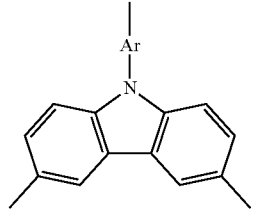

(5)

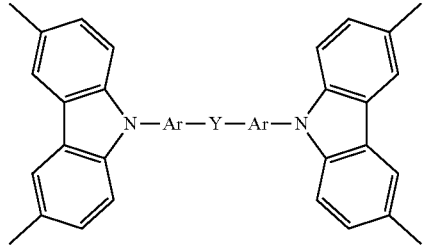

(6)

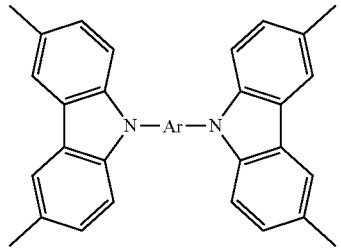

(7)

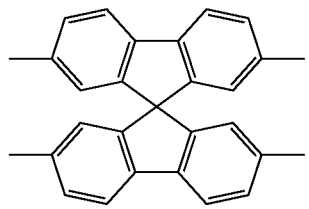

(8)

(9)

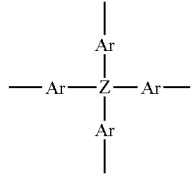

(10)

(wherein Ar's each independently represent a divalent linking group, each representing an arylene group or heteroarylene group having 2 to 30 carbon atoms; W represents a trivalent linking group, which is an atomic group obtained by further excluding one hydrogen atom from the arylene group or the heteroarylene group and may be substituted; Y's each independently represent a divalent linking group; and Z represents any one of a carbon atom, a silicon atom and a phosphorus atom.)

(3) The organic electronic material as set forth in the item (2), wherein Y in the formula (4) or (7) is a divalent linking group represented by one of the following formulas.

[Chemical Formula 2]

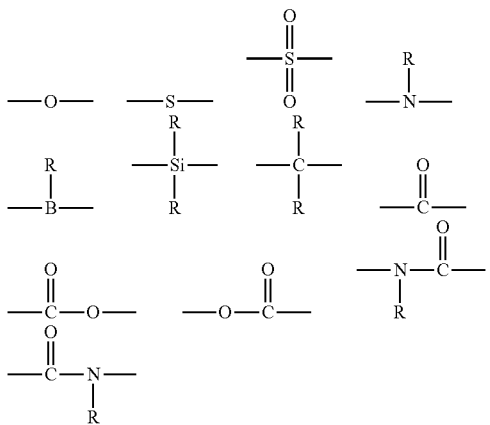

(wherein R's each independently represent a hydrogen atom, an optionally substituted, linear, cyclic or branched alkyl group having 1 to 22 carbon atoms, or an optionally substituted aryl group or heteroaryl group having 2 to 30 carbon atoms.)

(4) The organic electronic material as set forth in any one of the items (1) to (3), wherein the polymer or oligomer contains at least one charge transporting group.

(5) The organic electronic material as set forth in any one of the items (1) to (4), wherein the polymer or oligomer contains at least one polymerizable substituent.

(6) The organic electronic material as set forth in the item (5), wherein the polymerizable substituent is introduced into an end of the polymer or oligomer.

(7) The organic electronic material as set forth in the item (5) or (6), wherein three or more of the polymerizable substituents are introduced into one molecule of the polymer or oligomer.

(8) The organic electronic material as set forth in any one of the items (5) to (7), wherein the polymerizable substituent is any one of an oxetane group, an epoxy group, a vinyl group, an acrylate group and a methacrylate group.

(9) The organic electronic material as set forth in any one of the items (1) to (8), wherein the polymer or oligomer has a partial structure represented by one of the following formulas.

[Chemical Formula 3]

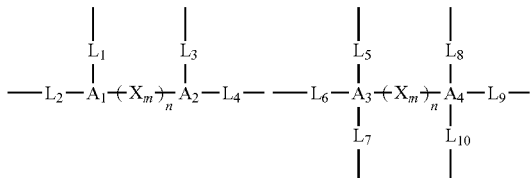

(wherein $A_1$ and $A_2$ each independently represent a trivalent linking group; $A_3$ and $A_4$ each independently represent a tetravalent linking group; $L_1$ to $L_{10}$ each independently represent a divalent linking group; $X_m$ represents a divalent linking group; n represents an integer of 1 or greater; and m represents 1 or an integer from 1 to n.)

(10) The organic electronic material as set forth in any one of the items (1) to (9), wherein the number average molecular weight of the polymer or oligomer is from 1,000 to 1,000,000.

(11) The organic electronic material as set forth in any one of the items (1) to (10), wherein the polydispersity of the polymer or oligomer is greater than 1.0.

(12) The organic electronic material as set forth in any one of the items (1) to (11), further containing a dopant.

(13) The organic electronic material as set forth in any one of the items (1) to (12), further containing a polymerization initiator.

(14) The organic electronic material as set forth in the item (13), wherein the polymerization initiator is a thermal polymerization initiator.

(15) The organic electronic material as set forth in the item (13), wherein the polymerization initiator is an ionic compound.

(16) The organic electronic material as set forth in the item (14) or (15), wherein the polymerization initiator also functions as a dopant.

(17) An ink composition including the organic electronic material as set forth in any one of the items (1) to (16).

(18) An organic thin film produced using the organic electronic material as set forth in any one of the items (1) to (16) or the ink composition as set forth in the items (17).

(19) An organic electronic element including the organic thin film as set forth in the item (18).

(20) An organic electroluminescent element including the organic thin film as set forth in the item (18).

(21) An organic electroluminescent element formed by laminating at least a substrate, an anode, a hole injection layer, a light emitting layer and a cathode, wherein the hole injection layer is a layer formed from the organic thin film as set forth in the item (18).

(22) An organic electroluminescent element formed by laminating at least a substrate, an anode, a hole transport layer, a light emitting layer and a cathode, wherein the hole transport layer is a layer formed from the organic thin film as set forth in the item (18).

(23) An organic electroluminescent element formed by laminating at least a substrate, an anode, a light emitting layer and a cathode, wherein the light emitting layer is a layer formed from the organic thin film as set forth in the item (18).

(24) The organic electroluminescent element as set forth in any one of the items (20) to (23), wherein the emission color is white.

(25) The organic electroluminescent element as set forth in any one of the items (20) to (24), wherein the substrate is a flexible substrate.

(26) The organic electroluminescent element as set forth in any one of the items (20) to (25), wherein the substrate is a resin film.

(27) A display element including the organic electroluminescent element as set forth in any one of the items (20) to (26).

(28) A lighting device including the organic electroluminescent element as set forth in any one of the items (20) to (26).

(29) A display device including the lighting device as set forth in the item (28), and a liquid crystal element as a display unit.

(30) An organic electronic material containing at least an ionic compound and a compound having a charge transporting unit (hereinafter, referred to as a charge transporting compound), wherein the ionic compound is composed of a counter cation and a counter anion, and the counter cation is any one kind or two or more kinds of H⁺, a carbocation, a nitrogen cation, an oxygen cation, and a cation having a transition metal.

(31) The organic electronic material as set forth in the item (30), wherein the carbocation is a tertiary carbocation.

(32) The organic electronic material as set forth in the item (30) or (31), wherein the nitrogen cation is a tertiary or quaternary nitrogen cation.

(33) The organic electronic material as set forth in any one of the items (30) to (32), wherein the counter anion is any one kind or two or more kinds of fluorophosphates ions, fluorinated alkyl fluorophosphate ions, borate ions, and fluoroantimonate ions.

(34) The organic electronic material as set forth in any one of the items (30) to (33), wherein the charge transporting compound has at least one structure selected from triarylamine, carbazole, and thiophene.

(35) The organic electronic material as set forth in any one of the items (30) to (33), wherein the charge transporting compound is a polymer or oligomer containing a repeating unit represented by any one of the following formulas (1a) to (7a) and having hole transport properties.

[Chemical Formula 4]

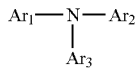

(1a)

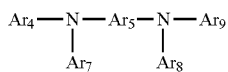

(2a)

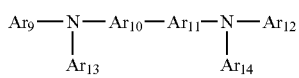

(3a)

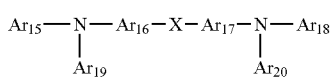

(4a)

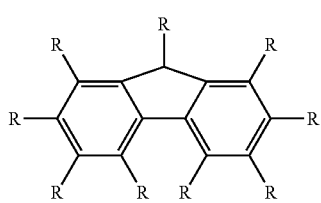

(5a)

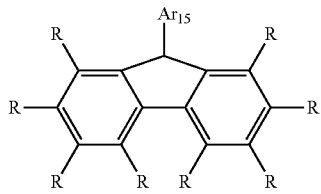

(6a)

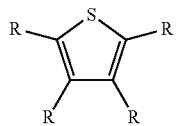

(7a)

(wherein $Ar_1$ to $Ar_2$ each independently represent an aryl group or heteroaryl group having 2 to 30 carbon atoms, or a substituted or unsubstituted arylene group or heteroarylene group. Here, the aryl group represents an atomic group obtained by excluding one hydrogen atom from an aromatic hydrocarbon, and a heteroaryl group represents an atomic group obtained by excluding one hydrogen atom from an aromatic compound having a heteroatom; R's each independently represent —$R^1$, —$OR^2$, —$SR^3$, —$OCOR^4$, —$COOR^5$, —$SiR^6R^7R^8$, or one of the formulas (2a) to (4a) (provided that $R^1$ to $R^8$ each represent a hydrogen atom, a linear, cyclic or branched alkyl group having 1 to 22 carbon atoms, or an aryl group or heteroaryl group having 2 to 30 carbon atoms). Here, the arylene group represents an atomic group obtained by excluding two hydrogen atoms from an aromatic hydrocarbon, and a heteroarylene group represents an atomic group obtained by excluding two hydrogen atoms from an aromatic compound having a heteroatom. X represents a group obtained by further removing one hydrogen atom from a group having one or more hydrogen atoms selected among the groups represented by R.

(36) The organic electronic material as set forth in any one of the items (30) to (35), wherein the charge transporting compound has one or more polymerizable substituents.

(37) The organic electronic material as set forth in the item (36), wherein the polymerizable substituent is any one or oxetane, epoxy and vinyl ether.

(38) The organic electronic material as set forth in any one of the items (30) to (37), further containing a solvent.

(39) The organic electronic material as set forth in any one of the items (30) to (38), wherein the ionic compound is an electron-accepting compound, and the charge transporting compound can be one-electron oxidized by the ionic compound.

(40) An organic electronic element having a layer formed by applying the organic electronic material as set forth in any one of the items (30) to (39) on a substrate.

(41) The organic electronic element as set forth in the items (40), wherein the layer thus formed is insolubilized.

(42) The organic electronic element as set forth in the item (41), wherein another layer is further formed on the insolubilized layer to obtain a multilayer structure.

(43) The organic electronic element as set forth in any one of the items (40) to (42), wherein the substrate is a resin film.

(44) An organic electroluminescent element having a layer formed from the organic electronic material as set forth in any one of the items (30) to (39).

(45) An organic electroluminescent element formed by laminating at least a substrate, an anode, a hole injection layer, a polymerized layer, a light emitting layer and a cathode, wherein the polymerized layer is a layer formed from the organic electronic material as set forth in any one of the items (40) to (39).

(46) An organic electroluminescent element formed by laminating at least a substrate, an anode, a polymerized layer, a hole transport layer, a light emitting layer and a cathode, wherein the polymerized layer is a layer formed from the organic electronic material as set forth in any one of the items (30) to (39).

(47) The organic electroluminescent element as set forth in any one of the items (40) to (46), wherein the emission color is white.

(48) The organic electroluminescent element as set forth in any one of the items (45) to (47), wherein the substrate is a flexible substrate.

(49) The organic electroluminescent element as set forth in any one of the items (45) to (47), wherein the substrate is a resin film.

(50) A display element including the organic electroluminescent element as set forth in any one of the items (44) to (49).

(51) A lighting device including the organic electroluminescent element as set forth in any one of the items (44) to (49).

(52) A display device including the lighting device as set forth in the item (51), and a liquid crystal element as a display unit.

(53) The organic electronic material as set forth in any one of the items (1) to (16), further containing an ionic compound composed of a counter cation and a counter anion, wherein the counter cation is any one kind or two or more kinds of $H^+$, a carbocation, a nitrogen cation, an oxygen cation, and a cation having a transition metal.

The present patent application claims priority based on Japanese Patent Application previously filed by the same Applicant, that is, No. 2009-131931 (filed on Jun. 1, 2009), the disclosure of which has been incorporated herein by reference.

Effect of the Invention

According to the present invention, since a thin film can be stably and easily formed, and the solubility changes through a polymerization reaction, construction of a multilayer structure of organic thin film layers can be easily achieved. Furthermore, since a sufficient change in the solubility can be obtained at low temperature, an organic electronic material that can be applied to a flexible substrate such as a resin substrate, and an ink composition containing the organic electronic material can be provided. Further, according to the present invention, an organic thin film which is formed by using the organic electronic material or the ink composition, an organic electronic element which uses the organic thin film and has superior light emission efficiency and a superior emission lifetime than conventional electronic elements, an organic EL element, a lighting device, and a display device which includes the organic EL element and the lighting device.

Further, according to the present invention, an organic electronic material which can produce an organic electronic element capable of lowering of the driving voltage or stable long-term driving, and can be cured at low temperature by a coating method, a multilayered organic electronic element using the organic electronic material, an organic electroluminescent element, a display element and a lighting device can be provided. An organic electronic element, particularly an organic EL element, which is capable of lowering of the driving voltage or stable long-term driving can be provided by incorporating an ionic compound and a charge transporting compound.

BRIEF DESCRIPTION OF THE DRAWINGS

FIG. 1 is a schematic diagram showing an example of a multilayered organic EL element.

BEST MODES FOR CARRYING OUT THE INVENTION

According to a first aspect, an organic electronic material of the present invention is characterized by containing a polymer or oligomer which has a structure branching in three or more directions and has at least one polymerizable substituent.

The term "structure branching in three or more directions" according to the present invention is a structure in which the main chain of the polymer or oligomer is not in a linear form but has branches at any site. Now, the details of the structure will be described below.

[Structure Branching in Three or More Directions]

The polymer or oligomer according to the present invention has a structure branching in three or more directions, from the viewpoint of lowering the temperature for carrying out a sufficient polymerization reaction. Furthermore, this branched structure can elevate the glass transition temperature of the polymer or oligomer, and thereby contributes to an enhancement of the heat resistance of the polymer or oligomer.

This branched structure refers to the state in which when a chain having the highest degree of polymerization among the various chains in one molecule of the polymer or oligomer is designated as the main chain, side chains having an equal degree of polymerization or a lower degree of polymerization are linked to the main chain. The degree of polymerization according to the present invention indicates how many monomer units that are used to synthesize the polymer or oligomer, are included in one molecule of the polymer or oligomer. The side chain as used in the present invention means a chain that is different from the main chain of the polymer or oligomer, and has at least one or more polymerized units. Any moiety other than that is considered not as a side chain but as a substituent.

As the method for forming a branched structure, a polymer or oligomer may be formed by using a monomer having three or more polymerizable sites in one molecule, or a branched structure may also be formed by forming a linear-shaped polymer or oligomer, and then polymerizing those linear-shaped chains. Thus, there are no particular limitations.

Specifically, the polymer or oligomer preferably contains any one of the structures of the following formulas (1) to (10) as the unit serving as a starting point for forming a branched structure in the polymer or oligomer.

[Chemical Formula 5]

(1)

(2)

(3)

(4)

-continued

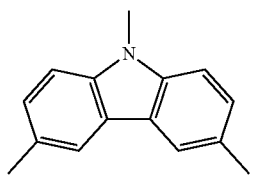
(5)

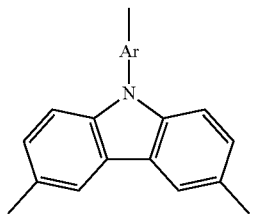
(6)

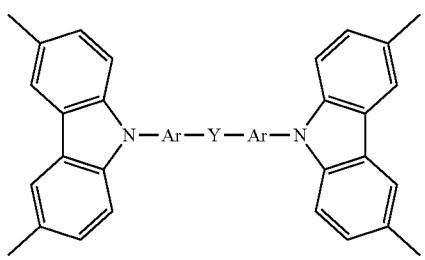
(7)

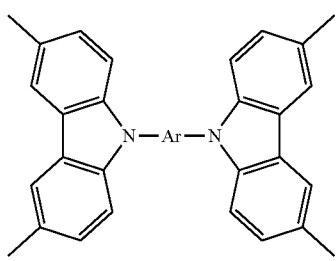
(8)

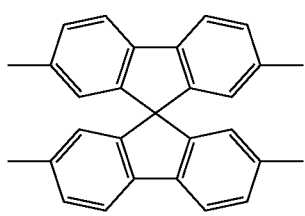
(9)

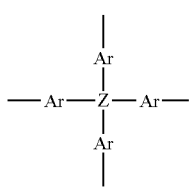
(10)

(wherein Ar's each independently represent a divalent linking group, and each represents an arylene group or heteroarylene group having 2 to 30 carbon atoms. The arylene group is an atomic group obtained by excluding two hydrogen atoms from an aromatic hydrocarbon, and may be substituted. Examples thereof include phenylene, biphenyldiyl, terphenyldiyl, naphthalenediyl, anthracenediyl, tetracenediyl, fluorenediyl, and phenanthrenediyl. The heteroaryl group is an atomic group obtained by excluding two hydrogen atoms from an aromatic compound having a heteroatom, and may be substituted. Examples thereof include pyridinediyl, pyrazinediyl, quinolinediyl, isoquinolinediyl, acridinediyl, phenanthrolinediyl, furanediyl, pyrrolodiyl, thiophenediyl, oxazolediyl, oxadiazolediyl, thiadiazolediyl, triazolediyl, benzoxazolediyl, benzoxadiazolediyl, benzothiadiazolediyl, benzotriazolediyl, and benzothiophenediyl. W represents a trivalent linking group, and is an atomic group obtained by further excluding one hydrogen atom from the arylene group or heteroarylene group, and may be substituted. Y's each independently represent a divalent linking group. Z represents any one of a carbon atom, a silicon atom and a phosphorus atom.)

Y in the formulas (1) and (7) is preferably a divalent linking group represented by one of the following formulas.

[Chemical Formula 6]

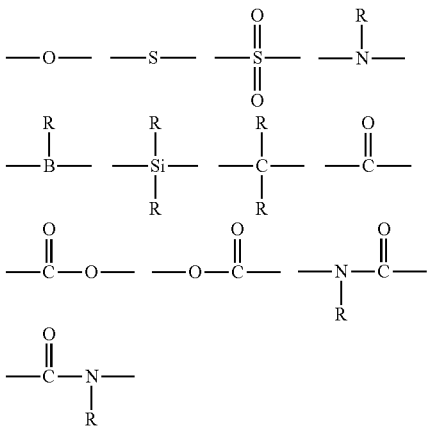

(wherein R's each independently represent a hydrogen atom, a linear, cyclic or branched alkyl group having 1 to 22 carbon atoms, or an aryl group or heteroaryl group having 2 to 30 carbon atoms. Here, the aryl group is an atomic group obtained by excluding one hydrogen atom from an aromatic hydrocarbon, and may be substituted. The heteroaryl group is an atomic group obtained by excluding one hydrogen atom from an aromatic compound having a heteroatom, and may be substituted.)

[Charge Transporting Group]

Furthermore, the polymer or oligomer according to the present invention preferably contains at least one "charge transporting group" in order to exhibit the transport capability for holes or electrons. Here, the "charge transporting group" is a substituent which makes the polymer or oligomer to have a function of transporting holes or electrons, and the details thereof will be described below.

The charge transporting group may be any group having an ability to transport holes or electrons, and particularly preferred examples include, but are not limited to, an amine or a carbazole having an aromatic ring, thiophene, fluorene, phenylene, biphenylene, terphenylene, naphthalene, anthracene, tetracene, phenanthrene, pyridine, pyrazine, quinoline, isoquinoline, acridine, furan, pyrrole, oxazole, oxadiazole, thiadiazole, triazole, benzoxazole, benzoxadiazole, benzothiadiazole, benzotriazole, and benzothiophene. Particularly, from the viewpoint of the transport of holes, a structure containing an aromatic amine, carbazole, thiophene, fluorene, phenylene or pyrrole moiety is preferred, and from the viewpoint of the transport of electrons, a structure containing a fluorene, phenylene, phenanthrene, pyridine or quinoline moiety is preferred. For example, charge transporting groups having partial structures represented by the following formulas are preferred.
[Chemical Formula 7]
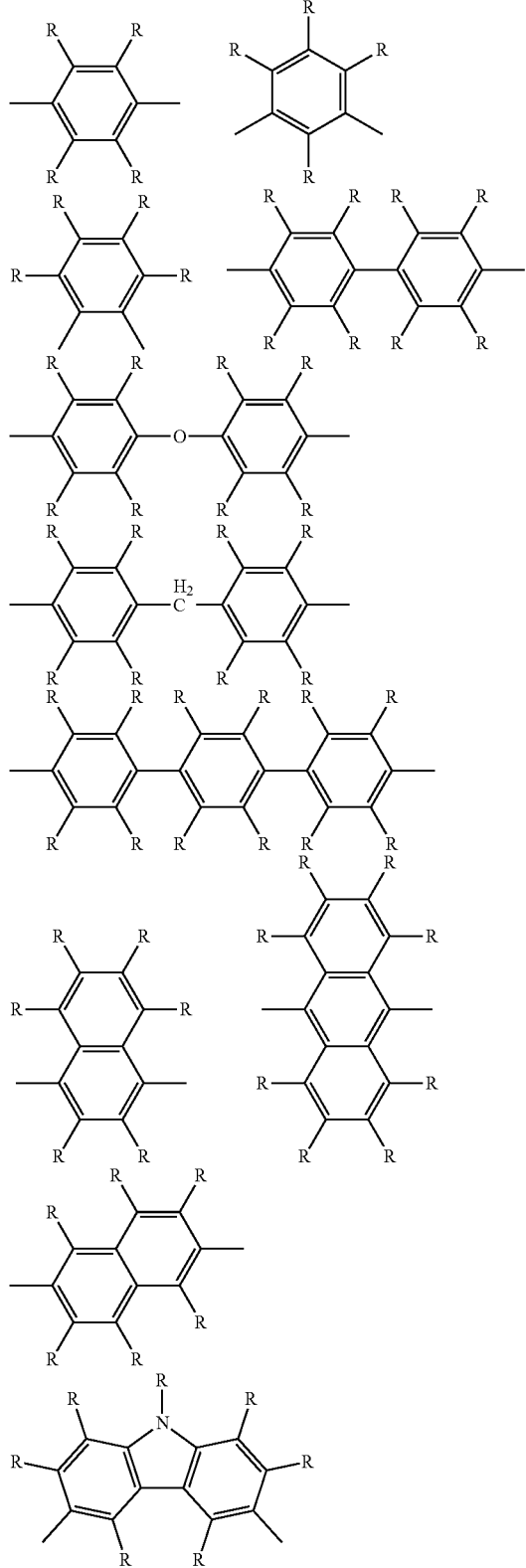
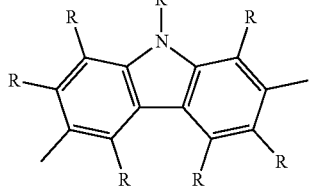
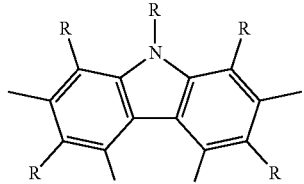
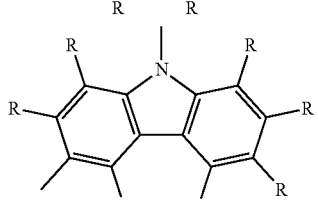
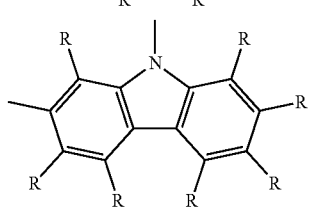
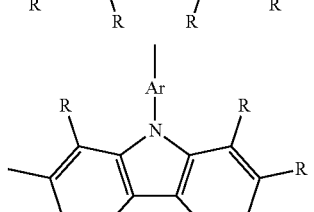
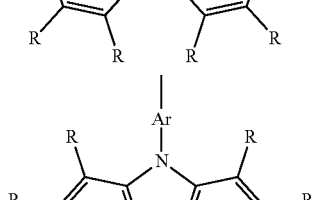
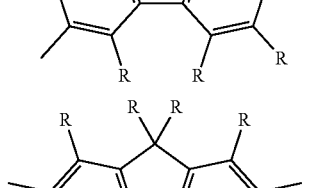
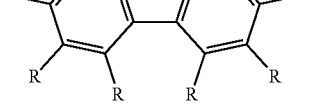
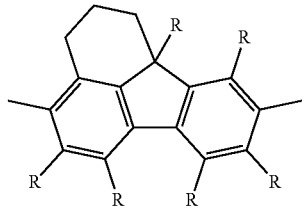

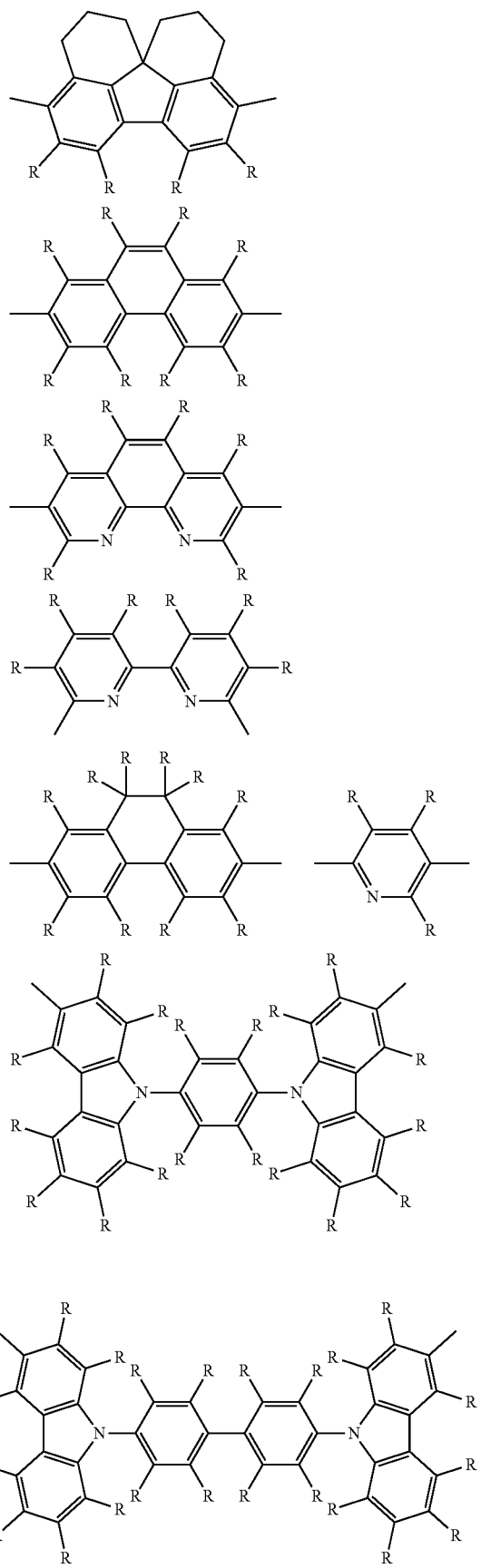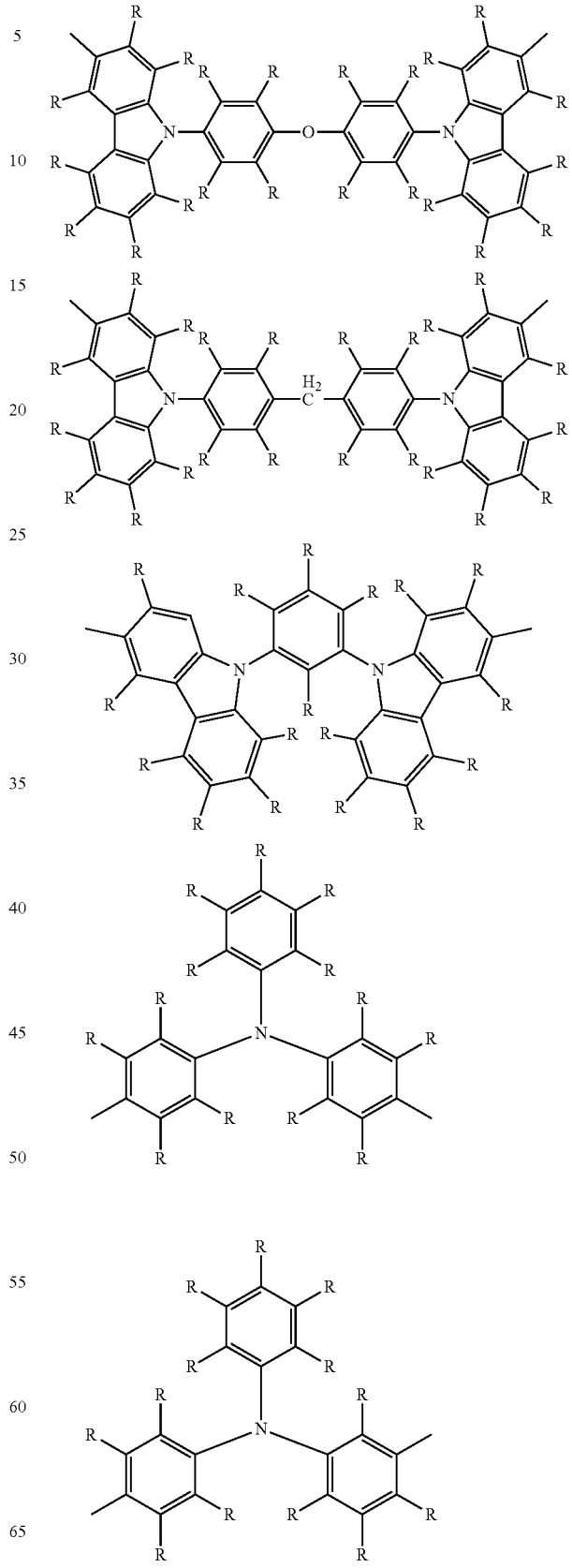

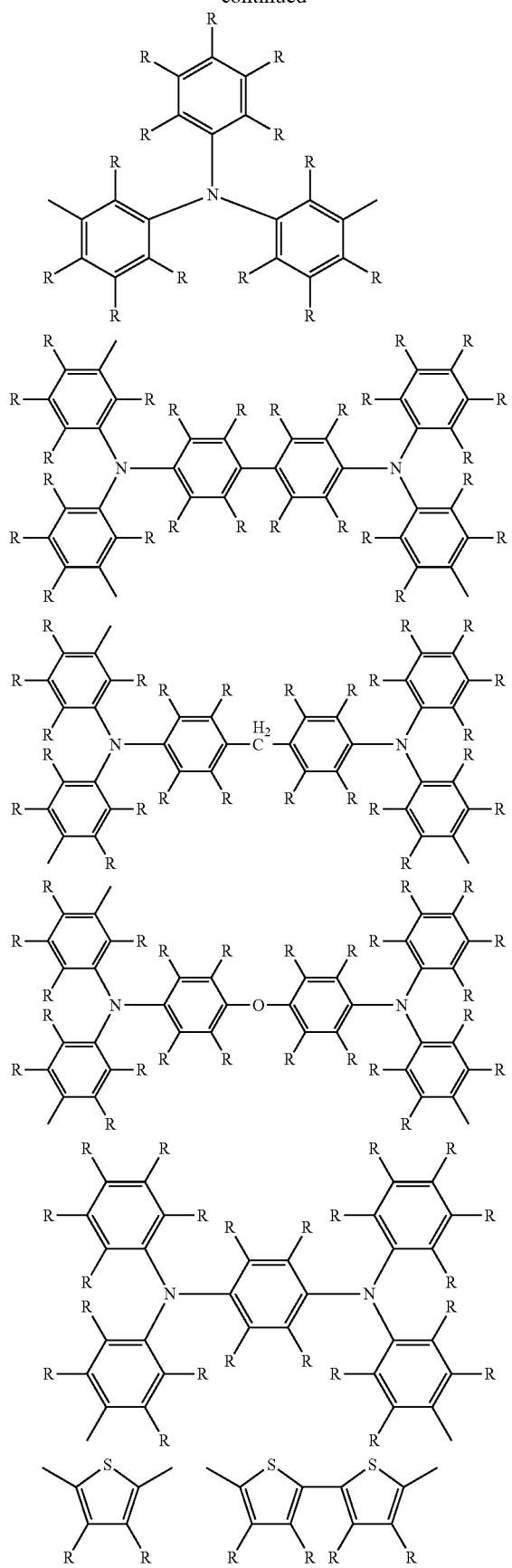
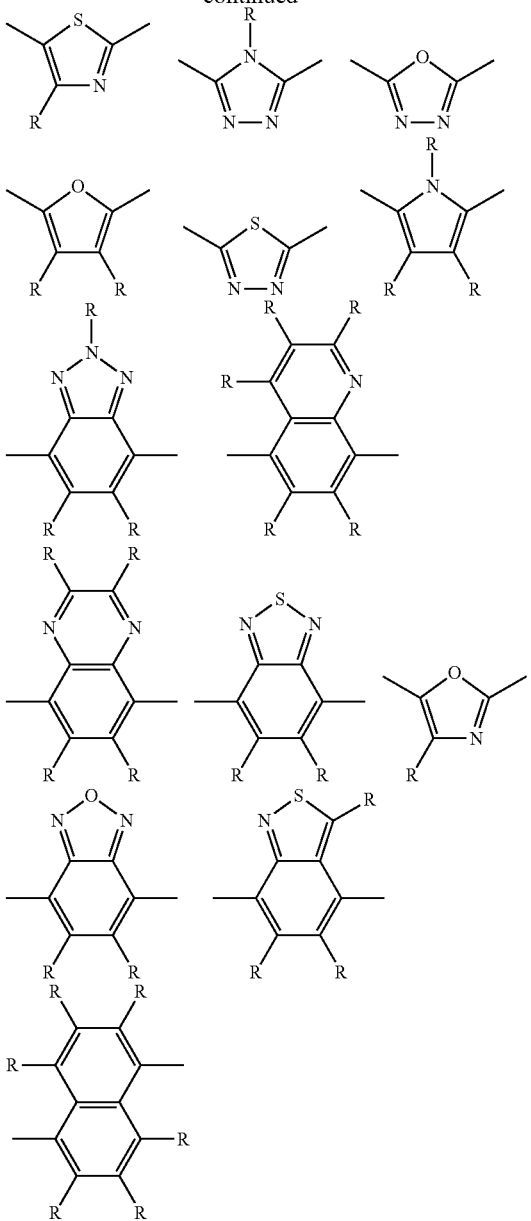

(wherein in the above formulas, R's each independently represent a hydrogen atom, a halogen atom, a linear, cyclic or branched alkyl group having 1 to 22 carbon atoms, an alkenyl group, an alkynyl group, an alkoxy group, or an aryl group or heteroaryl group having 2 to 30 carbon atoms. Here, the aryl group is an atomic group obtained by excluding one hydrogen atom from an aromatic hydrocarbon, and may be substituted. The heteroaryl group is an atomic group obtained by excluding one hydrogen atom from an aromatic compound having a heteroatom, and may be substituted. Furthermore, adjacent R's may also be joined to form a ring. Ar's each independently represent an arylene group or heteroarylene group having 2 to 30 carbon atoms. The arylene group is an atomic group obtained by excluding two hydrogen atoms from an aromatic hydrocarbon, and may be substituted. Examples thereof include phenylene, biphenyldiyl, terphenyldiyl, naphthalenediyl, anthracenediyl, tetracenediyl, fluorenediyl, and phenanthrenediyl. The heteroaryl group is an atomic group obtained by excluding two hydrogen atoms from an aromatic compound having heteroatoms, and may be substituted. Examples thereof include pyridinediyl, pyrazinediyl, quinolinediyl, isoquinolinediyl, acridinediyl, phenanthrolinediyl, furanediyl, pyrrolediyl, thiophenediyl, oxazolediyl, oxadiazolediyl, thiadiazolediyl, triazolediyl, benzoxazolediyl, benzoxadiazolediyl, benzothiadiazolediyl, benzotriazolediyl, and benzothiophenediyl.)

[Polymerizable Substituent]

Furthermore, the polymer or oligomer according to the present invention preferably has at least one "polymerizable substituent", from the viewpoint of curing the polymer or oligomer through a polymerization reaction and thereby changing the solubility in a solvent. Here, the term "polymaizable substituent" is a substituent capable of forming an intermolecular bond between two or more molecules through a polymerization reaction, and the details thereof will be described below.

Examples of the polymerizable substituent include a group having a carbon-carbon multiple bond (examples include a vinyl group, an acetylene group, a butenyl group, an acryl group, an acrylate group, an acrylamide group, a methacryl group, a methacrylate group, a methacrylamide group, an arene group, an allyl group, a vinyl ether group, a vinylamino group, a furyl group, a pyrrole group, a thiophene group, and a silol group), a group having a small ring (examples include a cyclopropyl group, a cyclobutyl group, an epoxy group, an oxetane group, a diketene group, and an episulfide group), a lactone group, a lactam group, and a group containing a siloxane derivative. Furthermore, in addition to the groups described above, a combination of groups capable of forming an ester bond or an amide bond can also be utilized. Examples include a combination of an ester group and an amino group, and a combination of an ester group and a hydroxyl group. Particularly, as polymerizable substituent, an oxetane group, an epoxy group, a vinyl group, an acrylate group and a methacrylate group are preferred, and from the viewpoints of reactivity and the properties of organic electronic elements, an oxetane group and an epoxy group are more preferred. Examples include groups represented by the following formulas. From the viewpoint of increasing the degree of freedom of the polymerizable substituent and thereby making it easier to bring a curing reaction, it is more preferable that the main chain of the polymer or oligomer and the polymerizable substituent be linked via an alkyl chain having 1 to 8 carbon atoms. Furthermore, from the viewpoint of increasing the affinity with a hydrophilic electrode such as ITO, the alkyl chain is more preferably a hydrophilic group such as ethylene glycol or diethylene glycol. Further, from the viewpoint making the regulation of the corresponding monomer easier, the polymaizable substituent may also have an ether bond at the end of the alkyl chain, that is, the linkage to the polymerizable substituent, or in the linkage to the polymer or oligomer main chain.

[Chemical Formula 9]

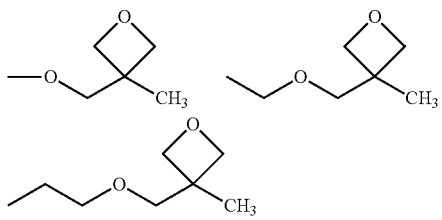

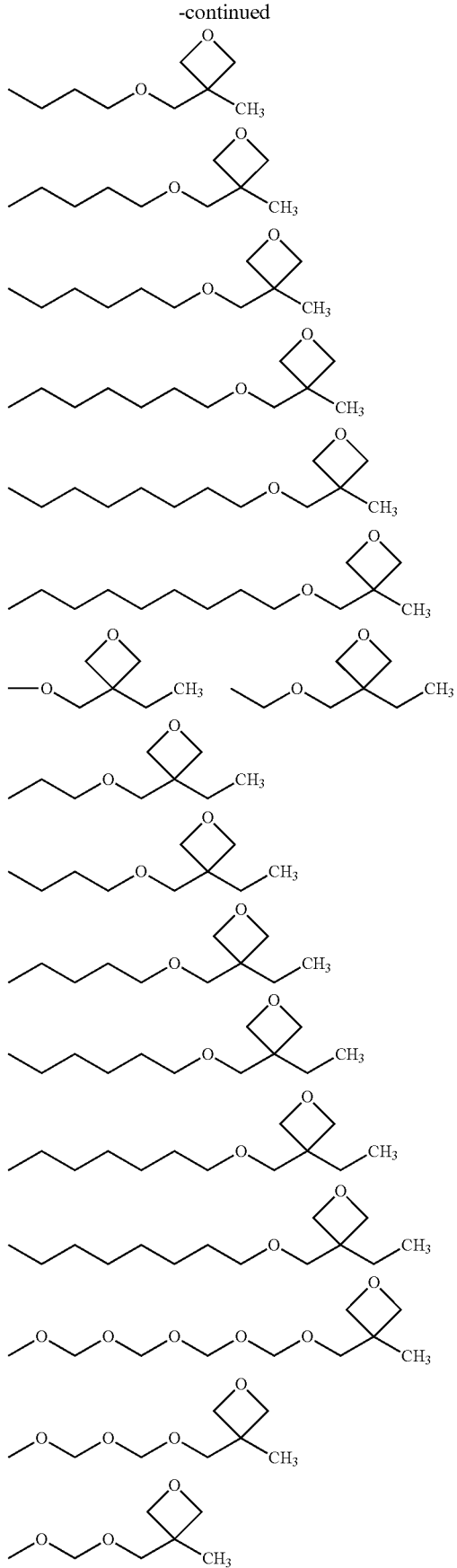

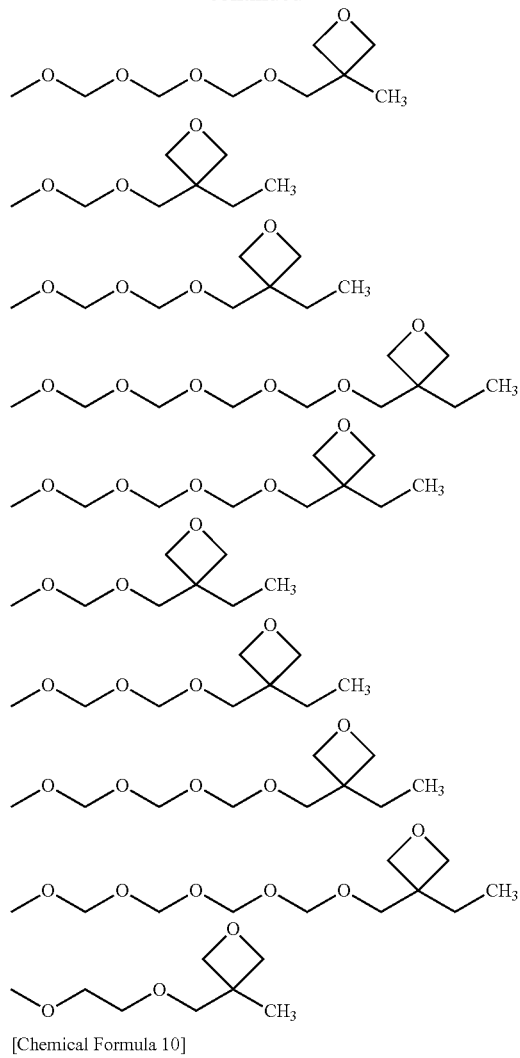
[Chemical Formula 10]
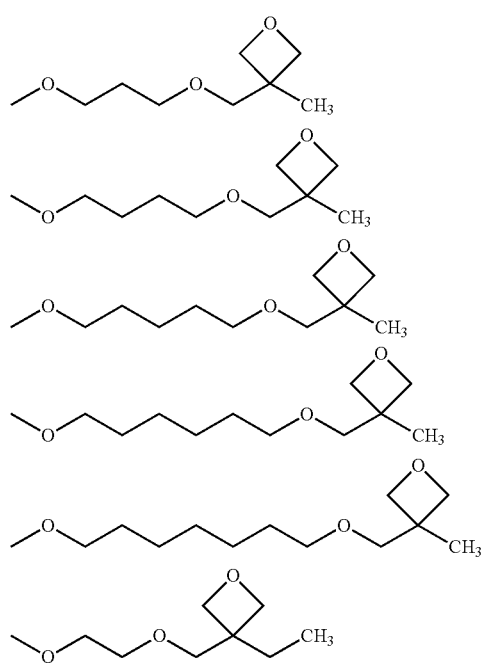
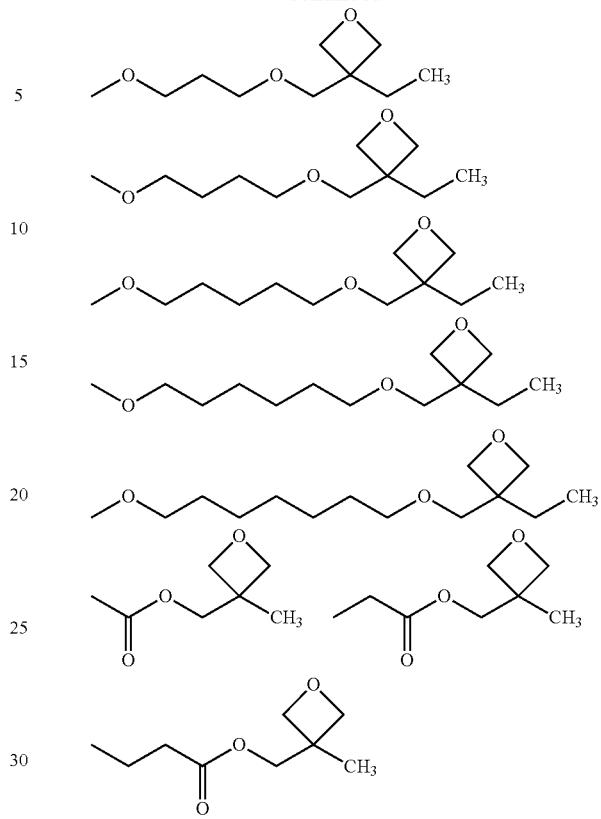
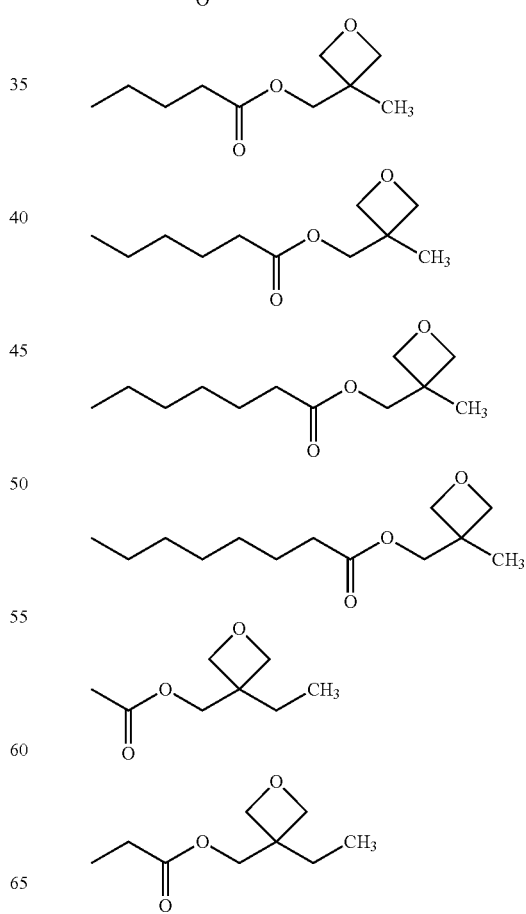

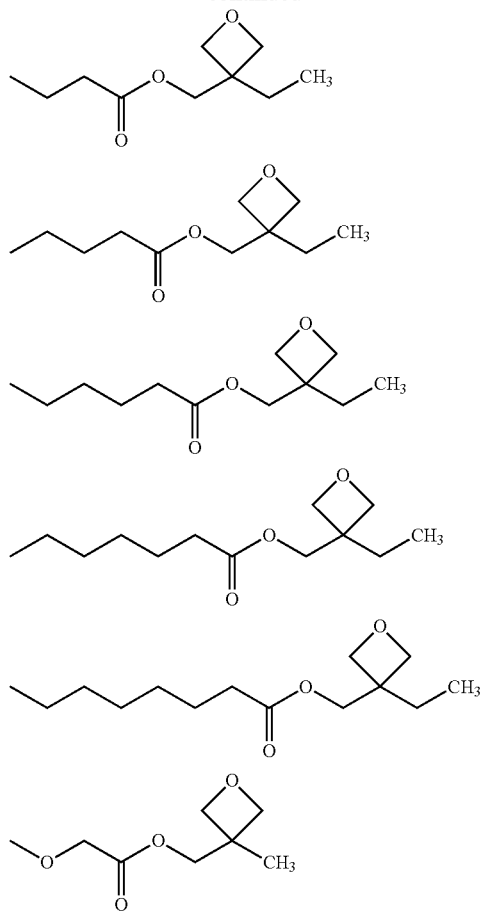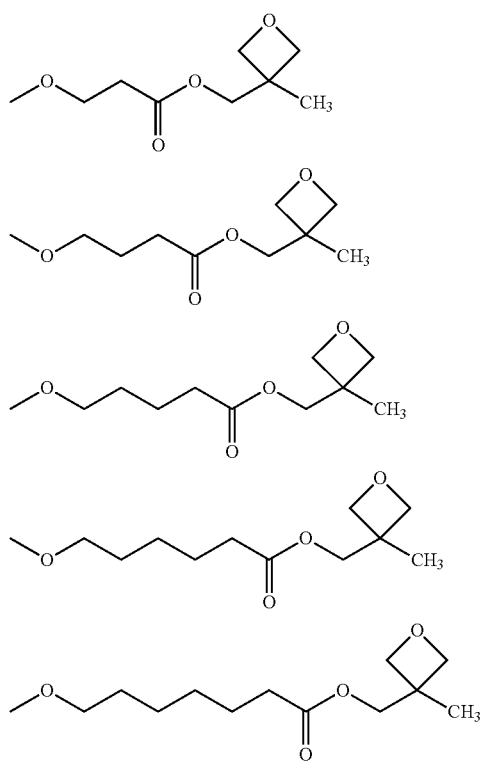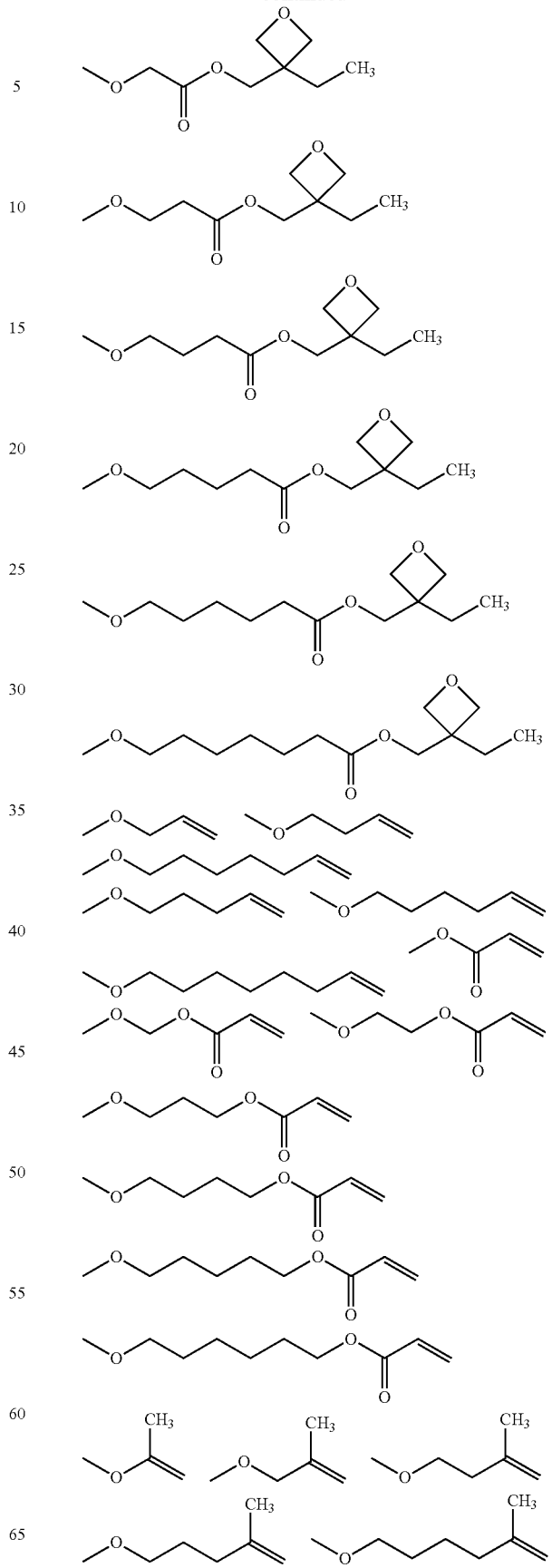

[Chemical Formula 12]

[Chemical Formula 13]

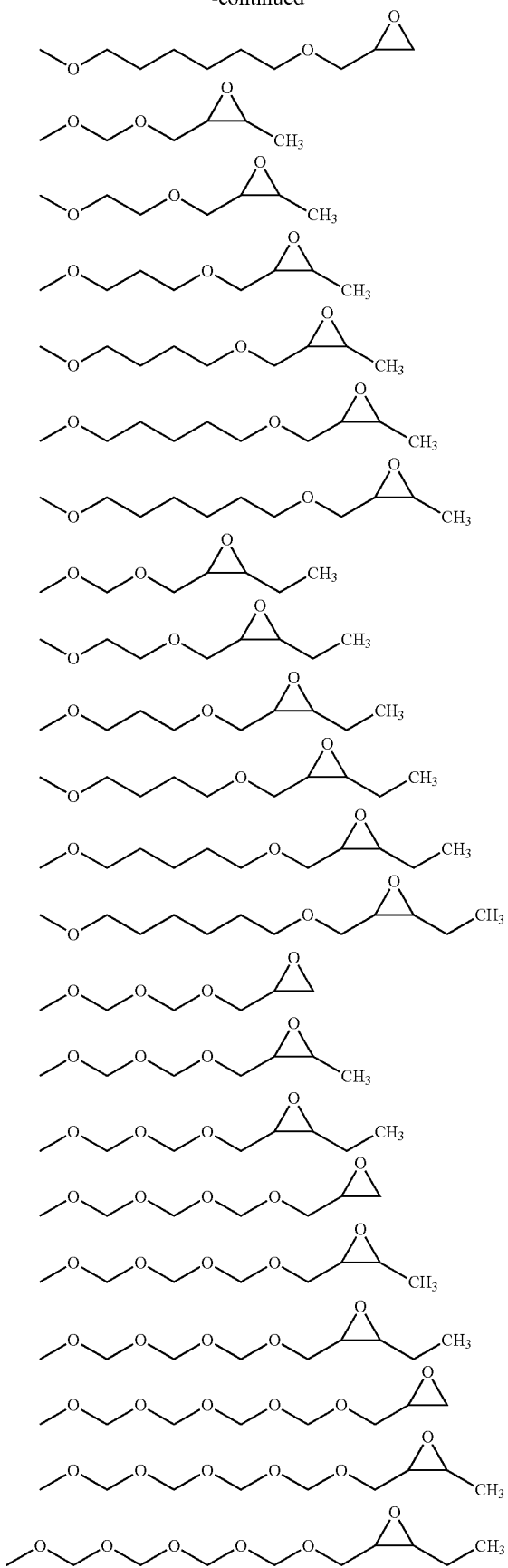
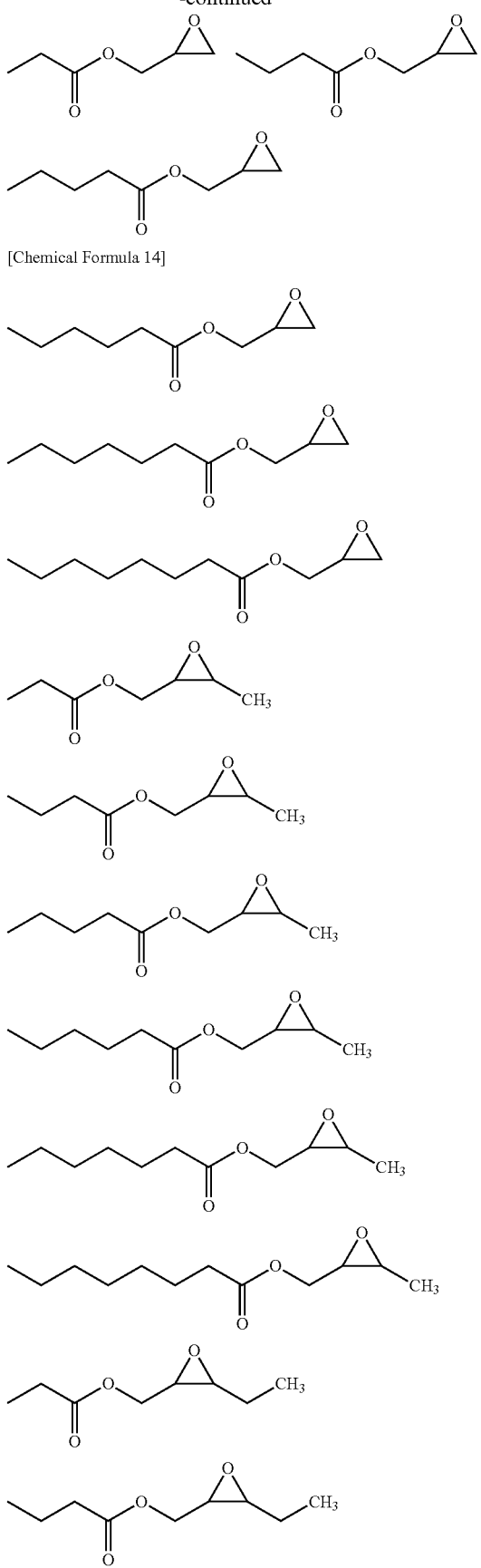
[Chemical Formula 14]

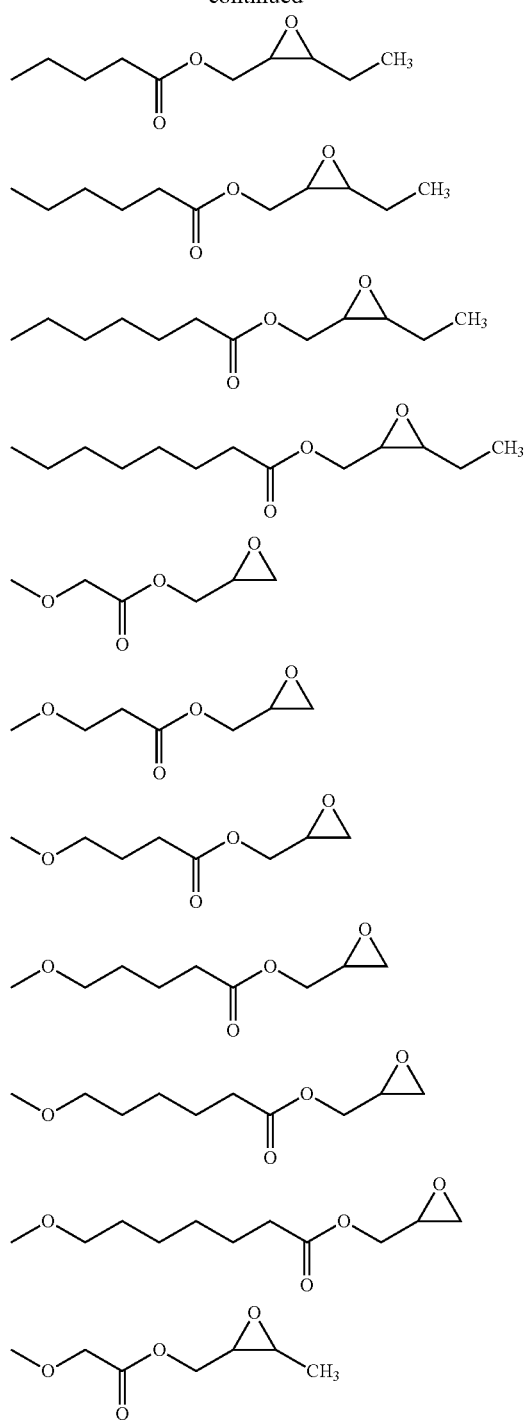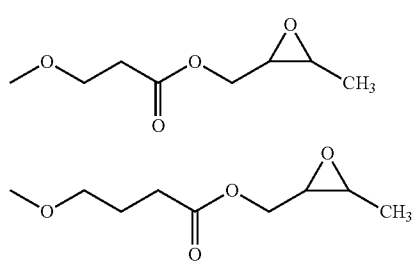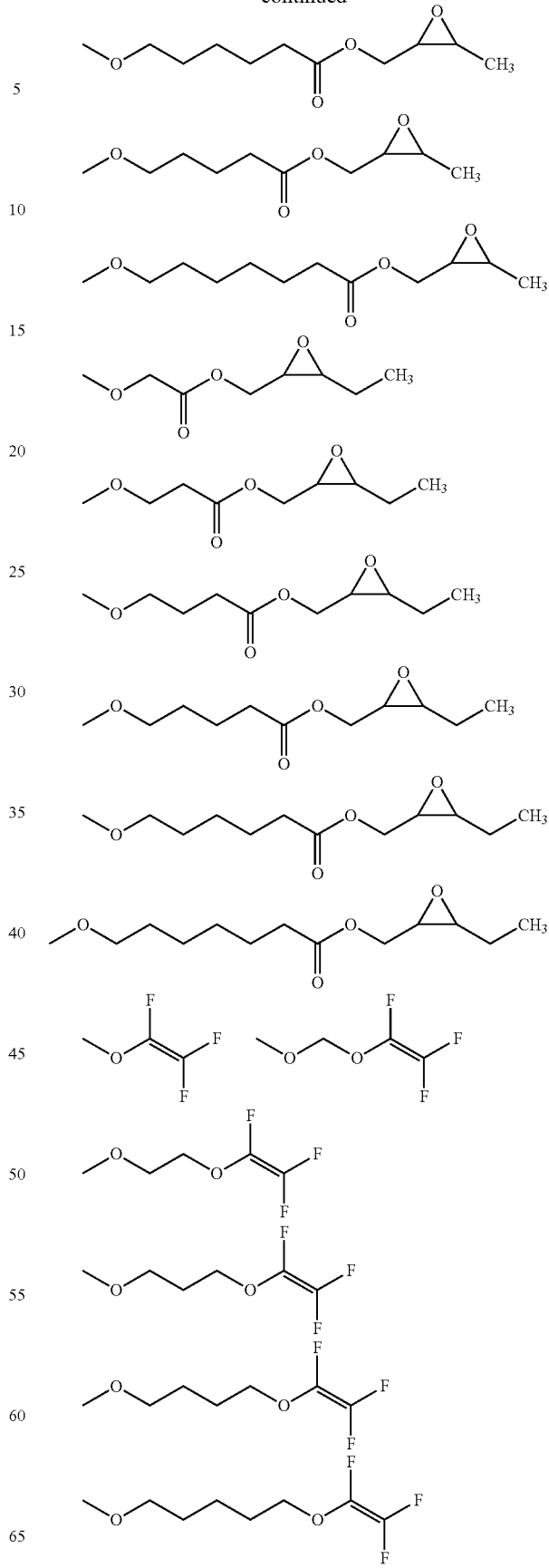

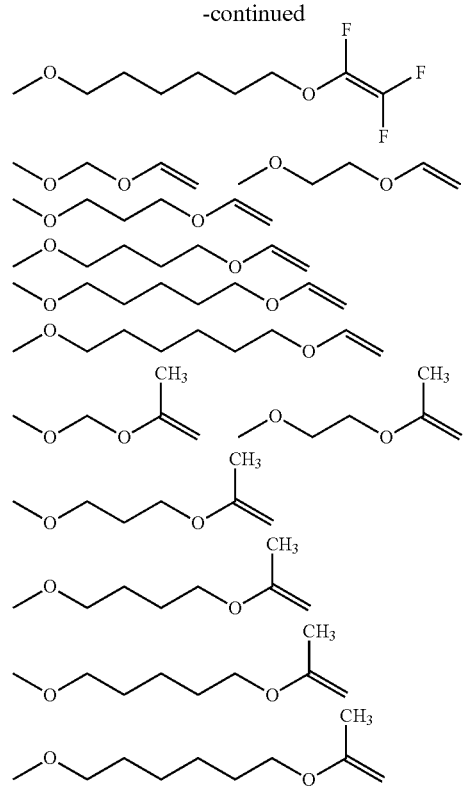
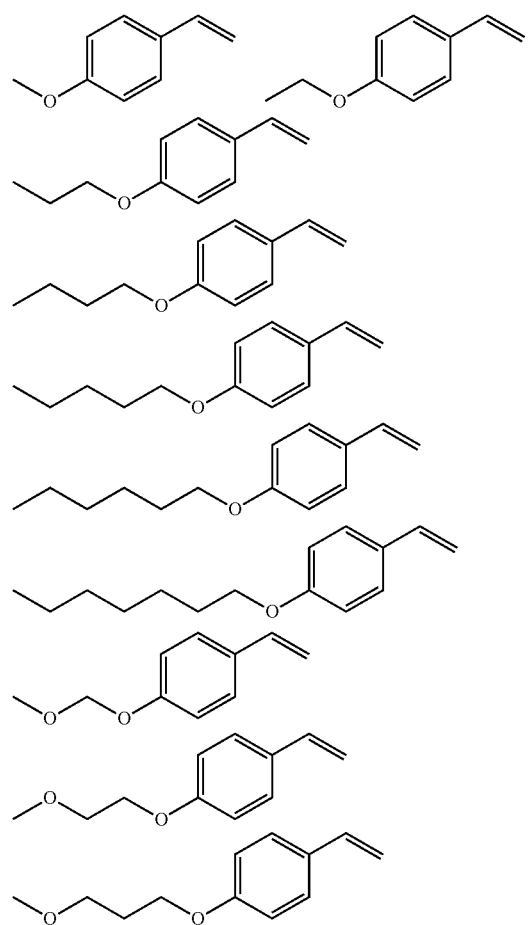
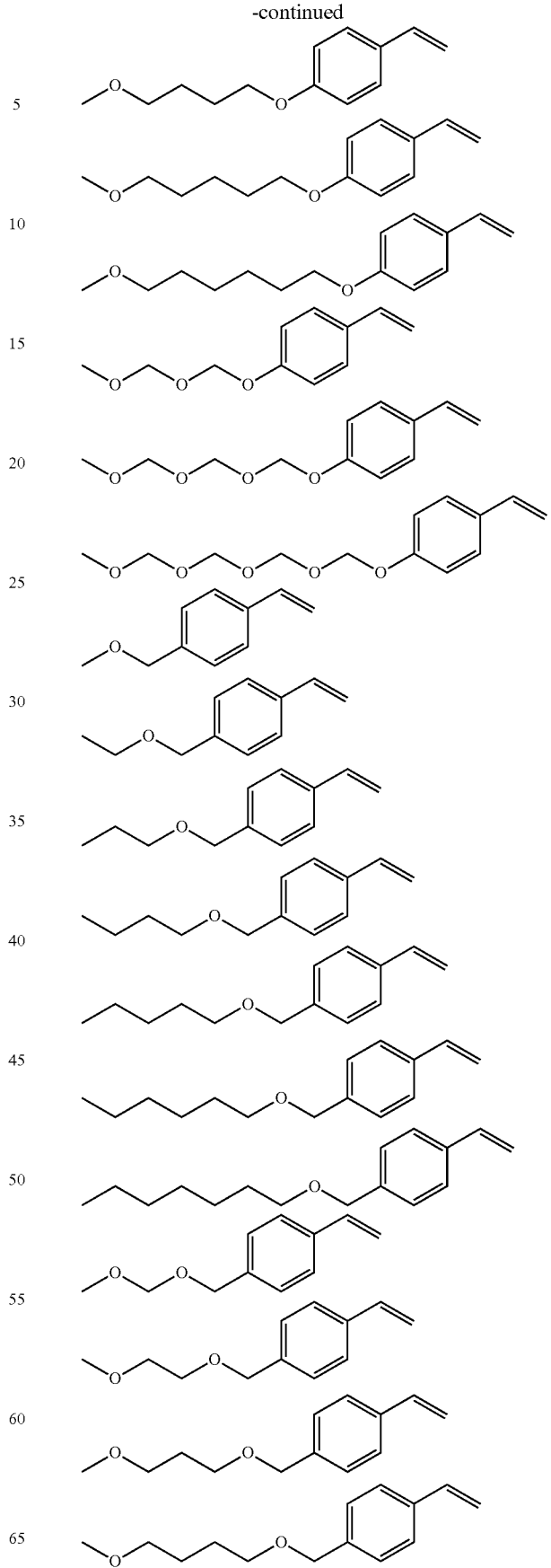

-continued
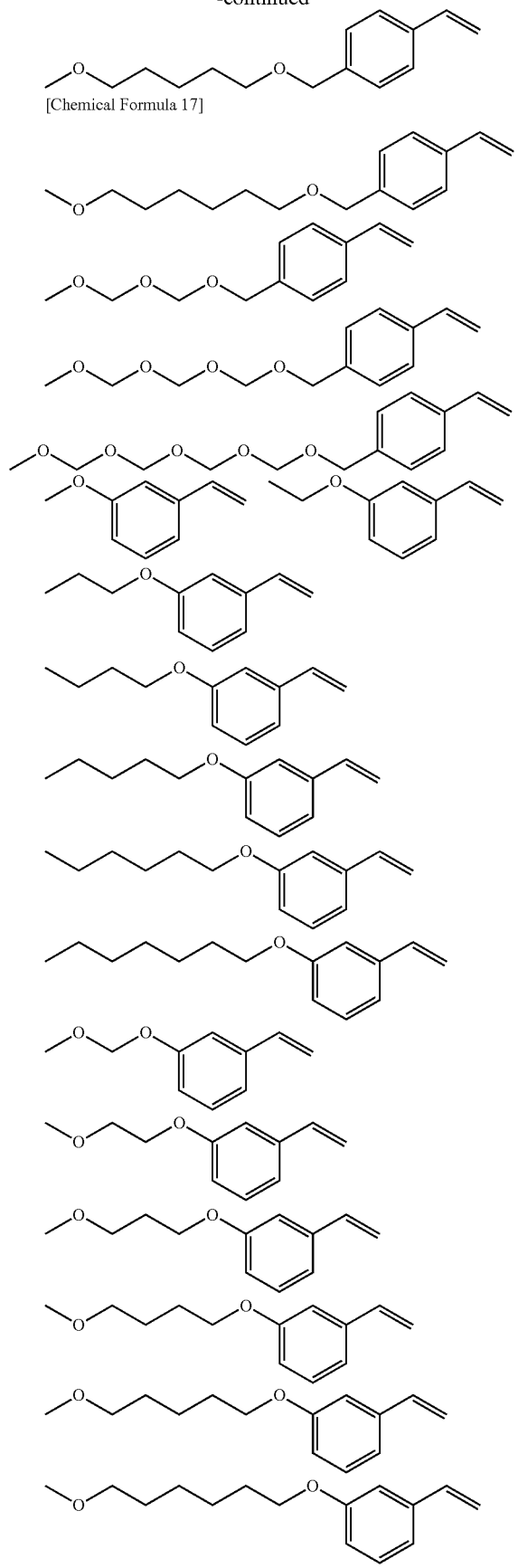
[Chemical Formula 17]
-continued
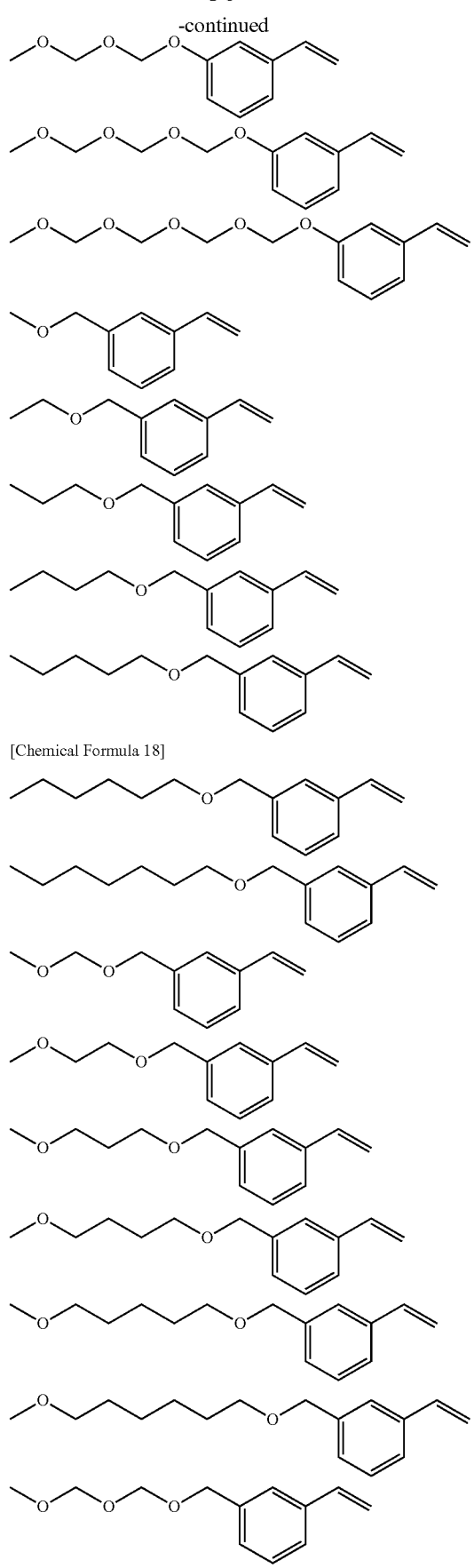
[Chemical Formula 18]

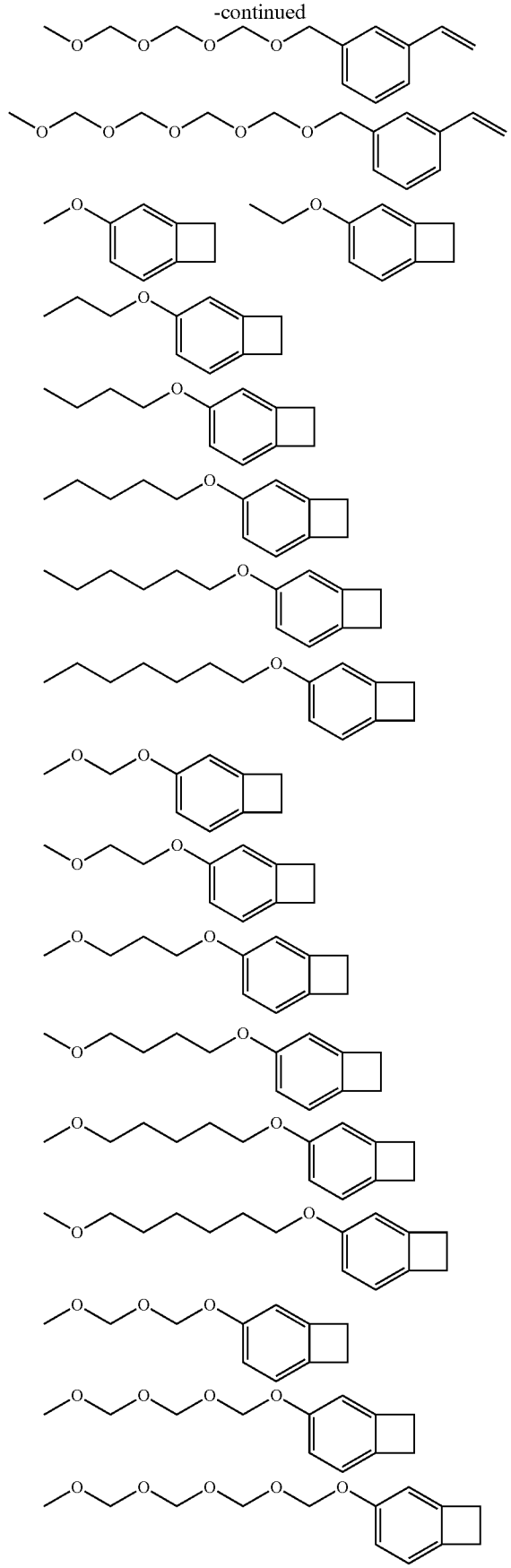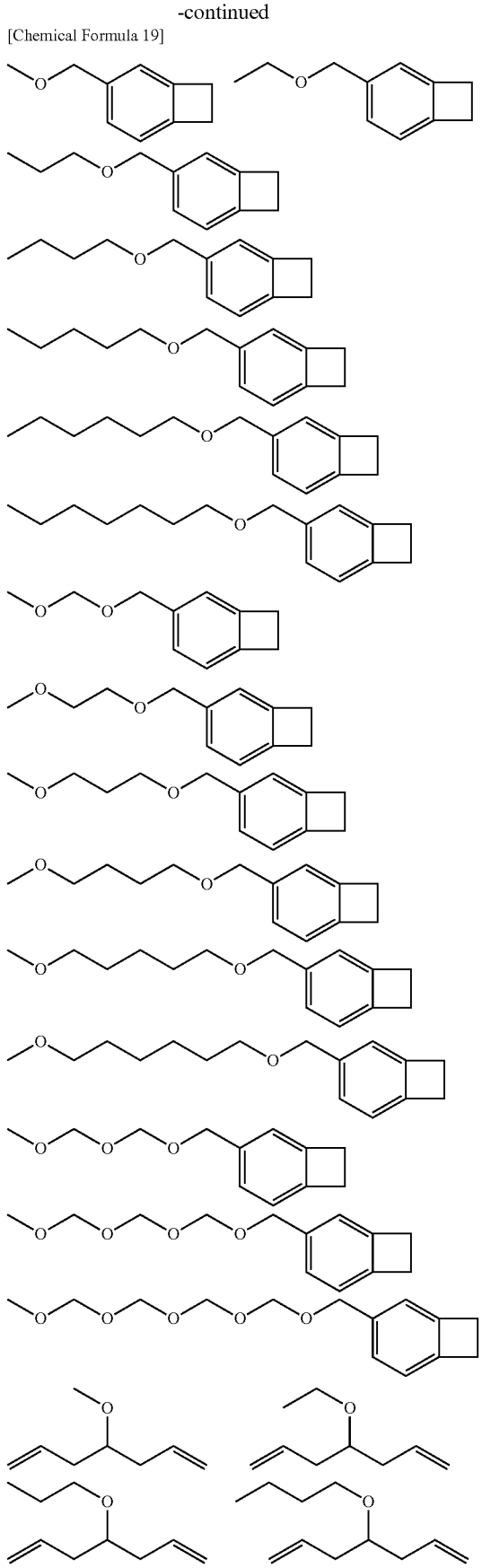

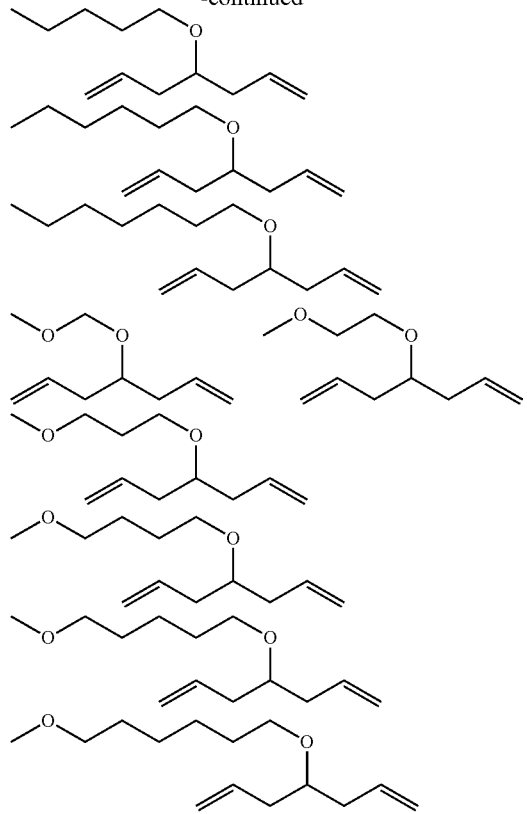
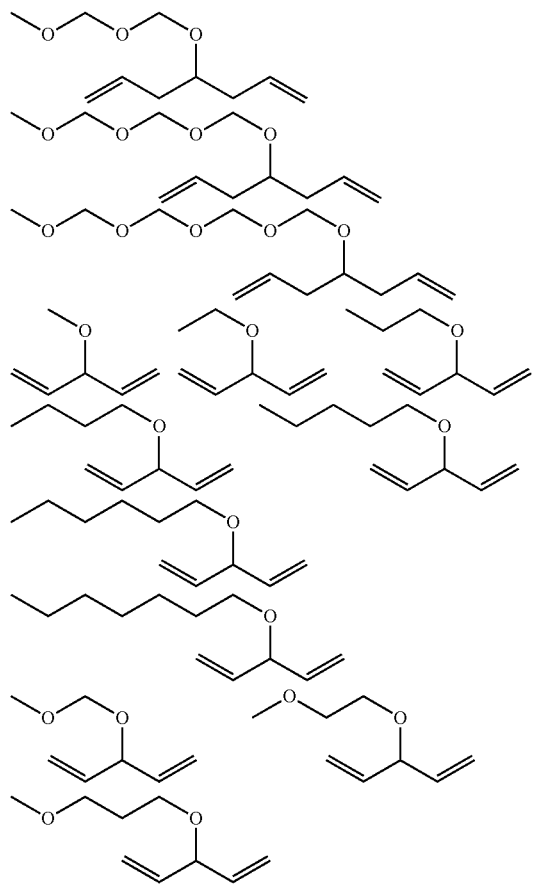
[Chemical Formula 20]
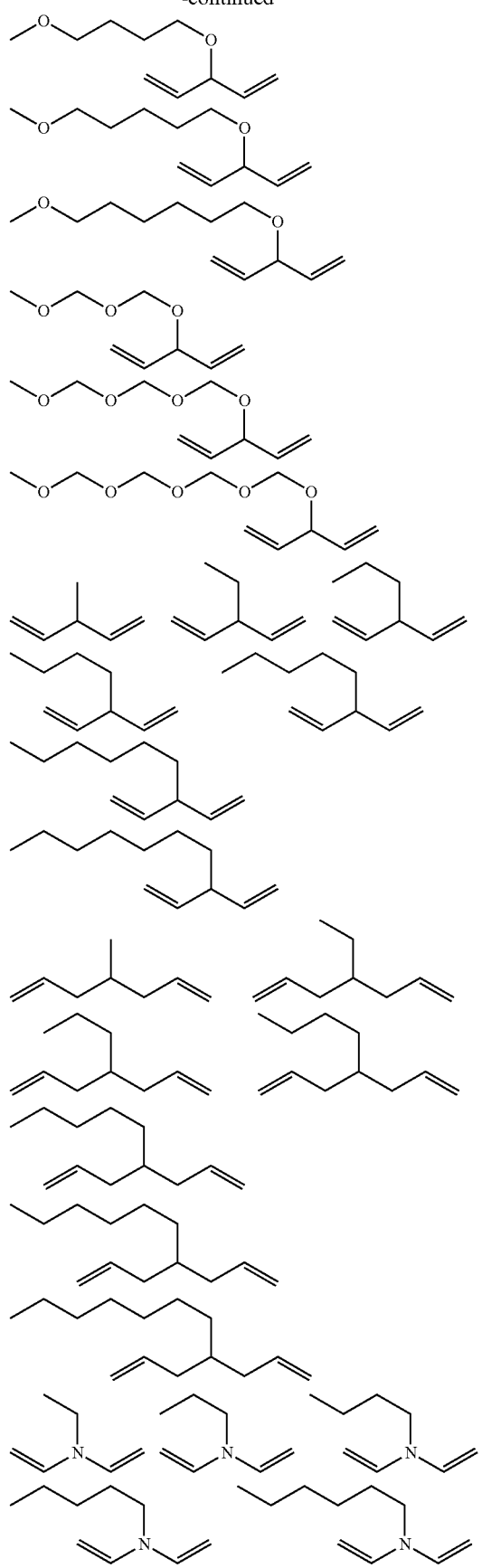

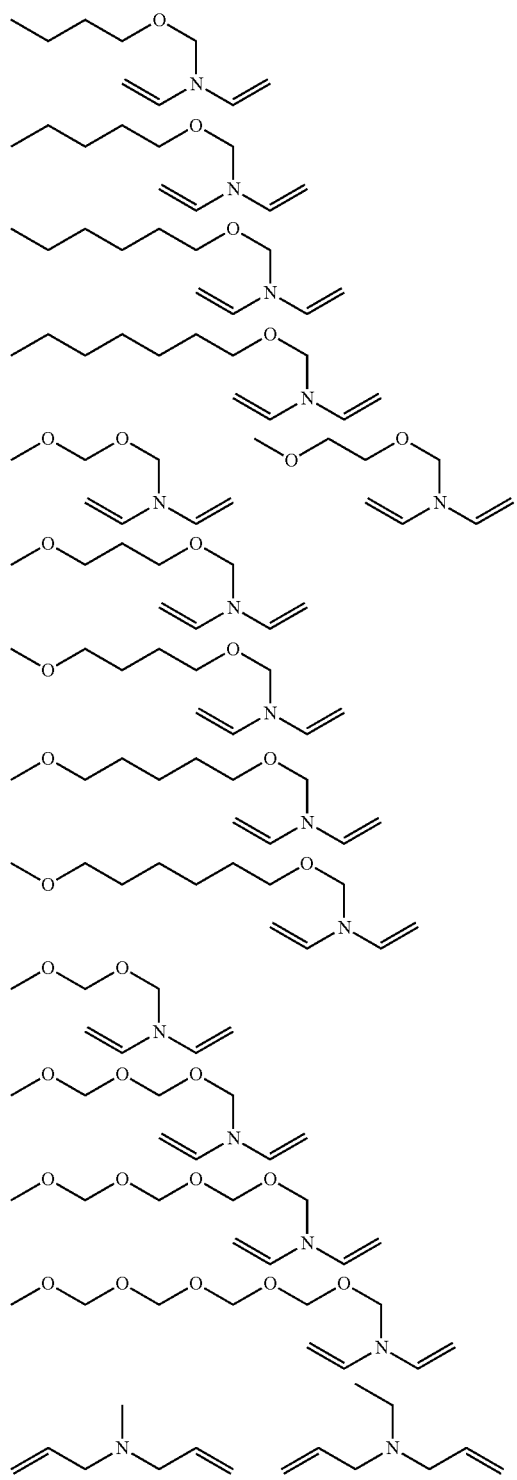
[Chemical Formula 21]
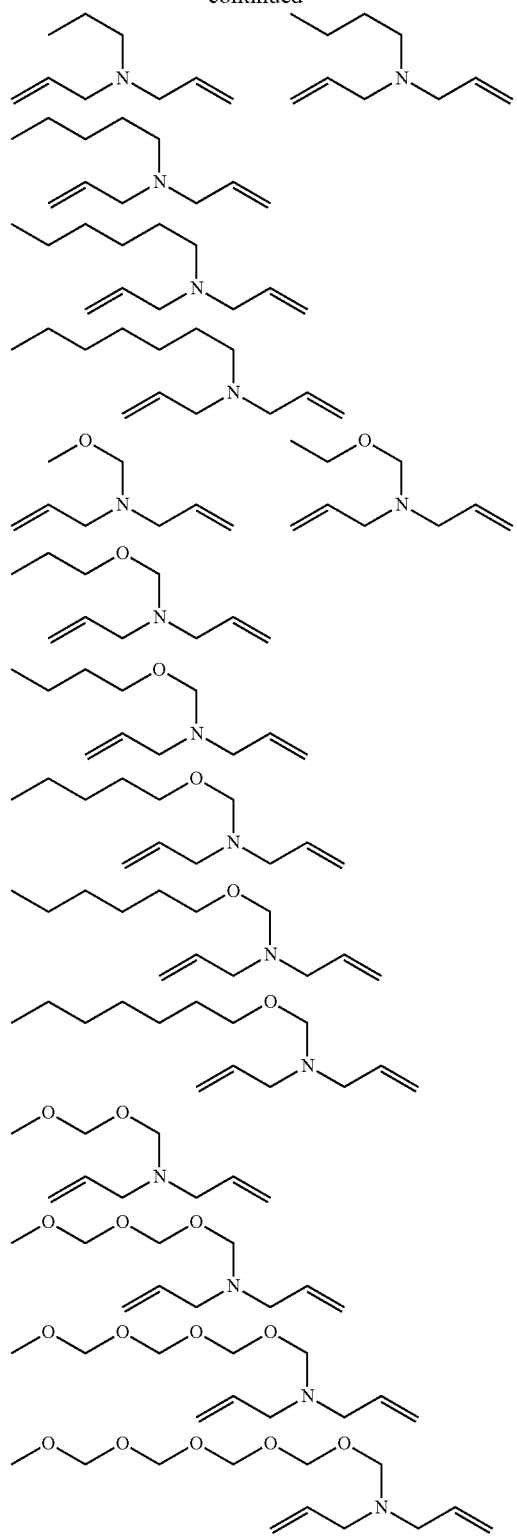
[Chemical Formula 22]
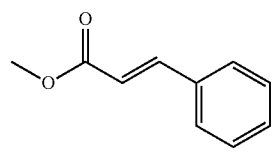

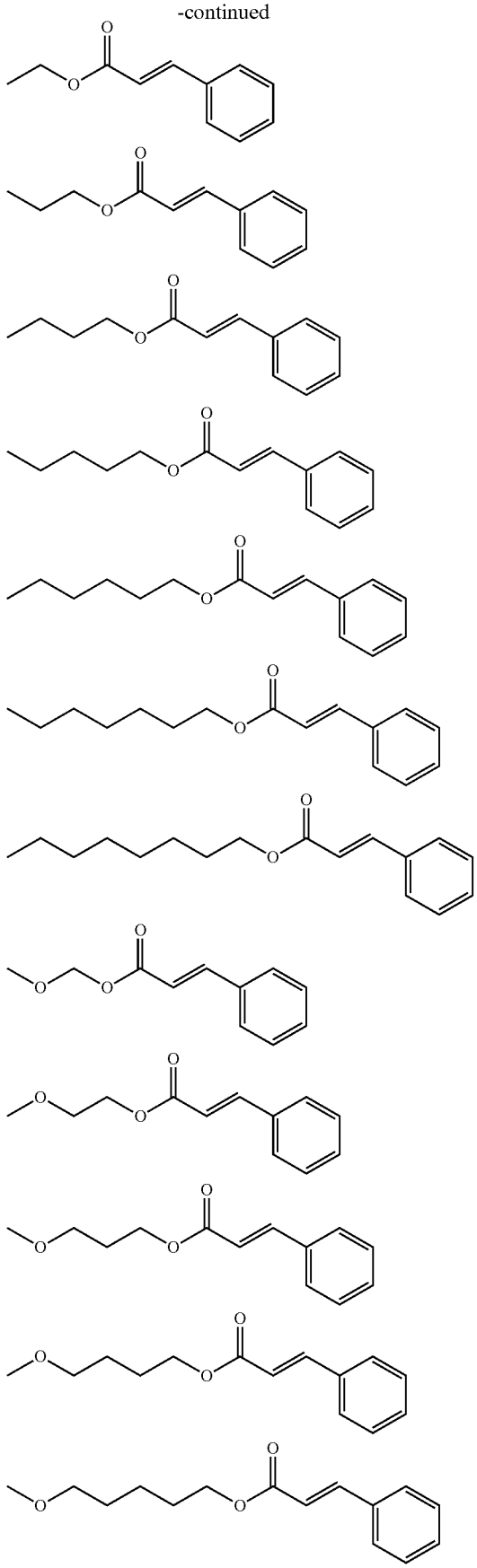

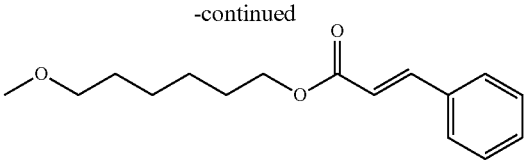

The polymerizable substituent may be introduced into the main chain of the polymer or oligomer branching in three or more directions, may be introduced into a side chain, or may be introduced into both the main chain and a side chain. Furthermore, when the polymerizable substituent is introduced into the main chain and/or the en of a side chain only, it is particularly preferable because the number of the charge transporting group increases relative to the number of the polymerizable substituent, and the charge transport properties can be enhanced.

Furthermore, it is preferable that three or more of the polymerizable substituents be introduced into one molecule of the polymer or oligomer, from the viewpoint that an insolubilized film can be produced by sufficiently changing the solubility even at a temperature around 100° C. The polymerizable substituent is such that as the number of the substituents is larger, the polymerizable substituents contribute more to low temperature curing. However, if the number is too large, the polymerizable substituents have an adverse effect on the hole transport properties, and therefore, it is preferable that the polymerizable substituent be introduced while taking this into consideration.

As a method for introducing a polymerizable substituent into the polymer or oligomer, there are no particular limitations, and the polymerizable substituent may be introduced by incorporating a monomer having a polymerizable substituent into the synthesis system and copolymerizing the monomer with a monomer that forms the main chain, or may also be introduced by forming the main chain of the polymer or oligomer and then further allowing the main chain to react with a monomer having a polymerizable substituent. From the viewpoint of conveniently synthesizing the polymer or oligomer having a polymerizable substituent, a method of incorporating a monomer having a polymerizable substituent into the synthesis system is more preferred.

Furthermore, in orde to obtain a sufficient change in solubility after the polymerization reaction, it is preferable that the polymer or oligomer have three or more polymerizable substituents in one molecule. The number of polymerizable substituents in one molecule of the polymer or oligomer can be estimated based on the molecular weight of the polymer or oligomer, and the ratio of the integrated value of the signals originating from an oxetane group, an epoxy group, a vinyl group, an acrylate group, a methacrylate group or the like in the $^1$H-NMR spectrum of the polymer or oligomer with respect to the sum of integrated values. If the number of the polymerizable substituents is smaller than this, a sufficient change in the solubility is not obtained, and therefore, there is a risk that the polymer or oligomer may be re-dissolved in the solvent, making the lamination process difficult.

Furthermore, it is preferable that the polymer or oligomer according to the present invention contain a partial structure represented by one of the following formulas, from the viewpoint that the polymer chains or the oligomer chains are entangled with each other, so that a change in the solubility is easily achieved, and the glass transition temperature of the polymer or oligomer is increased, causing an enhancement of the heat resistance.

[Chemical Formula 23]

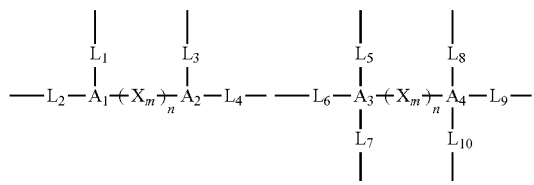

(wherein $A_1$ and $A_2$ each independently represent a trivalent linking group; $A_3$ and $A_4$ each independently represent a tetravalent linking group; $L_1$ to $L_{10}$ each independently represent a divalent linking group; $X_m$ represents a divalent linking group; n represents an integer of 1 or greater; and m represents 1 or an integer from 1 to a.)

As the trivalent linking group represented by $A_1$ and $A_2$, the formulas (1), (2), (5) and (6) exemplified for the branched structure contained in the polymer or oligomer previously described are preferred, and as the tetravalent linking group represented by $A_3$ and $A_4$, the same formulas (3), (4), (7), (8), (9) and (10) are preferred.

Furthermore, as the divalent linking group represented by $L_1$ to $L_{10}$ or $X_m$, the divaleat groups exemplified in the description on Y in the formulas (4) or (7) previously described, or the divalent groups exemplified in the description on the electron transporting group, are preferred.

[Method for Producing Polymer or Oligomer]

The polymer or oligomer used in the present invention can be produced by various synthesis methods that are known to those having ordinary skill in the art. For example, in the case of producing the polymer or oligomer by coupling a monomer having an aromatic ring to another monomer having an aromatic ring, the methods described in T. Yamamoto, et al., Bull. Chem. Soc. Jap., Vol. 51, No. 7, p. 2091 (1978) and M. Zembayashi, et al., Tetrahedron Lett., Vol. 47, p. 4089 (1977); the method reported by A. Suzuki in Synthetic Communications, Vol. 11, No. 7, p. 513 (1981); the method described in S. L. Buchwald and J. F. Hartwig, et al., Tetrahedron Lett., Vol. 21, p. 3609 (1995); and the method described in T. Migita, M. Kosugi, and J. K. Stille, et al., Angew. Chem. Int. Ed. Engl., No. 25, p. 508 (1986) can be used, but there are no particular limitations. The reaction by Suzuki and colleagues induces a Pd catalysed cross-coupling reaction between an aromatic boronic acid derivative and an aromatic halide (usually referred to as "Suzuki Reaction"), and this reaction is preferable from the viewpoint that the polymer or oligomer used in the present invention can be conveniently produced by utilizing the reaction of bonding between corresponding aromatic rings.

In the Suzuki Reaction, a Pd(0) or Pd(II) compound is mainly used as a catalyst, but in recent years, a Ni compound has also been used in some cases. Thus, use can be made of any of the catalysts. When a Pd compound is used, a Pd compound having a phosphine ligand, such as Pd(PPh$_3$)$_4$ (tetrakis(triphenylphosphine)palladium(0)), Pd(dppf)Cl$_2$ ([1,1'-bis(diphenylphosphino)ferrocene]palladium(II) dichloride), and Pd(dppe)Cl$_2$ ([1,2-bis(diphenylphosphino)ethane]palladium(II) dichloride), can be directly used, or a catalyst species can be generated by using tris(dibenzylideneacetone)dipalladium(0), palladium(II) acetate or the like as a precursor, and mixing the precursor with a phosphine ligand in the system. In this case, a known commercially available phosphine compound such as P(t-Bu)$_3$ (tri(t-butyl) phosphine), tributylphosphine or P(c-hex)$_3$ (tricyclohexylphosphine) can be used as the phosphine ligand. In regard to the concentration of the catalyst species, the reaction can be carried out at any concentration in the range of about 0.01% to 5% by mole based on the monomer to react. As the reaction solvent, a mixed solvent system of water and an organic solvent is mainly used, and as the organic solvent, dimethoxyethane, toluene, anisole, tetrahydrofuran, acetone, acetonitrile, N,N-dimethylformamide or the like can be used. Furthermore, as a base, a carbonate of an alkali metal, such as Na$_2$CO$_3$ or K$_2$CO$_3$; a hydroxide of an alkali metal, such as NaOH or KOH; triethylamine, K$_3$PO$_4$, or a water-soluble organic base such as TMAH (tetramethylammonium hydroxide) or TEAH (tetraethylammonium hydroxide) can be used. Furthermore, the reaction can be accelerated by adding a phase transfer catalyst, and representative examples of the phase transfer catalyst include TBAB (tetrabutylammonium bromide) and Aliquat (registered trademark) 336 (manufactured by Sigma Aldrich Company, a mixture of trioctylmethylammonium chloride and tricaprylylmethylammonium chloride).

Examples of the instance of producing the polymer or oligomer used in the present invention by the Suzuki reaction will be described in the following items <1> to <3>, but the synthesis method for the polymer or oligomer according to the present invention is not intended to be limited to these.

<1> Coupling between a monomer (I) which serves as a starting point for forming a structure branching in three directions, a monomer (II) which is capable of coupling with the monomer (I), and a monomer (III) which contains a polymerizable substituent and is capable of coupling with the monomer (II)

[Chemical Formula 24]

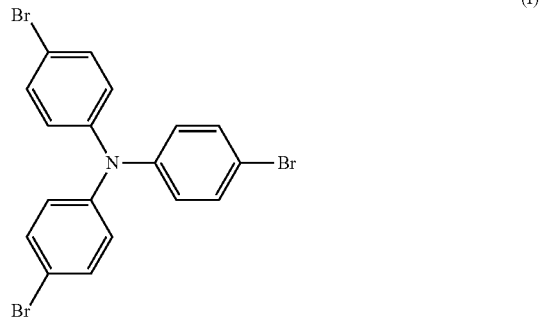

(I)

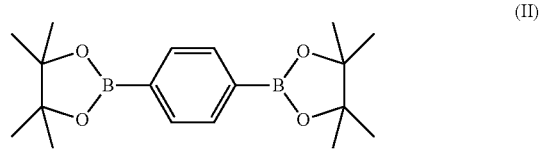

(II)

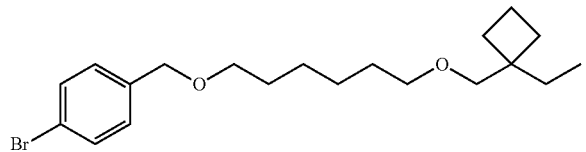

(III)

<2> Coupling of a monomer (IV) which serves as a starting point for forming a structure branching in three directions, a monomer (V) which is capable of coupling with the monomer (IV), a monomer (VI) which is capable of coupling with the monomer (V), and a monomer (VII) which has a polymerizable substituent and is capable of coupling with the monomer (V)

[Chemical Formula 25]

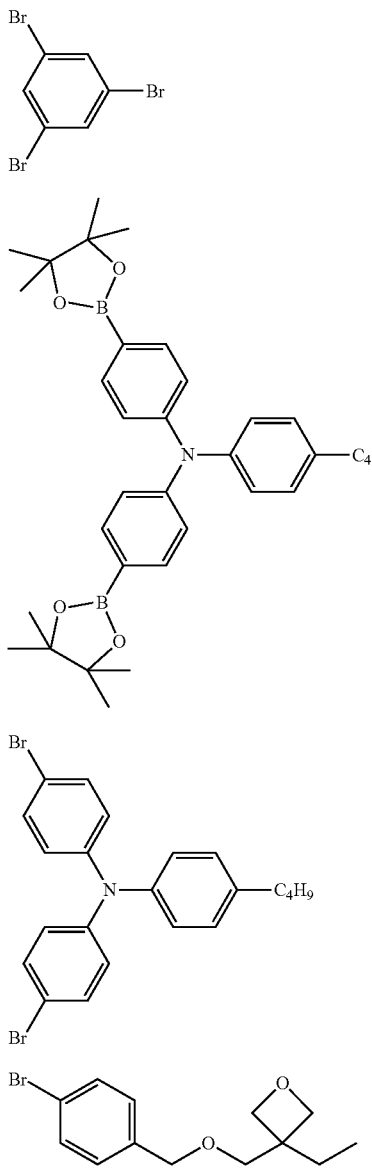

(IV)

(V)

(VI)

(VII)

<3> Coupling of a monomer (VIII) which serves as a starting point for forming a structure branching in four directions, a monomer (IX) which is capable of coupling with the monomer (VIII), and a monomer which has a polymerizable substituent and is capable of coupling with the monomer (IX)

[Chemical Formula 26]

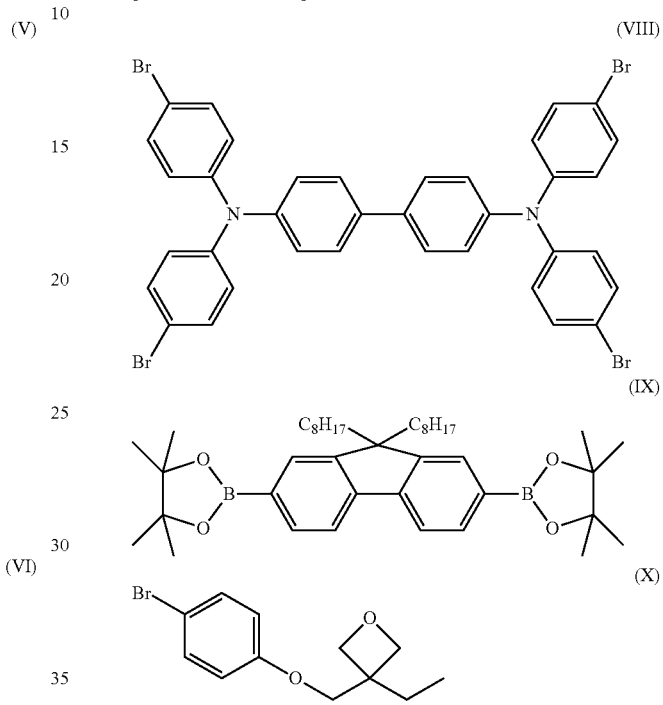

(VIII)

(IX)

(X)

Furthermore, as examples of the structure of the polymer or oligomer according to the present invention, structural examples of the compounds obtained by the syntheses of the above items <1> to <3> will be shown in the following items <4> to <6>. The following formulas are only for illustrative purpose, and are not intended to represent the number of repeating units. Further, although polymerizable substituents are to be introduced into the structures, hydrogen atoms or halogen atoms may also be partially bonded to the structures.

<4> Structural example of the compound obtained by the coupling reaction of the item <1>

[Chemical Formula 27]
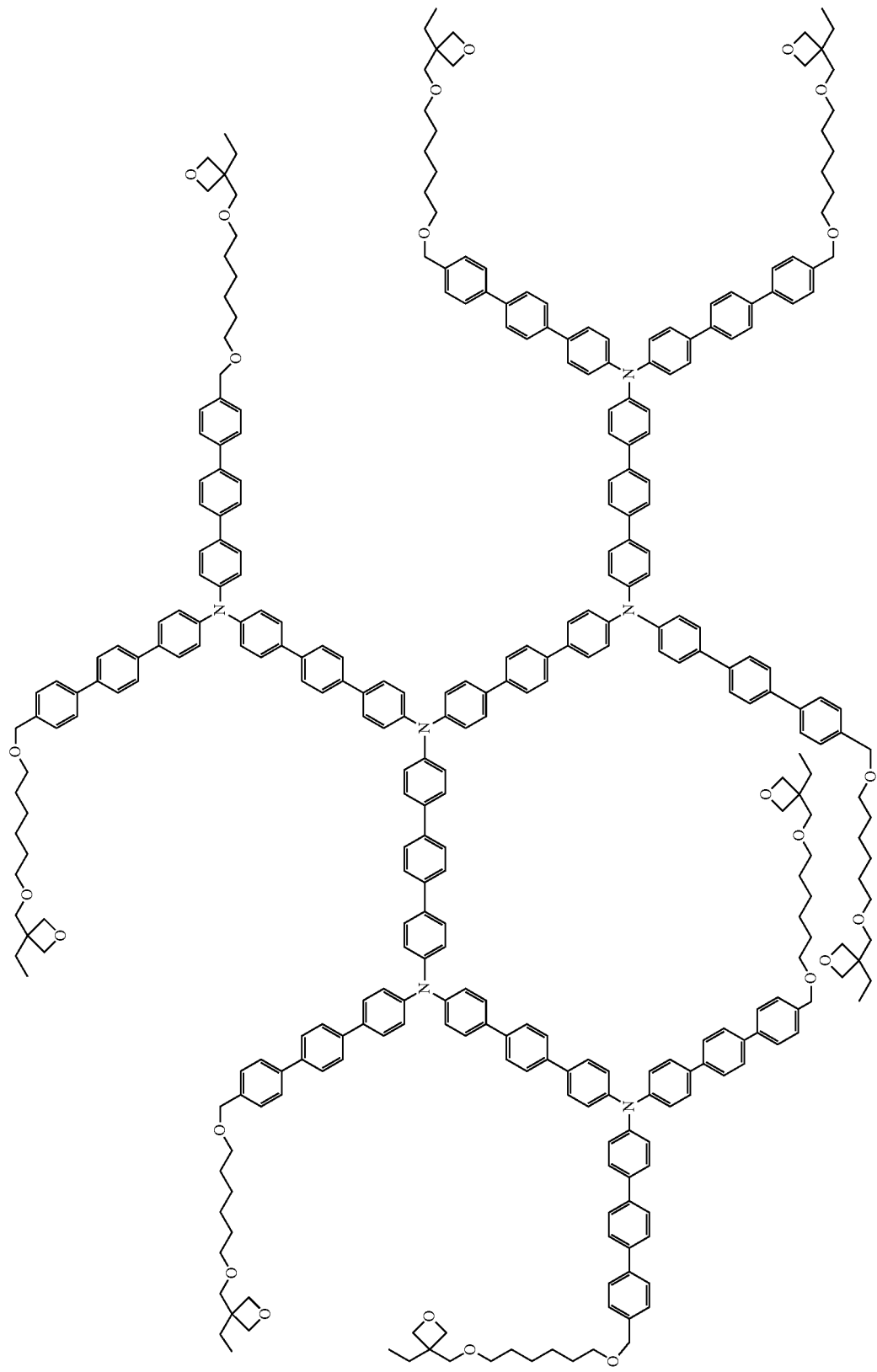

<5> Structural example of the compound obtained by the coupling reaction of the item <2>
[Chemical Formula 28]
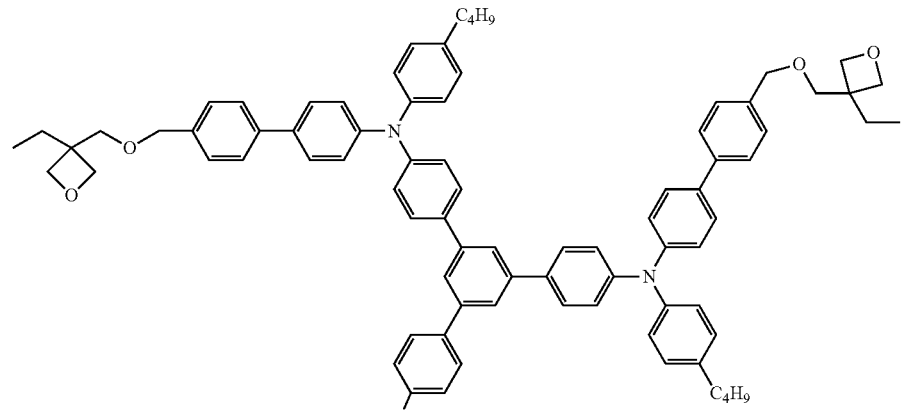
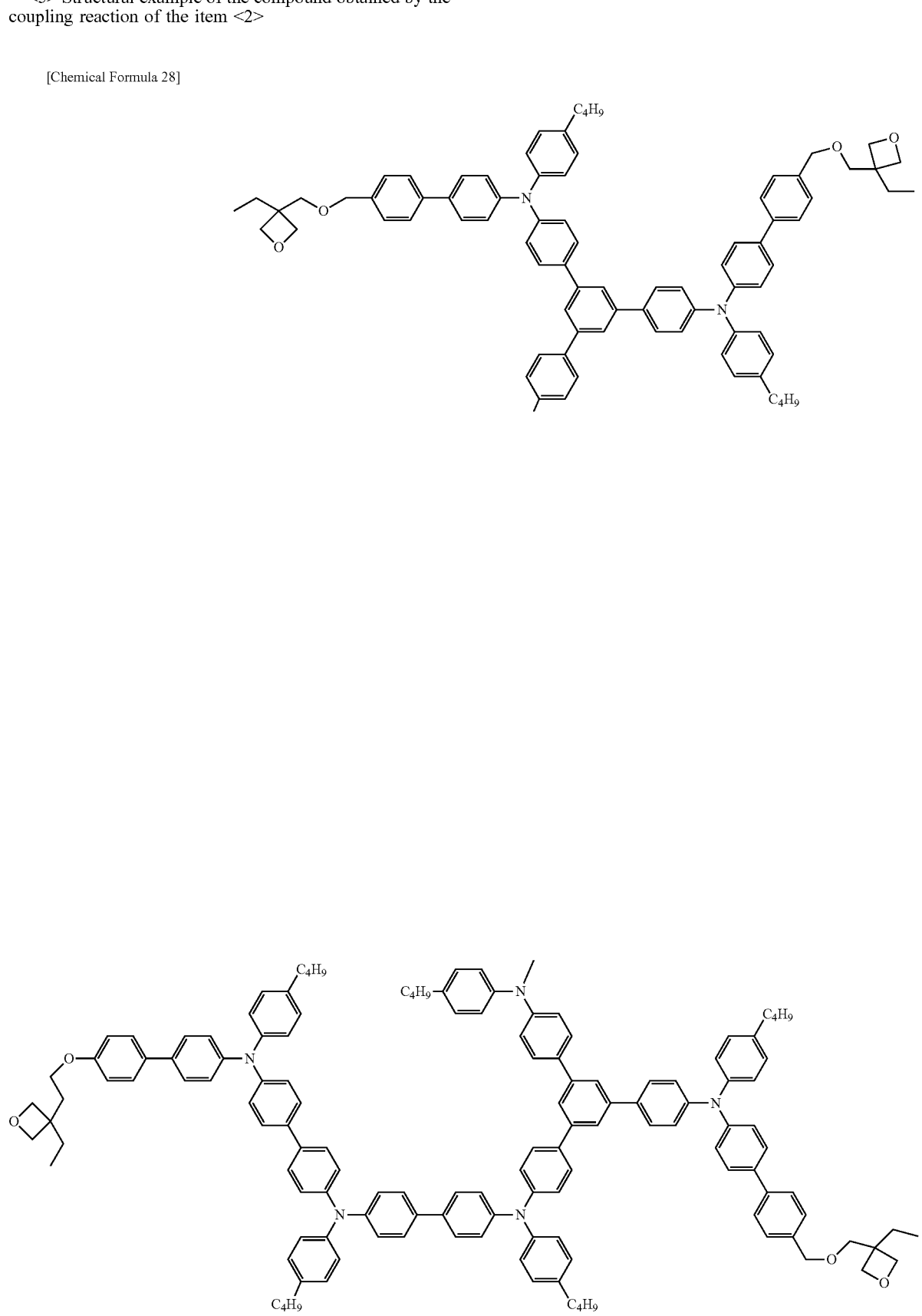

<6> Structural example of the compound obtained by the coupling reaction of the item <3>

[Chemical Formula 29]

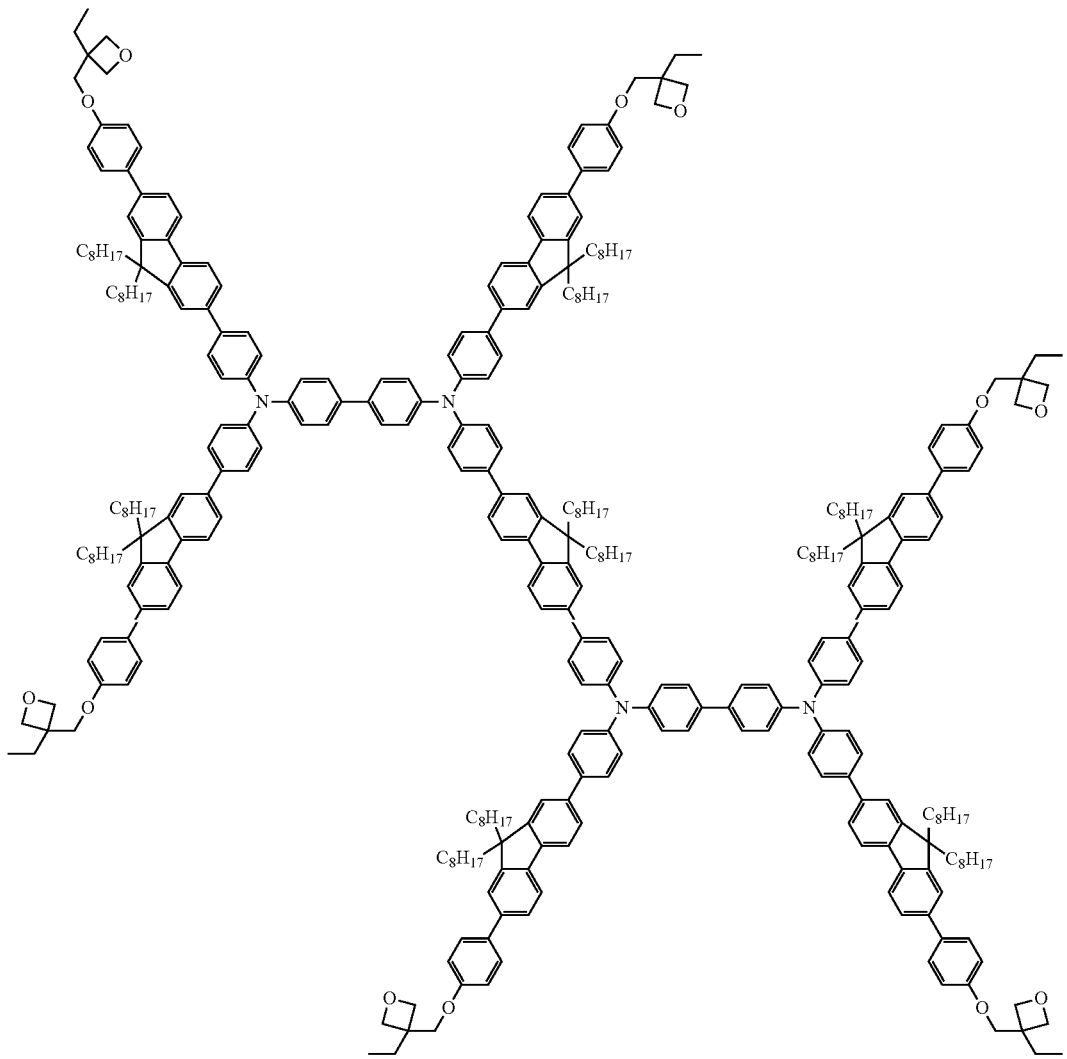

[Molecular Weight and Degree of Polymerization]

Furthermore, the number average molecular weight of the polymer or oligomer according to the present invention is preferably from 1,000 to 1,000,000, and more preferably from 2,000 to 800,000. Even more preferably, the number average molecular weight is from 3,000 to 600,000. If the molecular weight is less than 1,000, there is a tendency that the polymer or oligomer undergoes crystallization easily, and the film-forming stability decreases. If the molecular weight is larger than 1,000,000, there is a tendency that the solubility in solvents decreases, the coating workability is deteriorated, and preparation of an ink composition becomes difficult. Here, the number average molecular weight of the polymer or oligomer is a number average molecular weight which is measured by gel permeation chromatography and calculated relative to polystyrene standards.

The degree of polymerization of the polymer or oligomer used in the present invention is preferably from 5 to 1,000, and more preferably from 10 to 500. If the value of n is too small, the film-forming stability tends to decrease, and if the value is too large, the solubility tends to decrease.

The polydispersity of the polymer or oligomer according to the present invention is preferably higher than 1.0, and from the viewpoint of suppressing fluctuations in the properties of organic electronic elements, the polydispersity is more preferably from 1.1 to 5.0, and most preferably from 1.2 to 3.0. On the other hand, from the viewpoint of conveniently synthesizing the polymer or oligomer without regulating the molecular weight distribution, the polydispersity is more preferably from 1.1 to 20.0, and most preferably from 1.2 to 15.0. If the polydispersity is too low, the polymer or oligomer tends to become prone to aggregate after film formation, and if the polydispersity is too high, the properties of organic electronic elements tend to deteriorate. Here, the polydispersity of the polymer or oligomer is the ratio (weight average molecular weight/number average molecular weight) which is measured using gel permeation chromatography and calculated relative to polystyrene standards.

[Polymerization Initiator]

The organic electronic material of the present invention preferably further contains a polymerization initiator, in addition to the polymer or oligomer, so as to polymerize the polymerizable substituent. This polymerization initiator may be any compound capable of exhibiting an ability to polymerize the polymerizable substituent by applying heat, light, microwaves, radiation, or an electron beam, and using these in combination, and there are no particular limitations. However, the polymerization initiator is more preferably a compound capable of initiating polymerization by means of radiation irradiation, light irradiation or heating, and a compound capable of initiating polymerization by light irradiation (hereinafter, described as a photoinitiator), or a compound capable of initiating polymerization by heating (hereinafter, described as a thermal initiator), from the viewpoint that polymerization can be initiated more conveniently. The photoinitiator may be any compound which exhibits an ability to polymerize the polymaizable substituent by irradiation with light having a wavelength of 200 nm to 800, while the thermal initiator may be any compound which exhibits the same ability by heating at 300° C. or below, and there are no particular limitations. However, for example when the polymerizable substituent is an oxetane group, an ionic compound composed of a counter cation and a counter anion is preferred from the viewpoint of reactivity, and the details thereof will b described below.

[Counter Cation]

Examples of the counter cation include $H^+$, a carbenium ion, an ammonium ion, an anilinium ion, a pyridinium ion, an imidazolium ion, a pyrrolidinium ion, a quinolinium ion, an immonium ion, an aminium ion, an oxonium ion, a pyrylium ion, a chromenylium, a xanthylium ion, an iodonium ion, a sulfonium ion, a phosphonium ion, a tropylium ion, and a cation having a transition metal. From the viewpoint of reactivity, $H^+$, a carbenium ion, an anilinium ion, an aminium ion, an iodonium ion, a sulfonium ion, a phosphonium ion, and a tropylium ion are preferred.

[Counter Anion]

The counter anion may be any conventionally known anion, and examples include halogen ions such as $F^-$, $Cl^-$, $Br^-$ and $I^-$; $OH^-$; $ClO_4^-$; sulfonate ions such as $FSO_3^-$, $ClSO_3^-$, $CH_3SO_3^-$, $C_6H_5SO_3^-$, and $CF_3SO_3^-$; sulfate ions such as $HSO_4^-$ and $SO_4^{2-}$; carbonate ions such as $HCO_3^-$ and $CO_3^{2-}$; phosphate ions such as $H_2PO_4^-$, $HPO_4^{2-}$, and $PO_4^{3-}$; fluorophosphate ions such as $PF_6^-$ and $PF_5OH^-$; fluorinated alkyl fluorophosphate ions such as $[(CF_3CF_2)_3PF_3]^-$, $[(CF_3CF_2CF_2)_3PF_3]^-$, $[((CF_3)_2CF)_3PF_3]^-$, $[((CF_3)_2CF)_2PF_4]^-$, $[((CF_3)_2CFCF_2)_3PF_3]^-$ and $[((CF_3)_2CFCF_2)_2 PF_4]^-$; fluoroalkanesulfonyl methide, imide ions such as $(CF_3SO_2)_3C^-$ and $(CF_3SO_2)_2N^-$; borate ions such as $BF_4^-$, $B(C_6F_5)_4^-$, and $B(C_6H_4CF_3)_4^-$; fluoroantimonate ions such as $SbF_6^-$ and $SbF_5OH^-$; fluoroarsenate ions such as $AsF_6^-$ and $AsF_5OH^-$; $AlCl_4^-$; and $BiF_6$. However, from the viewpoints of lowering the driving voltage of the organic electronic element, and forming a polymerization initiator that allows low temperature curing when combined with the cations described above, fluorophosphate ions such as $PF_6^-$ and $PF_5OH^-$; fluorinated alkyl fluorophosphate ions such as $[(CF_3CF_2)_3PF_3]^-$, $[(CF_3CF_2CF_2)_3PF_3]^-$, $[((CF_3)_2CF)_3 PF_3]^-$, $[((CF_3CF)_2PF_4]^-$, $[((CF_3)_2CFCF_2)_3PF_3]^-$ and $[((CF_3)_2 CFCF_2)_2PF_4]^-$; fluoroalkanesulfonyl methide, imide ions such as $(CF_3SO_2)_3C^-$ and $(CF_3SO_2)_2N^-$; borate ions such as $BF_4^-$, $B(C_6F_5)_4^-$ and $B(C_6H_4CF_3)_4^-$; and fluoroantimonate ions such as $SbF_6^-$ and $SbF_5OH^-$ are preferred.

For the counter cations and counter anions, those exemplified in connection with the ionic compound according to a second aspect of the present invention that will be described later, may also be used in addition to the ions described above.

When the initiator is a photoinitiator, the photoinitiator may be used in combination with a photosensitizer in order to enhance photosensitivity. Examples of the photosensitizer include anthracene derivatives and thioxanthone derivatives.

The mixing ratio of the polymerization initiator is preferably in the range of from 0.1% by weight to 30% by weight, more preferably in the range of from 0.2% by weight to 25% by weight, and particularly preferably in the range of from 0.5% to 20% by weight, relative to the total weight of the organic electronic material. If the mixing ratio of the polymerization initiator is less than 0.1% by weight, there is a tendency that lamination is not easily achieved because the change in the solubility is not sufficient. If the mixing ratio is greater than 30% by weight, the properties of the electronic elements tend to deteriorate due to the polymerization initiator remaining in the thin film and/or the decomposition products.

The organic electronic material of the present invention preferably contains a dopant so as to enhance the charge transport properties, and the details thereof will be described below.

[Dopanat]

The dopant according to the present invention may be any compound which is capable of exhibiting a doping effect when added to the polymer or oligomer of the present invention, and thereby enhancing the charge transport properties, and there are no particular limitations. The doping effect may be classified into the p-type doping in which the dopant works as an electron acceptor, and the n-type doping in which the dopant works as an electron donor. However, the dopant according to the present invention may be a dopant which exhibits any of the p-type doping and the n-type doping. It is preferable to implement the p-type doping for an enhancement of the hole transport properties, and to implement the n-type doping for an enhancement of the electron transport properties. Further, there are no limitations on the number of the dopant species, and plural dopants may be mixed and added.

The dopant used in the p-type doping may be an electron-accepting compound, and specific examples thereof include a Lewis acid, a protonic acid, a transition metal compound, an ionic compound, and a halogen compound. Examples include, as the Lewis acid, $FeCl_3$, $PF_5$, $AsF_5$, $SbF_5$, $BF_5$, $BCl_3$, and $BBr_3$; as the protonic acid, inorganic acids such as HF, HCl, HBr, $HNO_5$, $H_2SO_4$ and $HClO_4$, and organic acids such as benzenesulfonic acid, p-toluenesulfonic acid, dodecylbenzenesulfonic acid, polyvinylsulfonic acid, methanesulfonic acid, trifluoromethanesulfonic acid, trifluoroacetic acid, 1-butanesulfonic acid, vinylphenylsulfonic acid, and camphor sulfonic acid; as the transition metal compound, FeOCl, $TiCl_4$, $ZrCl_4$, $HfCl_4$, $NbF_5$, $AlCl_3$, $NbCl_5$, $TaCl_5$ and $MoF_5$; as the ionic compound, known perfluoro anions such as tetrakis(pentafluorophenyl)borate ion, tris(trifluoromethanesulfonyl)methide ion, bis(trifluoromethanesulfonyl)imide ion, hexafluoroantimonate ion, $AsF_1$ (hexafluoroarsenate ion), $BF_4^-$ (tetrafluoroborate ion), and $PF_6^-$ (hexafluorophosphate ion), and ionic compounds having conjugated base anions of the inorganic acids and organic acids mentioned above; and as the halogen compound, $Cl_2$, $Br_2$, $I_2$, ICl, $ICl_3$, IBr, and IF. Furthermore, other electron-accepting compounds described in Japanese Patent Nos. 4058842, 4186758 and 3996036, such as TCNE (tetracyanoethylene) and TCNQ (tetracyanoquinodimethane), can also be used. Preferred examples are Lewis acids, ionic compounds, and other electron-accepting compounds such as TCNE and TCNQ.

As the dopant used in the n-type doping, alkali metals such as Li and Cs; alkaline earth metals such as Mg; salts of alkali metals/alkaline earth metals such as LiF and $Cs_2CO_3$; various metal complexes; and other electron-donating organic compounds can be used.

Further, according to the present invention, it is preferable that the polymerization initiator and the dopant be the same compound, from the viewpoint that the organic electronic material can be conveniently produced.

[Additives]

The organic electronic material of the present invention can be used, by itself, as a functional material for organic electronic elements. Further, the organic electronic material of the present invention can be used, by itself, as the hole injection layer, the hole transport layer, the electron blocking layer, the light emitting layer, the hole blocking layer, the electron transport layer, or the electron injection layer of organic EL elements. Moreover, the organic electronic material can still be used in organic electronic elements or organic EL elements, even if various additives have been incorporated into the organic electronic material. Examples of the additives include, if the organic electronic material is used in the light emitting layer of an organic EL element, the polymerization initiator and the dopant described above, as well as a metal complex containing a central metal such as Ir or Pt, and an emitting dye; and if the organic electronic material is used in the hole injection layer, hole transport layer, electron blocking layer, electron transport layer or electron injection layer, the dopant, as well as an oxidizing agent, a reducing agent, an oxidation inhibitor, a reduction inhibitor, and a stabilizer.

[Ink Composition]

The ink composition of the present invention is characterized by containing the organic electronic material of the present invention described above. The details of the ink composition will be described below. The ink composition of the present invention may contain the organic electronic material and a solvent that can dissolve or disperse the material, and may further contain other additives, for example, a polymerization inhibitor, a stabilizer, a thickening agent, a gelling agent, a flame retardant, an oxidation inhibitor, a reduction inhibitor, an oxidizing agent, a reducing agent, a surface modifier, an emulsifier, a defoamant, a dispersant, and a surfactant. Examples of the solvent include water; alcohols such as methanol, ethanol and isopropyl alcohol; alkanes such as pentane, hexane and octane; cyclic alkanes such as cyclohexane; aromatic solvents such as benzene, toluene, xylene, mesitylene, tetralin, and diphenylmethane; aliphatic ethers such as ethylene glycol, dimethyl ether, ethylene glycol diethyl ether, and propylene glycol-1-monomethyl ether acetate; aromatic ethers such as 1,2-dimethoxybenzene, 1,3-dimethoxybenzene, anisole, phenetol, 2-methoxytoluene, 3-methoxytoluene, 4-methoxytoluene, 2,3-dimethylanisole, and 2,4-dimethylanisole; aliphatic esters such as ethyl acetate, n-butyl acetate, ethyl lactate, and n-butyl lactate; aromatic esters such as phenyl acetate, phenyl propionate, methyl benzoate, ethyl benzoate, propyl benzoate, and n-butyl benzoate; amide-based solvents such as N,N-dimethylformamide, and N,N-dimethylacetamide; as well as dimethyl sulfoxide, tetrahydrofuran, acetone, chloroform, and methylene chloride. Preferred examples include aromatic solvents, aliphatic esters, aromatic esters, aliphatic ethers, and aromatic ethers.

[Organic Thin Film]

The organic thin film of the present invention is produced by using the organic electronic material or the ink composition of the present invention described above. For example, the organic thin film can be produced by applying the organic electronic material or the ink composition on a desired base material by a known method, such as an inkjet method, a casting method, an immersion method, a printing method such as letterpress printing, intaglio printing, offset printing, planographic printing, letterpress reverse offset printing, screen printing or gravure printing, or a spin coating method, subsequently carrying out a polymerization reaction of the polymer or oligomer through light irradiation, a heating treatment or the like, and thereby changing the solubility (curing) of the coated layer. By repeating such an operation, multilayering of the organic electronic element or organic EL element formed by a coating method can be facilitated.

The coating method such as described above can be carried out usually at a temperature in the range of $-20°$ C. to $+300°$ C., preferably $10°$ C. to $100°$ C., and particularly preferably $15°$ C. to $50°$ C. Furthermore, there are no particular limitations on the solvent used for the solution described above, but the same solvents as those used in the ink composition may be used.

For the light irradiation, light sources such as a low pressure mercury lamp, a medium pressure mercury lamp, a high pressure mercury lamp, an ultra-high pressure mercury lamp, a metal halide lamp, a xenon lamp, a fluorescent lamp, a light emitting diode, and sunlight can be used. The heating treatment can be carried out on a hot plate or in an oven, and can be carried out at a temperature in the range of $0°$ C. to $+300°$ C., preferably $20°$ C. to $180°$ C., and particularly preferably $60°$ C. to $120°$ C. Particularly, a treatment at $120°$ C. or below enables the application of a resin substrate, so that the production cost of organic electronic elements can be reduced.

Subsequently, an organic electronic material according to a second embodiment of the present invention will be described.

The organic electronic material according to the second embodiment of the present invention is an organic electronic material containing at least an ionic compound and a compound having a charge transporting unit (hereinafter, referred to as a charge transporting compound), and is characterized in that the ionic compound is composed of a counter cation and a counter anion, and the counter cation is any one kind or two or more kinds of $H^+$, a carbocation, a nitrogen cation, an oxygen cation, and a cation having a transition metal.

Since the organic electronic material according to the second embodiment of the present invention contains an ionic compound having a particular counter cation and an electron transporting compound, lowering of the driving voltage of the organic electronic element using the material, or stable long-term driving is made possible.

First, the counter cation will be described below.

[Counter Cation]

(Carbocation)

Examples of the carbocation include a primary carbocation, a secondary carbocation, and a tertiary carbocation. Among these, a secondary carbocation and a tertiary carbocation are preferred from the viewpoints of the stability of the material and the fact that when these cations are combined with the anion that will be described below, a polymerization initiator capable of curing at low temperature is formed, and a tertiary carbocation is most preferred. Further examples include triphenylcarbonium cation, tri(methylphenyl)carbonium cation, and tri(dimethylphenyl)carbonium cation.

(Nitrogen Cation)

Examples of the nitrogen cation include $NH_4^+$, a primary nitrogen cation, a secondary nitrogen cation, a tertiary nitrogen cation, and a quaternary nitrogen cation. Here, the primary nitrogen cation represents a compound in which $N^+$ is bonded to three hydrogen ions, and the other bond is linked to an atom other than hydrogen. The secondary nitrogen cation represents a compound in which $N^+$ is bonded to two hydrogen ions, and the other bonds are linked to atoms other than hydrogen. The tertiary nitrogen cation represents a compound in which $N^+$ is bonded to one hydrogen ion, and the other bonds are linked to atoms other than hydrogen. The quaternary ammonium cation represents a compound in which $N^+$ is bonded to atoms other than hydrogen.

Specific examples include ammoniums such as n-butylammonium, dimethylammonium, trimethylammonium, triethylammonium, triisopropylammonium, tri-n-butylammonium, tetramethylammonium, tetraethylammonium, tetra-n-butylammonium, N,N-dimethylcyclohexylammonium, tetramethylammonium, ethyltrimethylammonium, diethyldimethylammonium, triethylmethylammonium, tetraethylammonium, trimethyl-n-propylammonium, trimethylisopropylammonium, trimethyl-n-butylammonium, trimethylisobutylammonium, trimethyl-t-butylammonium, trimethyl-n-hexylammonium, dimethyldi-n-propylammonium, dimethyldiisopropylammonium, dimethyl-n-propylisopropylammonium, methyltri-n-propylammonium, and methyltriisopropylammonium.

Other examples include aniliniums such as N-methylanilinium, N,N-dimethylanilinium, N,N-dimethyl-4-methylanilinium, N,N-diethylanilinium, N,N-diphenylanilinium, and N,N,N-trimethylanilinium.

Further examples include pyridiniums such as pyridinium, N-methylpyridinium, N-butylpyridinium, N-methyl-4-methylpyridinium, N-benzylpyridinium, 3-methyl-N-butylpyridinium, 2-methylpyridinium, 3-methylpyridinium, 4-methylpyridinium, 2,3-dimethylpyridinium, 2,4-dimethylpyridinium, 2,6-dimethylpyridinium, 3,4-dimethylpyridinium, 3,5-dimethylpyridinium, 2,4,6-trimethylpyridinium, 2-fluoropyridinium, 3-fluoropyridinium, 4-fluoropyridinium, 2,6-difluoropyridinium, 2,3,4,5,6-pentafluoropyridinium, 2-chloropyridinium, 3-chloropyridinium, 4-chloropyridinium, 2,3-dichloropyridinium, 2,5-dichloropyridinium, 2,6-dichloropyridinium, 3,5-dichloropyridinium, 3,5-dichloro-2,4,6-trifluoropyridinium, 2-bromopyridinium, 3-bromopyridinium, 4-bromopyridinium, 2,5-dibromopyridinium, 2,6-dibromopyridinium, 3,5-dibromopyridinium, 2-cyanopyridinium, 3-cyanopyridinium, 4-cyanopyridinium, 2-hydroxypyridinium, 3-hydroxypyridinium, 4-hydroxypyridinium, 2,3-dihydroxypyridinium, 2,4-dihydroxypyridinium, 2-methyl-5-ethylpyridinium, 2-chloro-3-cyanopyridinium, 4-carboxamidopyridinium, 4-carboxyaldehydepyridinium, 2-phenylpyridinium, 3-phenylpyridinium, 4-phenylpyridinium, 2,6-diphenylpyridinium, 4-nitropyridinium, 4-methoxypyridinium, 4-vinylpyridinium, 4-mercaptopyridinium, 4-t-butylpyridinium, 2,6-di-t-butylpyridinium, 2-benzylpyridinium, 3-acetylpyridinium, 4-ethylpyridinium, pyridinium 2-carboxylate, pyridinium 4-carboxylate, and 2-benzoylpyridinium.

Still furtha examples include imidazoliums such as imidazolium, 1-methyl-imidazolium, 1-ethyl-3-methylimidazolium, 1-propyl-3-methylimidazolium, 1-butyl-3-methylimidazolium, 1-hexyl-3-methylimidazolium, 1-methyl-3-octylimidazolium, 1-methyl-N-benzylimidazolium, 1-methyl-3-(3-phenylpropyl)imidazolium, 1-butyl-2,3-dimethylimidazolium, and 1-ethyl-2,3-dimethylimidazolium.

Other examples include pyrrolidiniums such as 1-ethyl-1-methylpyrrolidinium and 1-butyl-1-methylpyrrolidinium.

Other examples include quinoliniums such as quinolinium and isoquinolinium. Still other examples include pyrrolidiniums such as N,N-dimethylpyrrolidinium, N-ethyl-N-methylpyrrolidinium, and N,N-diethylpyrrolidinium. Further examples include diimmonium and aminium described in WO 03/005076 and WO 03/97580.

Among these, a tertiary nitrogen cation and a quaternary nitrogen cation are preferred from the viewpoints of stability and the fact that these cations form initiators capable of curing at low temperature when combined with the anions that will be described below. A tertiary nitrogen cation is most preferred.

(Oxygen Cation)

Examples of the oxygen cation include trimethyloxonium, triethyloxonium, tripropyloxonium, tributyloxonium, trihexyloxonium, triphenyloxonium, pyrylium, chromenylium, and xanthylium.

(Cation Having Transition Metal)

Examples of the cation having a transition metal include Cr compounds such as ($\eta$5-cyclopentadienyl)($\eta$6-toluene)$Cr^+$, ($\eta$5-cyclopentadienyl)($\eta$6-xylene)$Cr^+$, ($\eta$5-cyclopentadienyl)($\eta$6-1-methylnaphthalene)$Cr^+$, ($\eta$5-cyclopentadienyl)($\eta$6-cumene)$Cr^+$, ($\eta$5-cyclopentadienyl)($\eta$6-mesitylene)$Cr^+$, ($\eta$5-cyclopentadienyl)($\eta$6-pyrene)$Cr^+$, ($\eta$5-fluorenyl)($\eta$6-cumene)$Cr^+$, ($\eta$5-indenyl)($\eta$6-cumene)$Cr^+$, bis($\eta$6-mesitylene)$Cr^{2+}$, bis($\eta$6-xylene)$Cr^{2+}$, bis($\eta$6-cumene)$Cr^{2+}$, bis($\eta$6-toluene)$Cr^{2+}$, ($\eta$6-toluene)($\eta$6-xylene)$Cr^{2+}$, ($\eta$6-cumene)($\eta$6-naphtalene)$Cr^{2+}$, bis($\eta$5-cyclopentadienyl)$Cr^+$, bis($\eta$5-indenyl)$Cr^+$, ($\eta$5-cyclopentadienyl)($\eta$5-fluorenyl)$Cr^+$ and ($\eta$5-cyclopentadienyl)($\eta$5-indenyl)$Cr^+$; and Fe compounds such as ($\eta$5-cyclopentadienyl)($\eta$6-toluene)$Fe^+$, ($\eta$5-cyclopentadienyl)($\eta$6-xylene)$Fe^+$, ($\eta$5-cyclopentadienyl)($\eta$6-1-methylnaphthalene)$Fe^+$, ($\eta$5-cyclopentadienyl)($\eta$6-cumene)$Fe^+$, ($\eta$5-cyclopentadienyl)($\eta$6-mesitylene)$Fe^+$, ($\eta$5-cyclopentadienyl)($\eta$6-pyrene)$Fe^+$, ($\eta$5-fluorenyl)($\eta$6-cumene)$Fe^+$, ($\eta$5-indenyl)($\eta$6-cumene)$Fe^+$, bis($\eta$6-mesitylene)$Fe^{2+}$, bis($\eta$6-xylene)$Fe^{2+}$, bis($\eta$6-cumene)$Fe^{2+}$, bis($\eta$6-toluene)$Fe^{2+}$, ($\eta$6-toluene)($\eta$6-xylene)$Fe^{2+}$, ($\eta$6-cumene)($\eta$6-naphthalene)$Fe^{2+}$, bis($\eta$5-cyclopentadienyl)$Fe^{2+}$, bis($\eta$5-indenyl)$Fe^+$, ($\eta$5-cyclopentadienyl)($\eta$5-fluorenyl)$Fe^+$ and ($\eta$5-cyclopentadienyl)($\eta$5-indenyl)$Fe^+$.

[Counter Anion]

The counter anion used in the present invention will be described.

The anion may be any conventionally known anion, and examples thereof include halogen ions such as $F^-$, $Cl^-$, $Br^-$, and $I^-$; $OH^-$; $ClO_4^+$; sulfonate ions such as $FSO_3^-$, $ClSO_3^-$, $CH_3SO_3^-$, $C_6H_5SO_3^-$, and $CF_3SO_3^-$; sulfate ions such as $HSO_4^-$ and $SO_4^{2-}$; carbonate ions such as $HCO_3^-$ and $CO_3^{2-}$; phosphate ions such as $H_2PO_4^-$, $HPO_4^{2-}$ and $PO_4^{3-}$; fluorophosphate ions such as $PF_6^-$ and $PF_5OH^-$; fluorinated alkyl fluorophosphate ions such as $[(CF_3CF_2)_3PF_3]^-$, $[(CF_3CF_2CF_2)_3PF_3]^+$, $[((CF_3)_2CF)_3PF_3]^-$, $[((CF_3)CF)_2PF_4]^-$, $[((CF_3)_2CFCF_2)_3PF_3]^-$ and $[((CF_3)_2CFCF_2)_2PF_4]^-$; borate ions such as $BF_4^-$, $B(C_6F_5)_4^-$, and $B(C_6H_4CF_3)_4^-$; $AlCl_4^-$; fluoroantimonate ions such as $BiF_6$, $SbF_6^-$ and $SbF_5OH^-$; and fluoroarsenate ions such as $AsF_6^-$ and $AsF_5OH^-$.

There are no particular limitations on the counter anion used in the present invention, but the following structures are preferred from the viewpoints that the lifetime of organic electronic elements is lengthened, and that those counter anions form polymerization initiators capable of curing at low temperature when combined with the anion described above.

Fluorophosphate ions such as $PF_6^-$ and $PF_5OH^-$; fluorinated alkyl fluorophosphate ions such as $[(CF_3CF_2)_3PF_3]^-$, $[(CF_3CF_2CF_2)_3PF_3]^-$, $[((CF_3)_2CF)_3PF_3]^-$, $[((CF_3)_2CF_2PF_4]^-$, $[((CF_3)_2CFCF_2)_3PF_3]^-$ and $[((CF_3)_2CFCF_2)_2PF_4]^-$; borate ions such as $BF_4^-$, $B(C_6F_5)_4^-$, and $B(C_6H_4CF_3)_4^-$; $AlCl_4^-$; and fluoroantimonate ions such as $BiF_6$, $SbF_6^-$, and $SbF_5OH^-$ are preferred.

(Ionic Compound)

The ionic compound used in the present invention is composed of the counter cation and the counter anion described above. There are no particular limitations on this combination; however, from the viewpoints that the lifetime of organic electronic elements is extended, and that the ionic compound can be used as an initiator capable of curing at low temperature when combined with the anion described above, combinations of a carbonium cation with fluorophosphate ions such as $PF_6^-$ and $PF_5OH^-$; borate ions such as $BF_4^-$, $B(C_6F_5)_4^-$, and $B(C_6H_4CF_3)_4^-$; or fluoroantimonate ions such as $SbF_6^-$ and $SbF_5OH^-$; combinations of anilinium with fluorophosphate ions such as $PF_6^-$ and $PF_5OH^-$; borate ions such as $BF_4^-$, $B(C_6F_5)_4^-$, and $B(C_6H_4CF_3)^-$; or fluoroantimonate ions such as $SbF_6^-$ and $SbF_5OH^-$ are preferred, while combinations of a carbonium cation with borate ions such as $B(C_6F_5)^-$ and $B(C_6H_4CF_3)_4^-$; or fluoroantimonate ions such as $SbF_6^-$ and $SbF_5OH^-$; and combinations of anilinium with borate ions such as $B(C_6F_5)_4^-$ and $B(C_6H_4CF_3)_4^-$; or fluoroantimonate ions such as $SbF_6^-$ and $SbF_5OH^-$ are more preferred.

Specific examples include a salt of a triphenylcarbonium cation and $SbF_6^-$, a salt of a triphenylcarbonium cation and $B(C_6F_5)_4^-$, a salt of N,N-dimethylanilinium and $SbF_6^-$, and a salt of N,N-dimethylanilinium and $B(C_6F_5)_4^-$.

The ionic compound may be used singly, or two or more kinds may be mixed at any proportion.

[Compound Having Charge Transporting Unit (Electron Transporting Compound)]

The term "charge transporting unit" according to the present invention is an atomic group having an ability to transport holes or electrons, and the details thereof will be described below.

The charge transporting unit may be any moiety having an ability to transport holes or electrons, and there are no particular limitations. However, the charge transporting unit is preferably an amine having an aromatic ring, a carbazole, or a thiophene, and for example, the charge transporting unit preferably has a partial structure represented by one of the following formulas (1a) to (7a).

[Chemical Formula 30]

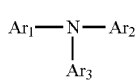

(1a)

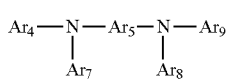

(2a)

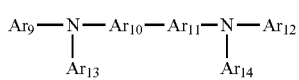

(3a)

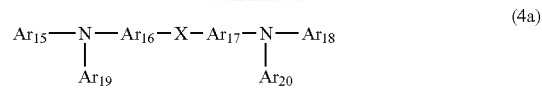

(4a)

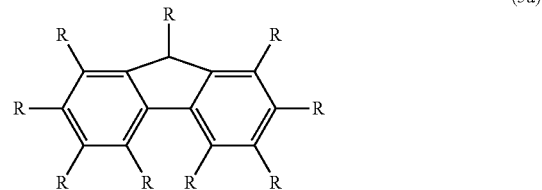

(5a)

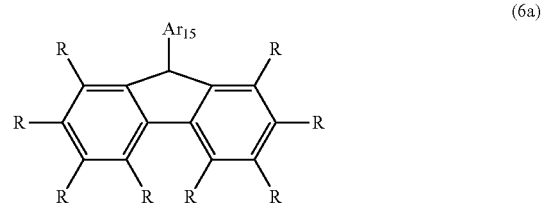

(6a)

(7a)

(wherein $Ar_1$ to $Ar_{20}$ each independently represent an aryl group or heteroaryl group having 2 to 30 carbon atoms, or a substituted or unsubstituted arylene group or heteroarylene group. Here, the aryl group is an atomic group obtained by excluding one hydrogen atom from an aromatic hydrocarbon, and a heteroaryl group represents an atomic group obtained by excluding one hydrogen atom from an aromatic compound having a heteroatom, or R. R's each independently represent $-R^1$, $-OR^2$, $-SR^3$, $-OCOR^4$, $-COOR^5$, $-SiR^6R^7R^8$, or one of the formulas (2a) to (4a) (wherein $R^1$ to $R^8$ each represent a hydrogen atom, a linear, cyclic or branched alkyl group having 1 to 22 carbon atoms, or an aryl group or heteroaryl group having 2 to 30 carbon atoms.). Here, the arylene group is an atomic group obtained by excluding two hydrogen atoms from an aromatic hydrocarbon, and a heteroarylene group is an atomic group obtained by excluding two hydrogen atom from an aromatic compound having a heteroatom. X represents a group obtained by further removing one hydrogen atom from a group having one or more hydrogen atoms selected among the groups represented by R.)

Furthermore, the charge transporting compound according to the present invention is preferably a polymer or an oligomer, from the viewpoints of solubility and film-forming properties. Further, the polymer or oligomer preferably contains a repeating unit represented by one of the following formulas.

[Chemical Formula 31]

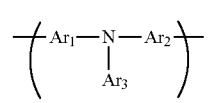

(1a)

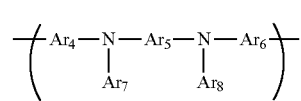

(2a)

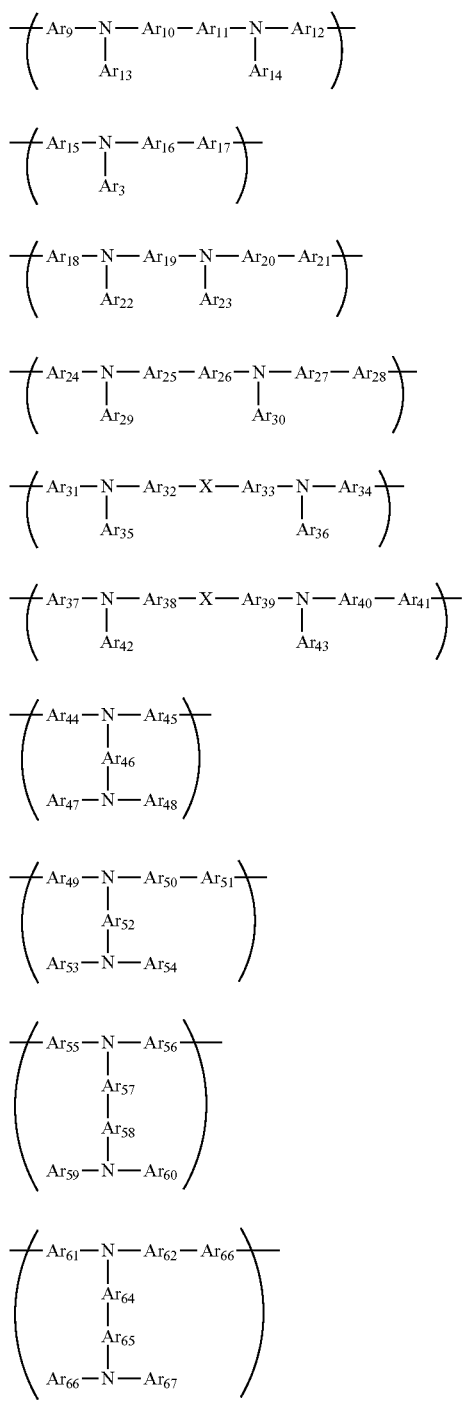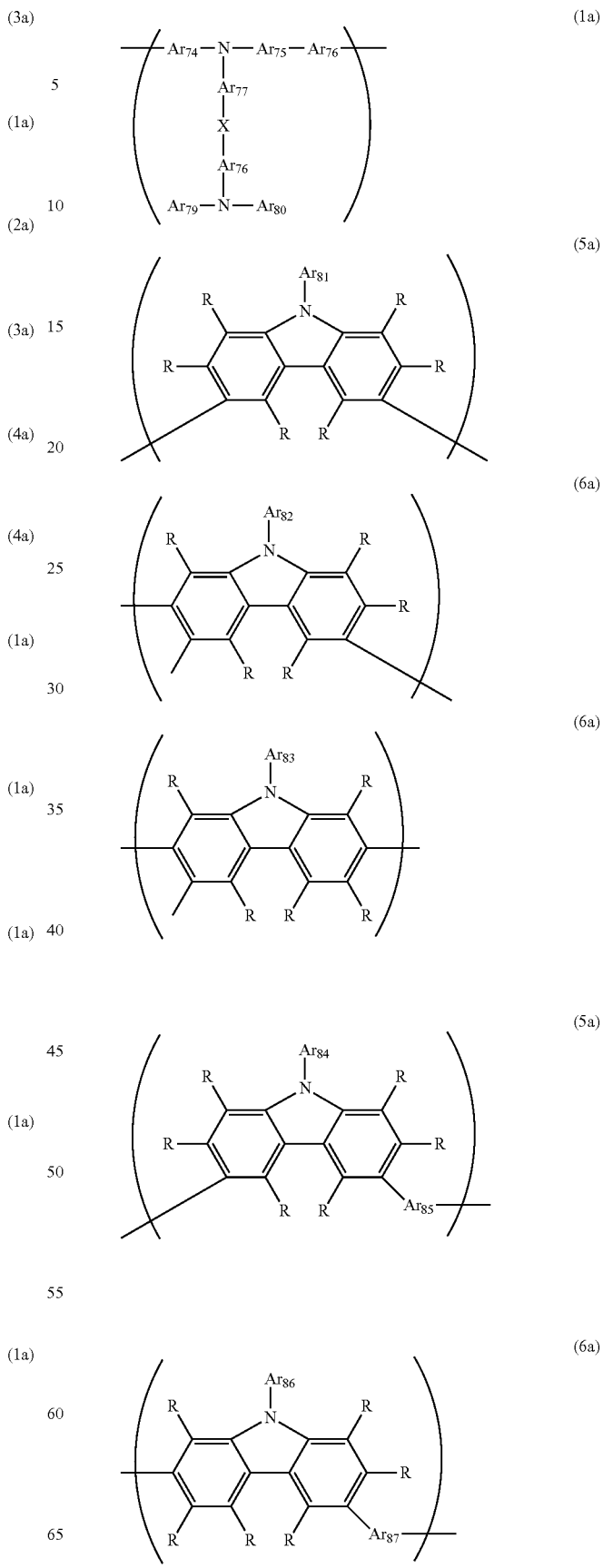

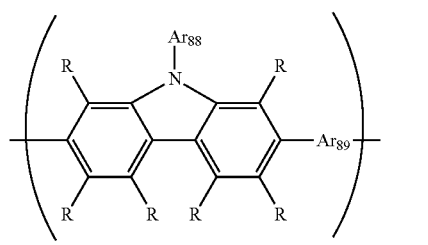
(6a)
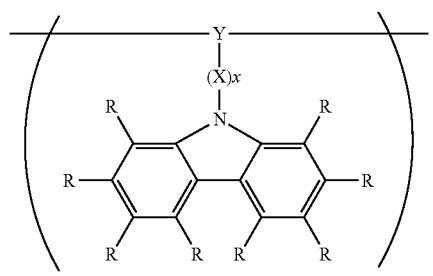
(5a)
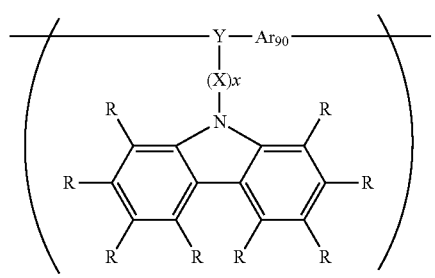
(5a)
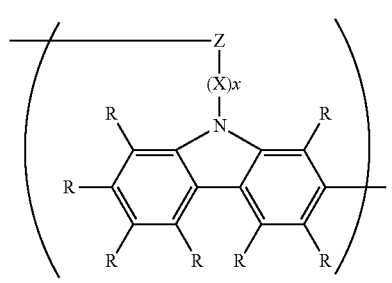
(5a)
[Chemical Formula 33]
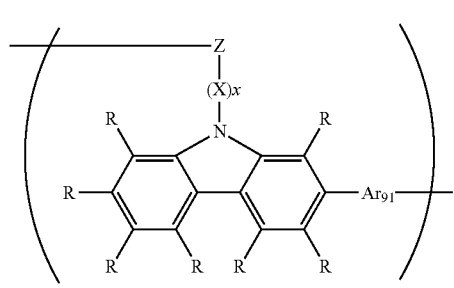
(5a)
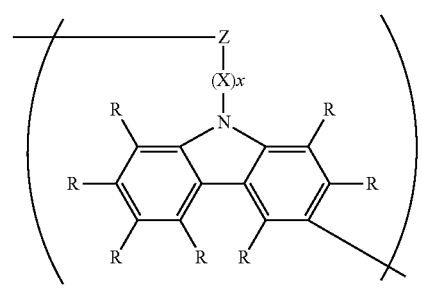
(5a)
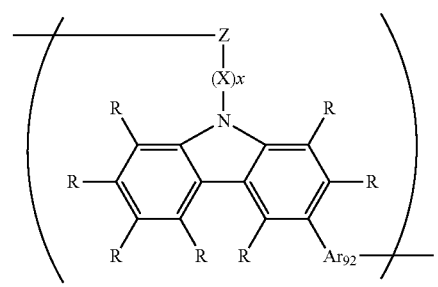
(5a)
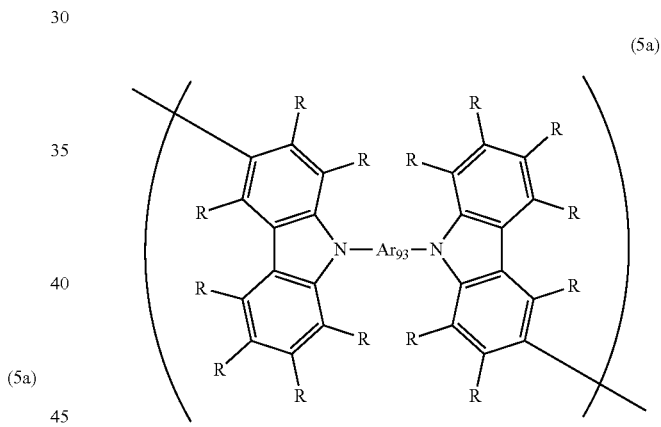
(5a)
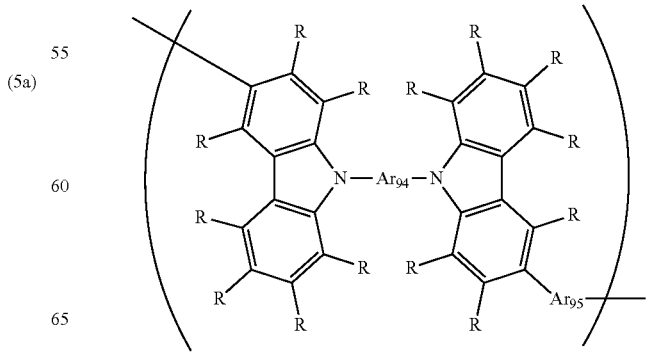
(5a)

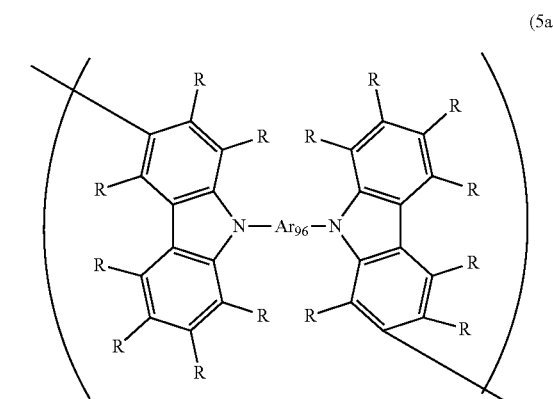
(5a)
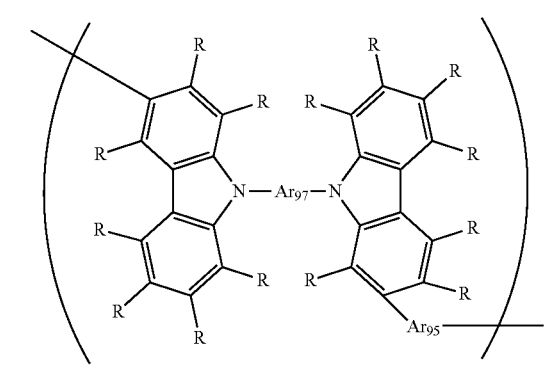
(5a)
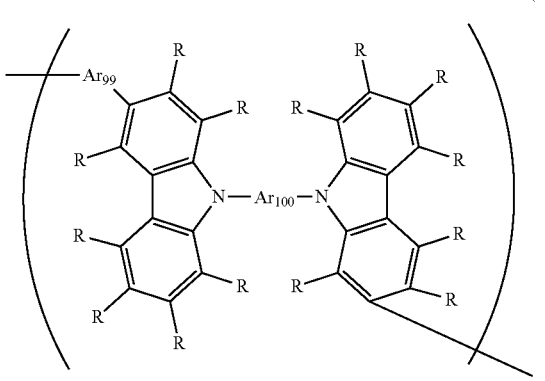
(5a)
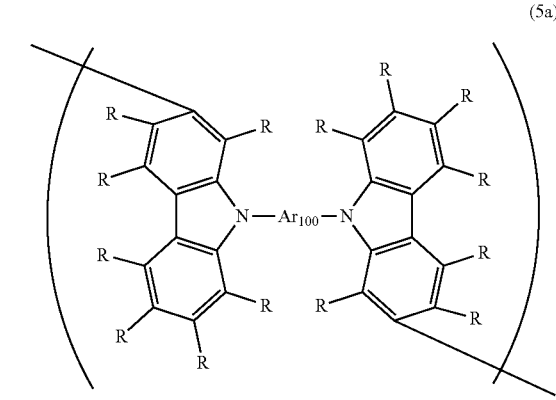
(5a)
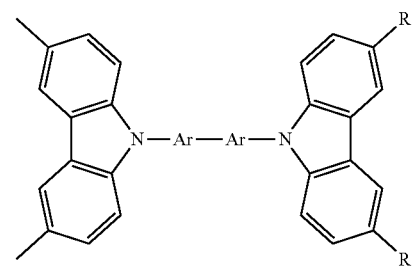
[Chemical Formula 34]
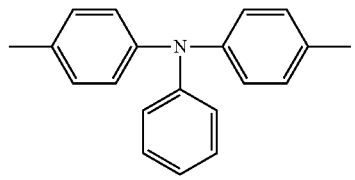
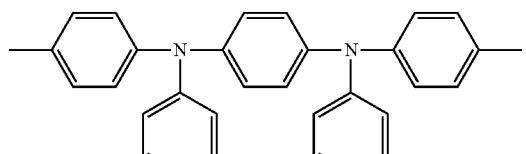
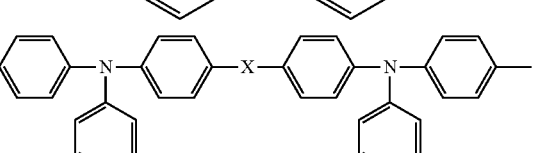
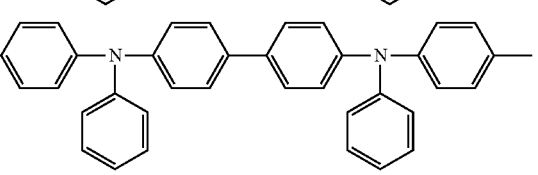
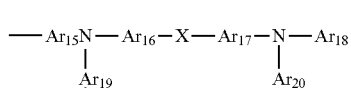
(4a)
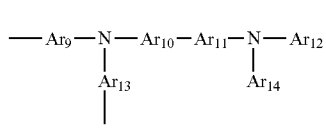
(3a)
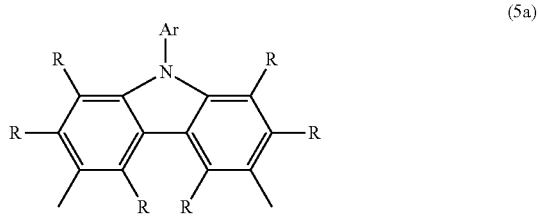
(5a)
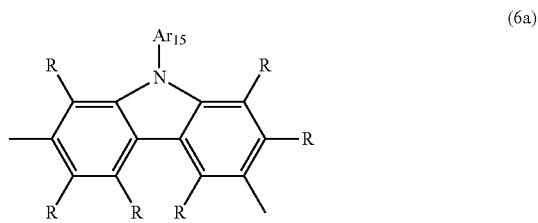
(6a)

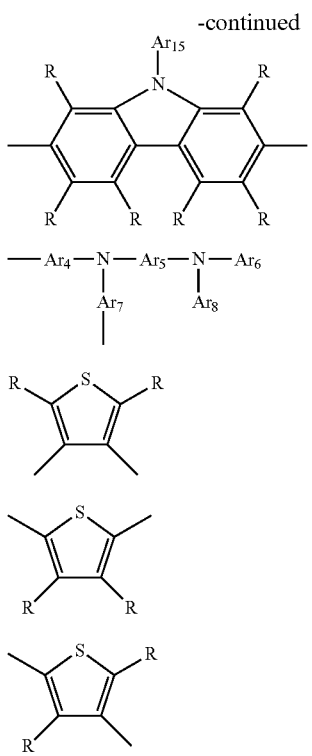

In the formulas shown above, $Ar_1$ to $Ar_{100}$ each independently represent an aryl group or heteroaryl group having 2 to 30 carbon atoms, or a substituted or unsubstituted arylene group or heteroarylene group. Here, the aryl group is an atomic group obtained by excluding one hydrogen atom from an aromatic hydrocarbon, and a heteroaryl group represents an atomic group obtained by excluding one hydrogen atom from an aromatic compound having a heteroatom. R's each independently represent —$R^1$, —$OR^2$, —$SR^3$, —$OCOR^4$, —$COOR^5$, —$SiR^6R^7R^8$, or one of the formulas (2a) to (4a) (wherein $R^1$ to $R^8$ each represent a hydrogen atom, a linear, cyclic or branched alkyl group having 1 to 22 carbon atoms, or an aryl group or heteroaryl group having 2 to 30 carbon atoms.) Here, the arylene group is an atomic group obtained by excluding two hydrogen atoms from an aromatic hydrocarbon, and a heteroarylene group is an atomic group obtained by excluding two hydrogen atoms from an aromatic compound having a heteroatom. X represents a group obtained by further removing one hydrogen atom from a group having one or more hydrogen atoms selected among the groups represented by R. Y represents a trivalent substituent, and Z represents a divalent substituent. Further, x represents an integer of 1 or greater.

Furthermore, the polymer or oligomer preferably has one or more "polymerizable substituent" so as to change the solubility. Here, "polymerizable substituent" is a substituent which is capable of forming an intermolecular bond between two or more molecules through a polymerization reaction, and specific examples thereof are the same as the polymerizable substituents of the polymer or oligomer previously described in connection with the first embodiment of the present invention. According to the second embodiment, any of oxetane, epoxy and vinyl ether is preferred.

The polymer or oligomer that forms the polymerized layer according to the present invention may also be a copolymer having the above-described arylene group or heteroarylene group, or the structure represented by any of the formulas, as a copolymerization repeating unit in addition to the repeating units described above, for the purpose of regulating the solubility, heat resistance or electrical properties. In this case, the copolymer may be a random, block or graft copolymer, or may also be a polymer having an intermediate structure, for example, a random copolymer having the characteristics of a block copolymer. The polymer or oligomer used in the present invention may have branches in the main chain, and may therefore have three or more chain ends.

According to the present invention, it is preferable that the ionic compound previously described be an electron-accepting compound, and the charge transporting compound be possibly one-electron oxidized by that ionic compound. It is because when the charge transporting compound is oxidized, the carrier injection properties at the anode are improved, and it is useful for low voltage driving of the organic electronic element.

(Solvent)

Examples of the solvent used in the present invention include chloroform, methylene chloride, dichloroethane, tetrahydrofuran, toluene, xylene, mesitylene, anisole, phenetol, acetone, methyl ethyl ketone, ethyl acetate, butyl acetate, ethyl acetate, n-butyl acetate, ethyl lactate, n-butyl lactate, γ-butyrolactone, ethylcellosolve acetate, phenyl acetate, phenyl propionate, methyl benzoate, ethyl benzoate, propyl benzoate, n-butyldiphenylmethane benzoate, diphenyl ether, N,N-dimethylformamide, N,N-dimethylacetamide, and ethylene glycol dimethyltetralin. Any one of these may be used singly, or two or more kinds may be used in any combination and at any proportion.

(Ratio)

The mixing ratio of the ionic compound is preferably from 0.01 parts by mass to 50 parts by mass, more preferably from 0.05 parts by mass to 25 parts by mass, and particularly preferably from 0.1 parts by mass to 20 parts by mass, when 100 parts by mass of the charge transporting compound is used. If the mixing ratio of the ionic compound is less than 0.01 parts by mass, the effect of decreasing the driving voltage is not obtained, and if the mixing ratio is more than 50 parts by mass, the driving voltage tends to increase.

When the ionic compound is used as a polymerization initiator, the mixing ratio is preferably from 0.1 parts by mass to 50 parts by mass relative to 100 parts by mass of the compound having a polymerizable substituent. If the mixing ratio is less than 0.1 parts by mass, polymerization does not sufficiently proceed. If the mixing ratio is more than 50 parts by mass, there is a problem that the film quality is deteriorated. In regard to the polymerization method using the ionic compound as a polymerization initiator, it is preferable to initiate the polymerization only by heating.

(Other Components)

The ionic compound has both the function of a polymerization initiator and the function of an electron acceptor. These may be used singly, or plural agents may be used in combination. Furthermore, the material may also contain a polymerization initiator or an electron acceptor other than those belonging to the scope of the present invention. If necessary, the material may further contain a crosslinking material or a luminescent material.

[Method for Forming Thin Film]

In order to form various layers that are used an in organic electronic element or the like using the organic electronic material of the present invention, for example, the formation can be carried out by applying a solution containing the organic electronic material of the present invention on a desired base material by a known method such as, for example, an inkjet method, a casting method, an immersion method, a printing method such as letterpress printing, intaglio printing, offset printing, planographic printing, letterpress reverse offset printing, screen printing or gravure printing, or a spin coating method, subsequently carrying out a polymerization reaction through light irradiation, a heating treatment or the like, and thereby changing the solubility (curing) of the coated layer. By repeating such an operation, multilayering of the organic electronic element or organic EL element formed by a coating method, can be facilitated.

[Substrate]

As the substrate that can be used in the organic EL element of the present invention, there are no particular limitations on the kind of glass, plastics and the like, and there is no particular restriction as long as the substrate is transparent. However, glass, quartz, a light-transmissive resin film or the like is used with preference. When a resin film is used, the organic EL element can be imparted with flexibility, which is particularly preferable.

Examples of the resin film include films formed from polyethylene terephthalate (PET), polyethylene naphthalate (PEN), polyether sulfone (PES), polyether imide, polyether ether ketone, polyphenylene sulfide, polyallylate, polyimide, polycarbonate (PC), cellulose triacetate (TAC), cellulose acetate propionate (CAP) and the like.

Furthermore, when a resin film is used, the resin film may be used after coating the film with an inorganic substance such as silicon oxide or silicon nitride, in order to suppress penetration of water vapor, oxygen or the like.

[Organic EL Element]

The organic EL element of the present invention has a layer formed from the organic electronic material of the first embodiment or the second embodiment of the present invention (hereinafter, also referred to as an organic thin film (polymerized layer)). In other words, the organic EL element is characterized by including the organic thin film of the present invention. The organic EL element of the present invention is not particular limited as long as the element includes a light emitting layer, an anode, a cathode and a substrate, and may also have other layers such as a hole injection layer, an electron injection layer, a bole transport layer, and an electron transport layer. Any of the light emitting layer, hole injection layer, electron injection layer, hole transport layer and electron transport layer may be the organic thin film of the present invention. Hereinafter, the various layers will be described in detail.

[Light Emitting Layer]

The material used in the light emitting layer may be a low molecular weight compound, or may be a polymer or an oligomer, and a dendrimer or the like can also be used. In the case of a polymer or an oligomer, it is preferable because the polymer or oligomer has high solubility in solvents and a coating type production method can be applied. Examples of a low molecular weight compound utilizing fluorescent light emission include perylene, coumarin, rubrene, quinacridone, dyes for dye lasers (for example, rhodamine, and DCMI), aluminum complexes (for example, tris(8-hydroxyquinolinato)aluminum(III) (Alq$_3$)), stilbene, and derivatives thereof. As a polymer or oligomer utilizing fluorescent light emission, polyfluorene, polyphenylene, polyphenylenevinylene (PPV), polyvinylcarbazole (PVR), a fluorene-benzothiadiazole copolymer, a fluorene-triphenylamine copolymer, and derivatives or mixtures thereof can be suitably used.

On the other hand, due to a demand for an improvement of the efficiency of organic EL elements in recent years, the development of phosphorescent organic EL elements is also actively underway. In a phosphorescent organic EL element, it is possible to utilize the energy of the singlet state as well as the energy of the triplet state, and the internal quantum yield can, in principle, be increased up to 100%. In the phosphorescent organic EL element, phosphorescent light emission is extracted by doping a host material with a metal complex-based phosphorescent material containing a heavy metal such as platinum or iridium, as a dopant emitting phosphorescent light (see M. A. Baldo et al., Nature, Vol. 395, p. 151 (1998); M. A. Baldo et al., Applied Physics Letters, Vol. 75, p. 4 (1999); or M. A. Baldo et al., Nature, Vol. 403, p. 750 (2000)).

Also for the organic EL element of the present invention, it is preferable to use a phosphorescent material in the light emitting layer from the viewpoint of increasing the efficiency. In a phosphorescent organic EL element using a phosphorescent material, it is possible to utilize the energy of the singlet state as well as the energy of the triplet state, and the internal quantum yield can in principle be increased up to 100%. In the phosphorescent organic EL element, phosphorescent light emission is extracted by doping a host material with a metal complex-based phosphorescent material containing a heavy metal such as platinum or iridium, as a dopant emitting phosphorescent light (see M. A. Baldo et al., Nature, Vol. 395, p. 151 (1998); M. A. Baldo et al., Applied Physics Letters, Vol. 75, p. 4 (1999); or M. A. Baldo et al., Nature, Vol. 403, p. 750 (2000)).

As the phosphorescent material, a metal complex containing a central metal such as Ir or Pt can be suitably used. Specific examples include, as Ir complexes, FIr(pic) [iridium (III) bis[(4,6-difluorophenyl)-pyridinato-N,C$^2$]picolinate] emitting blue light; Ir(ppy)$_3$ [fac-tris(2-phenylpyridine)iridium] emitting green light (see Non-Patent Document 4 described above); and (btp)$_2$Ir(acac) {bis[2-(2'-benzo[4,5-α]thienyl)pyridinato-N,C3]iridium (acetylacetonate)} and Ir(piq)$_3$ [tris(1-phenylisoquinoline)iridium] emitting red light, which are shown in Adachi et al., Appl. Phys. Lett., 78, No. 11, p. 1622 (2001).

Examples of a Pt complex include 2,3,7,8,12,13,17,18-octaethyl-21H,23H-phorphine platinum (PtOEP) emitting red light.

As the phosphorescent material, low molecular weight or dendride compounds, for example, an iridium-cored dendrimer, can be used. Further, derivatives thereof can also be suitably used.

When a phosphorescent material is contained in the light emitting layer, it is preferable that the light emitting layer contain a host material in addition to the phosphorescent material.

The host material may be a low molecular weight compound or may be a polymeric compound, and a dendrimer or the like can also be used.

Examples of the low molecular weight compound include CBP (4,4'-bis(9H-carbazol-9-yl)biphenyl), mCP (1,3-bis(9-carbazolyl)benzene), and CDBP (4,4'-bis(carbazol-9-yl)-2,2'-dimethylbiphenyl). The polymeric compound may be the polymer or oligomer of the present invention, or polyvinylcarbazole, polyphenylene, polyfluorene and the like can be used, and derivatives thereof can also be used.

The light emitting layer may be formed by a vapor deposition method, or may be formed by a coating method.

In the case of forming the light emitting layer by a coating method, it is more preferable because the organic EL element can be produced at low cost. When the light emitting layer is formed according to a coating method, the formation can be carried out by applying a solution containing a phosphorescent material and if necessary, a host material, on a desired base material by a known method such as, for example, an inkjet method, a casting method, an immersion method, a printing method such as letterpress printing, intaglio printing, offset printing, planographic printing, letterpress reverse offset printing, screen printing or gravure printing, or a spin coating method.

The coating method such as described above can be carried out at a temperature in the range of usually −20° C. to +300° C., preferably 10° C. to 100° C., and particularly preferably 15° C. to 50° C. Further, for the light irradiation process, a light source such as a low pressure mercury lamp, a medium pressure mercury lamp, a high pressure mercury lamp, an ultra-high pressure mercury lamp, a metal halide lamp, a xenon lamp, a fluorescent lamp, a light emitting diode, or sunlight can be used. There are no particular limitations on the solvent used in the solution described above, but examples include chloroform, methylene chloride, dichloroethane, tetrahydrofuran, toluene, xylene, mesitylene, anisole, acetone, methyl ethyl ketone, ethyl acetate, butyl acetate, ethylcellosolve acetate, diphenylmethane, diphenyl ether, and tetralin. Furthermore, the heating treatment after coating can be carried out on a hot plate or in an oven, and can be carried at a temperature in the range of 0° C. to +300° C., preferably 20° C. to 250° C., more preferably 50° C. to 200° C., and even more preferably 70° C. to 150° C. When the temperature is low, the curing reaction cannot proceed sufficiently, and since there is a problem that residual solvent remains, the lifetime of the organic electronic element decreases. When the temperature is high, it is difficult to produce the organic electronic element on a resin substrate.

It is preferable that the curing reaction after coating be carried out only by a heating treatment, so as to achieve an extension of the lifetime of the organic electronic element.

[Organic Thin Film (Polymerized Layer)]

Next, the layer formed by using a mixture containing the organic electronic material of the present invention, that is, the organic thin film, will be described in detail. The layer formed by using a mixture containing the organic electronic material of the present invention (polymerized layer) is, specifically, a layer obtained by applying a mixture containing the organic electronic material of the present invention on a desired base material by the coating method described above for the method for forming a thin film, subsequently carrying out a polymerization reaction of the polymerizable substituent carried by the polymer or oligomer through light irradiation, a heating treatment or the like, and thereby changing the solubility of the coated layer (curing), that is, making the layer insoluble. As such, when a polymerization reaction of the polymerizable substituent carried by the polymer or oligomer is carried out, and thereby the solubility of the coated layer is changed (cured), the thermal stability of the layer can be improved.

Furthermore, when the solubility is decreased by the polymerization reaction, even in the case of further applying and forming another layer such as a light emitting layer, a hole transport layer, an electron transport layer or an electron injection layer, the organic thin film (polymerized layer) is not dissolved by the coating liquid, and therefore, this other layer can be formed by a coating method. That is, since a multilayer structure can be easily produced by a coating method, an organic EL element having high efficiency and a long lifetime can be produced at low cost. According to the second embodiment, the charge transporting compound used in the polymerized layer is preferably a polymer or oligomer containing a repeating unit having hole transport properties, from the viewpoint of the uniformity of the film.

The organic thin film (polymerized layer) can be used as a hole injection layer, a hole transport layer, a light emitting layer, an electron transport layer, or an electron injection layer of an organic EL element, and from the viewpoints of light emission efficiency and lifetime characteristics, the organic thin film is particularly preferably a hole injection layer, a hole transport layer, an electron transport layer, or an electron injection layer.

In the organic EL element of the present invention, any one layer may be the organic thin film (polymerized layer), or plural layers or all the layers may be polymerized layers. Furthermore, although there are no particular limitations on the film thickness of these layers, from the viewpoint of reducing the influence of the surface unevenness of the substrate or the lower layer and reducing the influence of the dust or the like adhering to the substrate or the surface of the lower layer, the thickness in the case of a hole injection layer, a hole transport layer, an electron injection layer or an electron transport layer is preferably 10 to 100 nm, more preferably 15 to 90 nm, and even more preferably 20 to 80 nm. If the thickness is smaller than 10 nm, the organic thin film cannot fill up the surface unevenness of the substrate or the lower layer, and the organic thin film may cause layers that are originally not adjacent to each other to be short-circuited, or become susceptible to the influence of dust or the like on the substrate or on the surface of the lower layer. Furthermore, if the thickness is larger than 100 nm, a decrease in the light extraction efficiency or an increase in the driving voltage may occur easily. On the other hand, in the case of a light emitting layer, the thickness is preferably 10 to 200 nm, more preferably 15 to 190 nm, and even more preferably 20 to 180 nm. If the thickness is smaller than this range, a sufficient light emission intensity cannot be obtained, and if the thickness is larger than this range, the driving voltage is prone to increase.

Furthermore, the organic thin film (polymerized layer) is more preferably laminated to be adjacent to a light emitting layer containing a phosphorescent material. This is because the organic thin film has less influence on the light emission efficiency and deterioration of the phosphorescent material, and can improve the light emission efficiency of the element or the element lifetime.

[Cathode]

The cathode material is preferably, for example, a metal such as Li, Ca, Mg, Al, In, Cs, Ba, Mg/Ag, LiF, or CsF, or a metal alloy.

[Anode]

For the anode, a metal (for example, Au), or another material having the electrical conductivity of a metal, for example, an oxide (for example, ITO: indium oxide/tin oxide), or a conductive polymer (for example, a polythiophene-polystyrene sulfonate mixture (PEDOT:PSS)) can be used.

[Electron Transport Layer and Electron Injection Layer]

Examples of the electron transport layer and the electron injection layer include phenanthroline derivatives (for example, 2,9-dimethyl-4,7-diphenyl-, 10-phenanthroline (BCP)), bipyridine derivatives, nitro-substituted fluorene derivatives, diphenylquinone derivatives, thiopyrane dioxide derivatives, heterocyclic tetracarboxylic acid anhydrides such as naphthaleneperylene, carbodiimides, fluorenylidenemethane derivatives, anthraquinodimethane and anthrone derivatives, oxadiazole derivatives (2-(4-biphenylyl)-5-(4-t-butylphenyl-1,3,4-oxadiazole (PBD)), and aluminum complexes (for example, tris(8-hydroxyquinolinato)aluminum (III) ($Alq_3$)). Furthermore, thiadiazole derivatives obtained by substituting the oxygen atom of an oxadiazole ring in the oxadiazole derivatives with a sulfur atom, and quinoxaline derivatives having a quinoxaline ring, which is known as an electron-withdrawing group, can also be used. A polymer or oligomer according to the present invention, having a partial structure of the derivatives described above, can also be used.

[Emission Color]

There are no particular limitations on the emission color for the organic EL element of the present invention, but a white light emitting element is preferred because it can be used in various lighting instruments for home lighting, automobile interior lighting, and backlights for clocks and liquid crystal displays.

In regard to the method for forming a white light emitting element, since it is difficult for the present to obtain white light emission using a single material, white light emission is obtained by simultaneously emitting plural emission colors using plural light emitting materials and thereby mixing the colors. There are no particular limitations on the combination of plural emission colors, but a combination including three maximum emission wavelengths of blue, green and red colors, and a combination including two maximum emission wavelengths using the relationships of complementary colors such as blue and yellow, or yellow-green and orange, may be used. Furthermore, the control of the emission color can be carried out by adjusting the type and amount of the phosphorescent material.

<Display Element, Lighting Device, and Display Device>

The display element of the present invention is characterized by including the organic EL element of the present invention previously described.

For example, a color display element may be obtained by using the organic EL element of the present invention as an element corresponding to each pixel of red, green and blue (RGB).

In regard to the formation of images, a simple matrix type system in which individual organic EL elements arranged in a panel are directly driven by electrodes disposed in a matrix form, and an active matrix type system in which a thin film transistor is disposed in each element are available. The former involves a simple structure, but since there is a limitation on the number of vertical pixels, the former system is used for the display of characters and the like. The latter works satisfactorily even if the driving voltage is low and the current is small, and bright high-definition images are obtained. Therefore, the latter system is used for high resolution displays.

Furthermore, the lighting device of the present invention is characterized by including the organic EL element of the present invention previously described. The display device of the present invention is characterized by including the lighting device and a liquid crystal element as a display unit. The display device may be a display device which uses the lighting device of the present invention as a backlight (white emission color source) and uses a liquid crystal element as a display unit, that is, a liquid crystal display device. This constitution is a constitution in which, in a known liquid crystal display device, only the backlight is replaced with the lighting device of the present invention, and the liquid crystal element part can be produced by diverting known technologies.

EXAMPLES

Hereinafter, the present invention will be more specifically described by way of Examples, bit the present invention is not intended to be limited to the following Examples.

(Synthesis of Monomer A)

3-Ethyl-3-hydroxymethyloxetane (50 mmol), 4-bromobenzyl bromide (50 mmol), n-hexane (200 mL), tetrabutylammonium bromide (2.5 mmol) and a 50 wt % aqueous solution of sodium hydroxide (36 g) were introduced into a round bottom flask, and the mixture was heated and stirred for 6 hours at 70° C. under nitrogen.

After the mixture was cooled to room temperature (25° C.), 200 mL of water was added thereto, and the resulting mixture was extracted with n-hexane. The solvent was distilled off, and then the residue was purified by silica gel column chromatography and distillation under reduced pressure. Thus, 9.51 g of a monomer A having a polymerizable substituent was obtained as a colorless oily substance. Yield 67%.

$^1$H-NMR (300 MHz, CDCl$_3$, δ ppm); 0.86 (t, J=7.5 Hz, 3H), 1.76 (t, J=7.5 Hz, 21), 3.57 (s, 2H), 4.39 (d, J=5.7 Hz, 2H), 4.45 (d, J=5.7 Hz, 2H), 4.51 (s, 2H), 7.22 (d, J=8.4 Hz, 2H), 7.47 (d, J=8.4 Hz, 2H).

The reaction scheme of the present Synthesis Example is presented below.

[Chemical Formula 35]

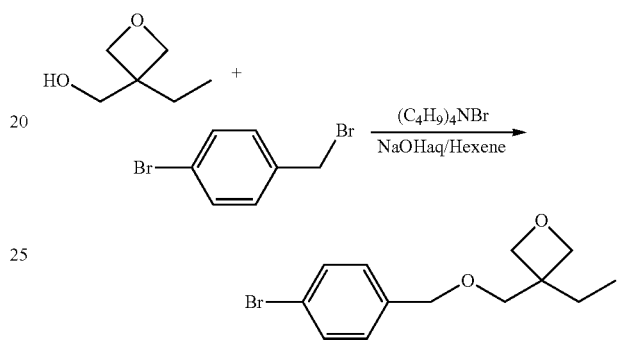

(Synthesis of Monomer B)

1,6-dibromohexane (73.2 g, 0.3 mol) and 3-ethyl-3-hydroxyoxetane (Toagosei Co., Ltd., OXT-101) (11.6 g, 0.1 mol) were dissolved in 400 mL of n-hexane, and tetrabutylammonium bromide (1.62 g, 4.9 mmol) and 100 g of a 45% aqueous solution of sodium hydroxide were added to the solution. The mixture was heated to reflux for 6 hours. After completion of the reaction, 200 mL of water was added to the reaction mixture, and the organic layer was separated. The aqueous layer was extracted three times with n-hexane, and the extract was combined with the organic layer initially separated. The organic layer was dried over anhydrous sodium sulfate. The solvent was distilled off with an evaporator, and 1,6-dibromohexane was distilled off by distillation under reduced pressure (3 to 10 mmHg, 110° C.). Thus, 3-(6-bromohexyloxymethyl)-3-ethyloxetane was obtained as a colorless oily substance (25.0 g, yield 89.7%).

The reaction scheme of the above reaction is presented below.

[Chemical Formula 36]

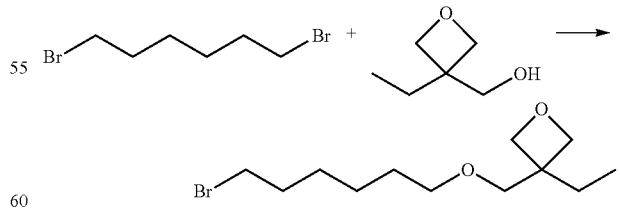

p-bromobenzyl alcohol (16.4 g, 0.088 mol) and 3-(6-bromohexyloxymethyl)-3-ethyloxetane (22.2 g, 0.080 mol) were dissolved in 320 mL of n-hexane, and tetrabutylammonium bromide (1.29 g, 4.0 mmol) and 80 g of a 45% aqueous solution of sodium hydroxide were added to the solution. The mixture was heated to reflux for 9 hours. After completion of the reaction, 200 mL of water was added thereto, and the organic layer was separated and was dried over anhydrous sodium sulfate. The solvent was distilled off with an evaporator, and a crude product thus obtained was purified by silica gel column chromatography (filler: Wako-gel (registered trademark) C-300HG, mobile phase: n-hexane:ethyl acetate=4:1). Thus, 3-(6-(p-bromobenzyloxy)hexyloxymethyl)-3-ethyloxetane was obtained as a colorless oily substance (18.4 g, yield 60.2%).

The reaction scheme of the above reaction is presented below.

[Chemical Formula 37]

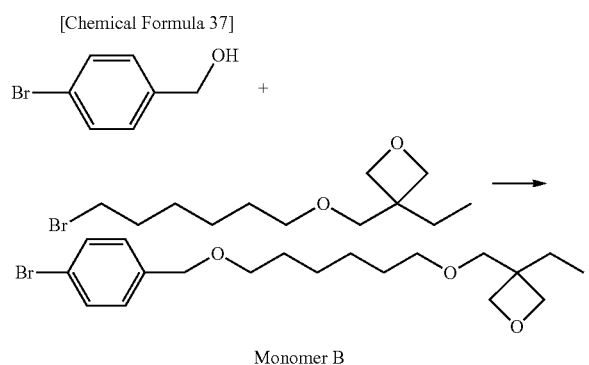

Monomer B (Preparation of Pd Catalyst)

In a glove box under a nitrogen atmosphere, tris(dibenzylideneacetone)dipalladium (73.2 mg, 80 μmol) was weighed in a sample tube at room temperature, anisole (15 mL) was added thereto, and the mixture was stirred for 30 minutes. Similarly, tris(t-butyl)phosphine (129.6 mg, 640 μmol) was weighed in a sample tube, anisole (5 mL) was added thereto, and the mixture was stirred for 5 minutes. These solutions were mixed and stirred at room temperature for 30 minutes. The resultant was used as a catalyst.

Oligomer Synthesis Example 1

In a sealable container made of a fluororesin, tris(4-bromophenyl)amine (0.3 mmol) as a monomer 1, 1,4-bis(4,4,5,5-tetramethyl-1,3-dioxa-2-boracyclopentan-2-yl)benzene (0.4 mmol) as a monomer 2, the monomer A having a polymerizable substituent (0.1 mmol), terakis(triphenylphosphine)palladium (0.008 mmol), a 2 M aqueous solution of potassium carbonate (5.3 mL), Aliquat 336 (0.4 mmol), and anisole (4 mL) were introduced. In a nitrogen atmosphere, the mixture was irradiated with microwaves in the sealed container, and was heated and stirred for 2 hours at 90° C.

The reaction solution was poured into a methanol/water mixed solvent (9:1), and a polymer thus precipitated was separated by filtration. The precipitate thus obtained was filtered by suction and dissolved in toluene, and triphenylphosphine, polymer-bound, on styrene divinylbenzene copolymer (Strem Chemicals, Inc., 200 mg per 100 mg of the polymer) was added thereto. The resulting mixture was stirred overnight. After completion of stirring, the triphenylphosphine, polymer bound, on styrene-divinylbenzene copolymer and insoluble matter were removed by filtration, and the filtrate was concentrated with a rotary evaporator. The residue was dissolved in toluene and was reprecipitated from methanol-acetone (8:3). The precipitate thus generated was filtered by suction, and was washed with methanol-acetone (8:3). The precipitate thus obtained was dried in a vacuum, and a polymer was obtained. Thus, an oligomer A was obtained. The number average molecular weight of the oligomer A thus obtained was 4652 relative to polystyrene standards.

The reaction scheme of the present Synthesis Example is presented below.

[Chemical Formula 38]

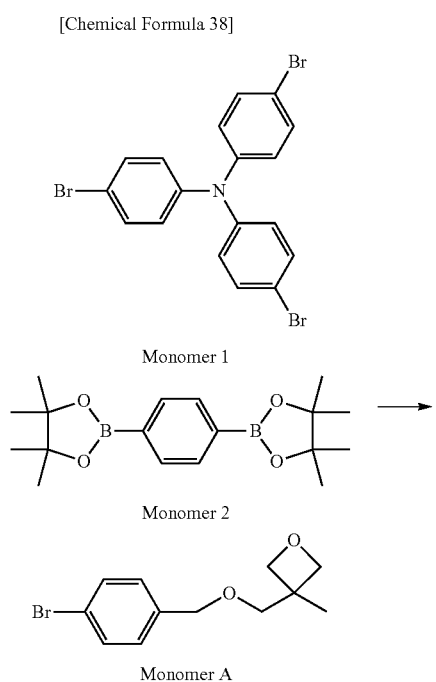

-continued

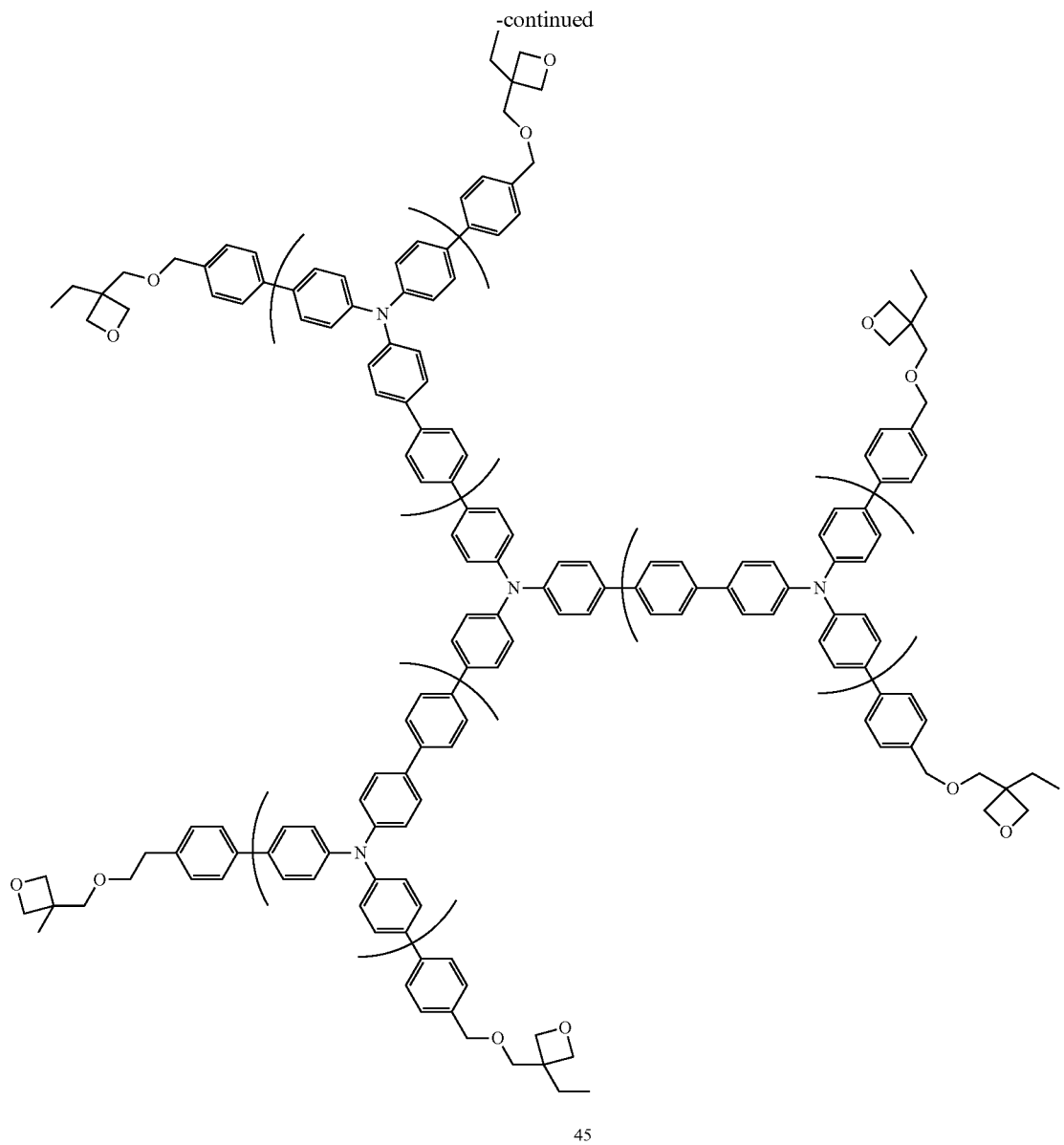

Oligomer Synthesis Example 2

Monomer 1 (0.6 mmol), monomer 3 (1.8 mmol), monomer 4 (0 mmol), monomer B (1.8 mmol), the structures of which are all shown below, and anisole (20 mL) were introduced into a three-necked round bottom flask, and a prepared Pd catalyst solution (2.5 mL) was further added thereto. The mixture was stirred for 30 minutes, and then a 10% aqueous solution of tetraethylammonium hydroxide (12 mL) was added to the mixture. All the solvents were used after being degassed by nitrogen bubbling for 30 minutes or longer. This mixture was heated to reflux for 2 hours. The entire operation to this stage was carried out under a nitrogen gas stream.

After completion of the reaction, the organic layer was washed with water, and the organic layer was poured into methanol-water (9:1). A precipitated thus generated was filtered by suction and was washed with methanol-water (9:1). A precipitate thus obtained was dissolved in toluene, and was reprecipitated from methanol. The precipitate thus obtained was filtered by suction and was dissolved in toluene. Triphenylphosphine, polymer-bound on styrene-divinylbenzene copolymer (Strem Chemicals, Inc., 200 mg per 100 mg of the polymer) was added to the solution, and the resulting mixture was stirred overnight. After completion of stirring, the triphenylphosphine, polymer-bound, on styrene-divinylbenzene copolymer and insoluble matter were removed by filtration, and the filtrate was concentrated with a rotary evaporator. The residue was dissolved in toluene, and then was reprecipitated from methanol-acetone (8:3). A precipitate thus generated was filtered by suction, and was washed with methanol-acetone (8:3). The precipitate thus obtained was dried in a vacuum, and thus a polymer was obtained. The molecular weight was measured by GPC (relative to polystyrene standards) using THF as an eluent. The molecular weight and yield are indicated in Table 1.

[Chemical Formula 39]

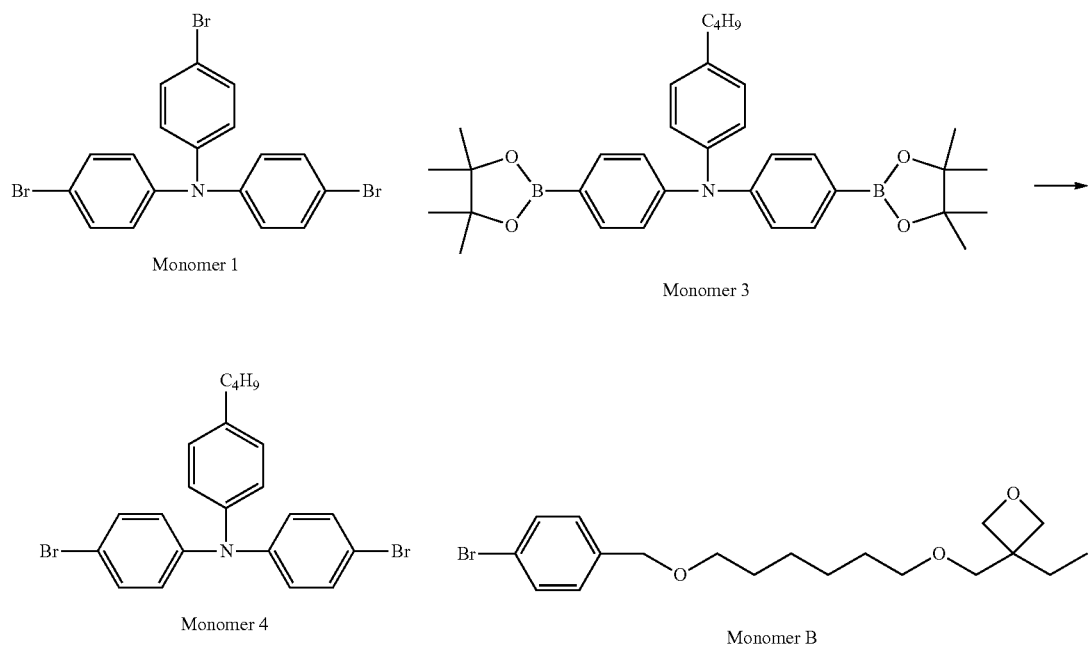

Oligomer Synthesis Example 3

An oligomer 3 was synthesized in the same manner as in Oligomer Synthesis Example 2, except that the monomers added were replaced by monomer 1 (0.4 mmol), monomer 3 (2.0 mmol), monomer 4 (0.8 mmol), and monomer B (1.2 mmol). The molecular weight and yield are indicated in Table 1.

Oligomer Synthesis Example 4

An oligomer 4 was synthesized in the same manner as in Oligomer Synthesis Example 2, except that the monomers added were replaced by monomer 1 (0.7 mmol), monomer 3 (1.75 mmol), and monomer B (1.4 mmol). The molecular weight and yield are indicated in Table 1.

Oligomer Synthesis Example 5

An oligomer 5 was synthesized in the same manner as in Oligomer Synthesis Example 2, except that the monomers added were replaced by monomer 1 (0.6 mmol), monomer 3 (1.8 mmol), monomer 4 (0.3 mmol), and monomer B (1.2 mmol). The molecular weight and yield are indicated in Table 1.

Oligomer Synthesis Example 6

An oligomer 6 was synthesized in the same manner as in Oligomer Synthesis Example 2, except that the monomers added were replaced by monomer 1 (0.9 mmol), monomer 3 (2.1 mmol), and monomer B (1.5 mmol). The molecular weight and yield are indicated in Table 1.

Oligomer Synthesis Example 7

An oligomer 7 was synthesized in the same manner as in Oligomer Synthesis Example 2, except that the monomers added were replaced by monomer 1 (0.75 mmol), monomer 3 (2.25 mmol), monomer 4 (0.5 mmol), and monomer B (1.25 mmol). The molecular weight and yield are indicated in Table 1.

TABLE 1

Monomer ratios, molecular weights and yields of synthesized oligomers

| | Monomer ratios Monomer 1:monomer 3:monomer 4:monomer B | Mw | Mn | yields (%) |
|---|---|---|---|---|
| Oligomer 2 | 1:3:0:3 | 13300 | 3500 | 62.3 |
| Oligomer 3 | 1:5:2:3 | 17000 | 4500 | 66.7 |
| Oligomer 4 | 2:5:0:4 | 31000 | 7800 | 72.2 |
| Oligomer 5 | 2:6:1:4 | 33000 | 9200 | 75 |
| Oligomer 6 | 3:7:0:5 | 105000 | 18000 | 65.9 |
| Oligomer 7 | 3:9:2:5 | 114000 | 23000 | 66.3 |

A higher ratio of the monomer 1, which is a monomer forming a branched structure, results in a higher molecular weight. In the oligomers 2 and 3, the yield decreased because the low molecular weight components were removed by reprecipitation. In the oligomers 6 and 7, a tendency of decreased yield was observed because components that were insoluble in toluene were produced.

Oligomer Synthesis Example 8

An oligomer 8 was synthesized in the same manner as in Oligomer Synthesis Example 2, except that the monomers added were replaced by monomer 5 shown below (0.7 mmol), monomer 3 shown below (1.75 mmol), and monomer B (1.4 mmol). The molecular weight measured by GPC (relative to polystyrene standards) was Mw=64000 and Mn=15900, and the yield was 56.9%.

[Chemical Formula 40]

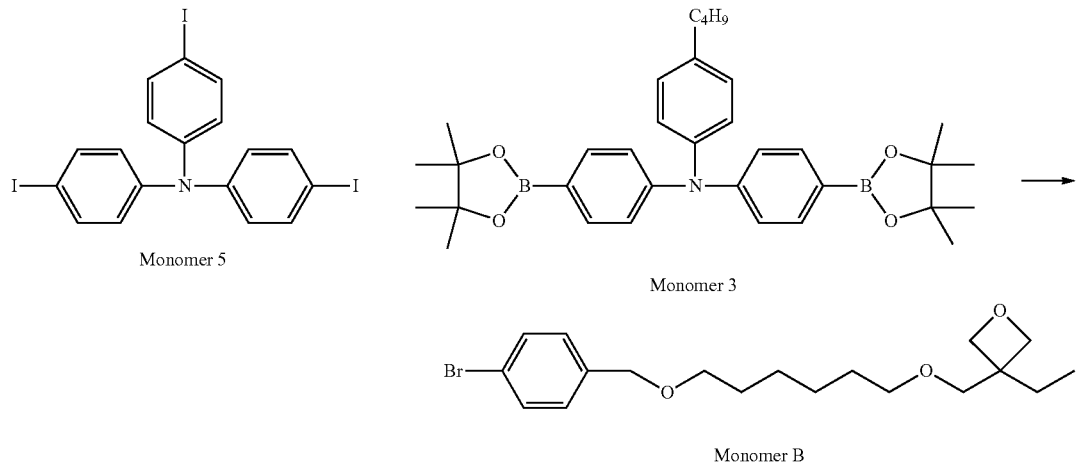

Oligomer Synthesis Example 9

An oligomer 9 was synthesized in the same manner as in Oligomer Synthesis Example 2, except that the monomers added were replaced by monomer 6 shown below (0.6 mmol), monomer 3 shown below (2.1 mmol), and monomer B (1.8 mmol). The molecular weight measured by GPC (relative to polystyrene standards) was Mw=18900 and Mn=4200, and the yield was 67.2%.

[Chemical Formula 41]

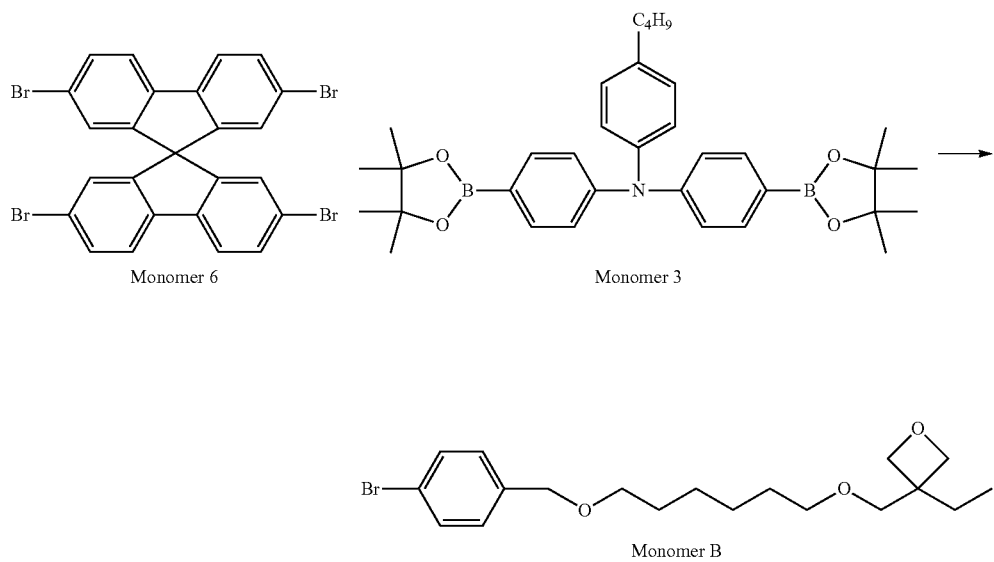

Oligomer Synthesis Example 10

An oligomer 10 was synthesized in the same manner as in Oligomer Synthesis Example 2, except that the monomers added were replaced by monomer 7 shown below (0.7 mmol), monomer 3 shown below (1.75 mmol), and monomer B (1.4 mmol). The molecular weight measured by GPC (relative to polystyrene standards) was Mw=12700 and Mn=3600, and the yield was 51.2%,

[Chemical Formula 42]

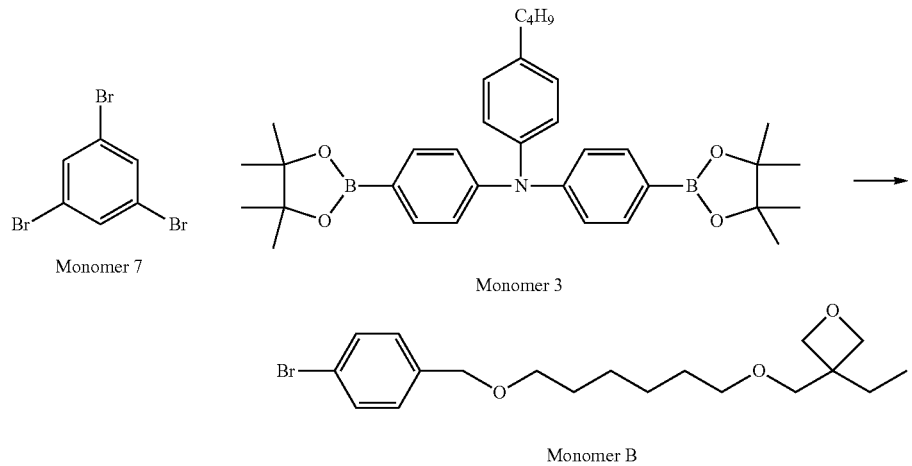

Oligomer Synthesis Example 11

An oligomer 11 was synthesized in the same manner as in Oligomer Synthesis Example 2, except that the monomers added were replaced by monomer 8 shown below (0.6 mmol), monomer 3 shown below (2.1 mmol), and monomer B (1.8 mmol). The molecular weight measured by GPC (relative to polystyrene standards) was Mw=14000 and Mn=2700, and the yield was 51.2%.

[Chemical Formula 43]

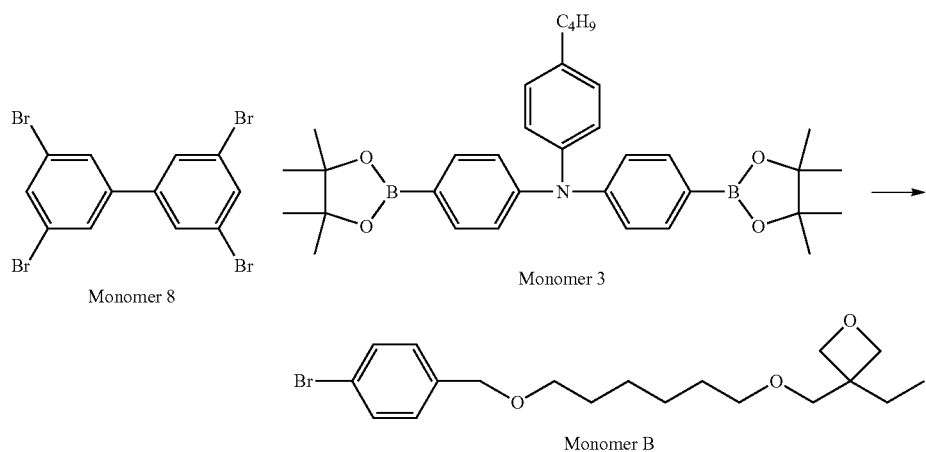

Oligomer Synthesis Example 12

An oligomer 12 was synthesized in the same manner as in Oligomer Synthesis Example 2, except that the monomers added were replaced by monomer 1 shown below (0.7 mmol), monomer 9 shown below (1.75 mmol), and monomer B (1.4 mmol). The molecular weight and yield are indicated in Table 2.

[Chemical Formula 44]

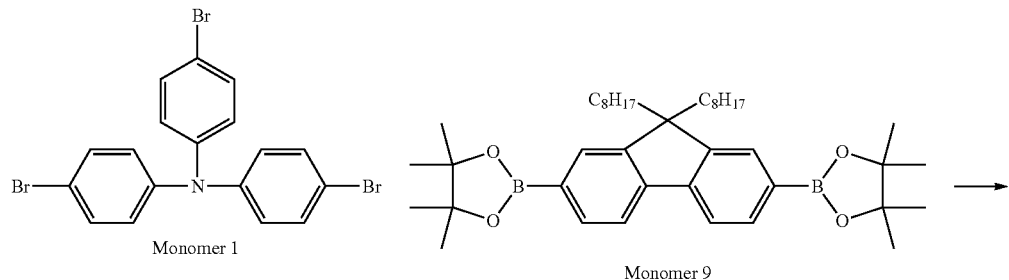

Monomer 1   Monomer 9

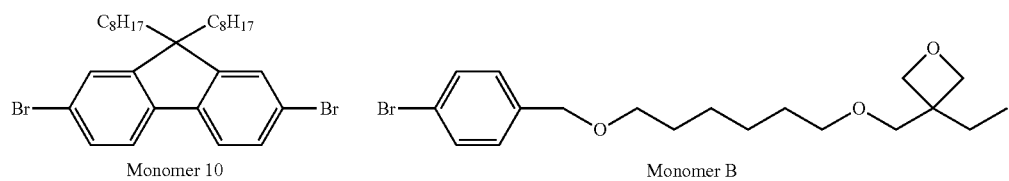

Monomer 10   Monomer B

Oligomer Synthesis Example 13

An oligomer 13 was synthesized in the same manner as in Oligomer Synthesis Example 2, except that the monomers added were replaced by monomer 1 (0.9 mmol), monomer 9 (2.1 mmol), and monomer B (1.5 mmol). The molecular weight and yield are indicated in Table 2.

Oligomer Synthesis Example 14

An oligomer 14 was synthesized in the same manner as in Oligomer Synthesis Example 2, except that the monomers added were replaced by monomer 1 (0.75 mmol), monomer 9 (2.25 mmol), monomer 10 (0.5 mmol), and monomer B (1.25 mmol). The molecular weight and yield are indicated in Table 2.

TABLE 2

Monomer ratios, molecular weights and yields of synthesized oligomers

| | Monomer ratio Monomer 1:monomer 9:monomer 10:monomer B | Mw | Mn | Yield (%) |
|---|---|---|---|---|
| Oligomer 12 | 2:5:0:4 | 68800 | 9200 | 67.1 |
| Oligomer 13 | 3:7:0:5 | 90400 | 15800 | 69.8 |
| Oligomer 14 | 3:9:2:5 | 92000 | 19800 | 66.6 |

Oligomer Synthesis Example 15

An oligomer 15 was synthesized in the same manner as in Oligomer Synthesis Example 2, except that the monomers added were replaced by monomer 7 shown below (0.7 mmol), monomer 11 shown below (1.75 mmol), and monomer B (1.4 mmol). The molecular weight measured by GPC (relative to polystyrene standards) was Mw=9100 and Mn=2500, and the yield was 42.7%.

[Chemical Formula 45]

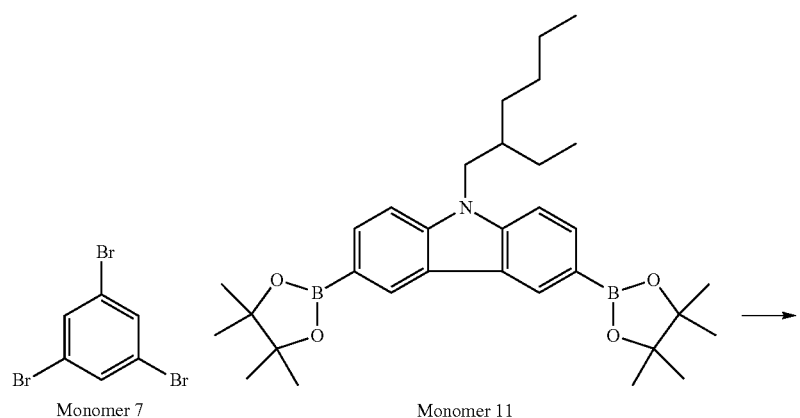

Monomer 7   Monomer 11

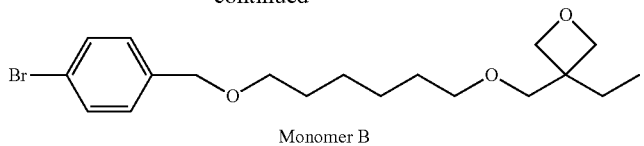

Monomer B

Oligomer Synthesis Example 16

An oligomer 11 was synthesized in the same manner as in Oligomer Synthesis Example 2, except that the monomer added were replaced by monomer 12 (0.6 mmol), monomer 13 (2.1 mmol), and monomer B (1.8 mmol). The molecular weight measured by GPC (relative to polystyrene standards) was Mw=17800 and Mn=4500, and the yield was 48.7%.

[Chemical Formula 46]

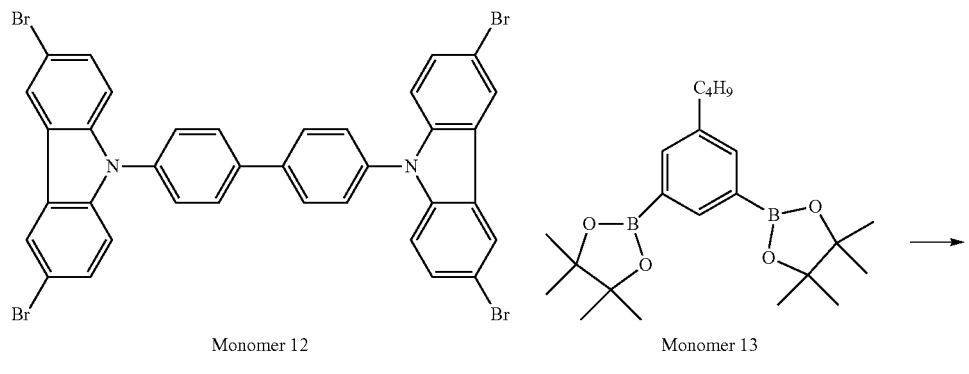

Monomer 12    Monomer 13

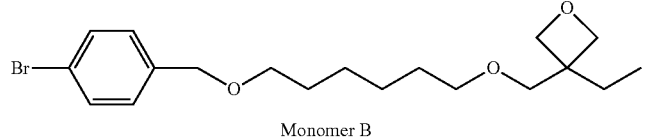

Monomer B

Oligomer Synthesis Example 17

An oligomer 17 was synthesized in the same manner as in Oligomer Synthesis Example 2, except that the monomers added were replaced by monomer 6 (0.75 mmol), monomer 9 (2.25 mmol), monomer 14 (0.5 mmol), and monomer B (1.25 mmol). The molecular weight measured by GPC (relative to polystyrene standards) was Mw=20700 and Mn=3300, and the yield was 56.1%.

[Chemical Formula 47]

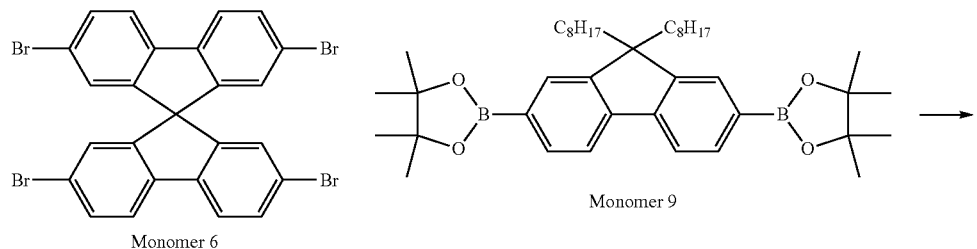

Monomer 6    Monomer 9

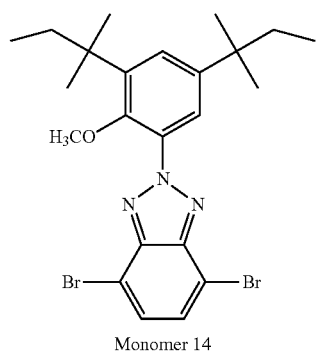

Monomer 14

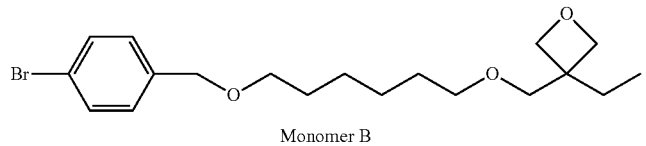

Monomer B

Oligomer Synthesis Example 18

In a three-necked round bottom flask, monomer 6 shown below (0.6 mmol), monomer 15 shown below (2.1 mmol), monomer B (1.9 mmol), and anisole (20 mL) were introduced, and a prepared Pd catalyst solution (5.0 mL) was further added thereto. The mixture was stirred for 30 minutes, and then NaOBu (5.0 mmol) was added. All the solvents were used after being degassed by nitrogen bubbling for 30 minutes or longer. This mixture was heated to reflux for 6 hours. The entire operation to this stage was carried out under a nitrogen gas stream. After completion of the reaction, the organic layer was washed with water, and the organic layer was poured into methanol-water (9:1). A precipitate thus generated was filtered by suction, and was washed with methanol-water (9:1). The precipitate thus obtained was dissolved in toluene, and was reprecipitated from methanol. The precipitate thus obtained was filtered by suction, and was dissolved in toluene. Triphenylphosphine, polymer-bound on styrene-divinylbenzene copolymer (Strem Chemicals, Inc., 200 mg per 100 mg of the polymer) was added to the solution, and the mixture was stirred overnight. After completion of stirring, the triphenylphosphine, polymer-bound on styrene-divinylbenzene copolymer and insoluble matter were removed by filtration, and the filtrate was concentrated with a rotary evaporator. The residue was dissolved in toluene, and then was reprecipitated from methanol-acetone (8:3). A precipitate thus generated was filtered by suction, and was washed with methanol-acetone (8:3). The precipitate thus obtained was dried in a vacuum. The molecular weight measured by GPC (relative to polystyrene standards) was Mw=23000 and Mn=4600, and the yield was 65.1%.

[Chemical Formula 48]

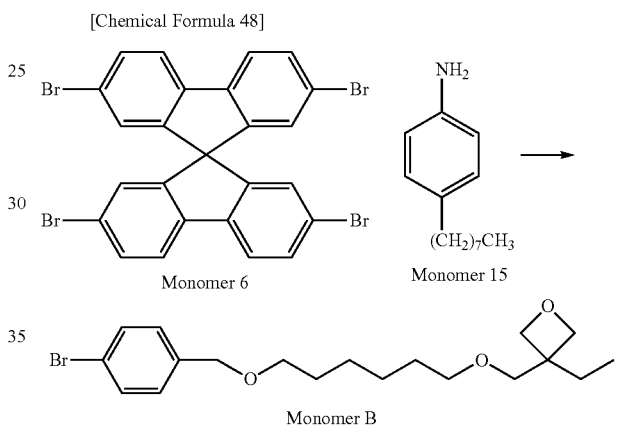

Comparative Oligomer 1: No Polymerizable Substituent

A comparative oligomer 1 was synthesized in the same manner as in Oligomer Synthesis Example 2, except that the monomers added were replaced by monomer 1 shown below (0.7 mmol), monomer 3 shown below (1.75 mmol), and monomer 16 shown below (1.4 mmol). The molecular weight measured by GPC (relative to polystyrene standards) was Mw=77000 and Mn=12400, and the yield was 65.5%.

[Chemical Formula 49]

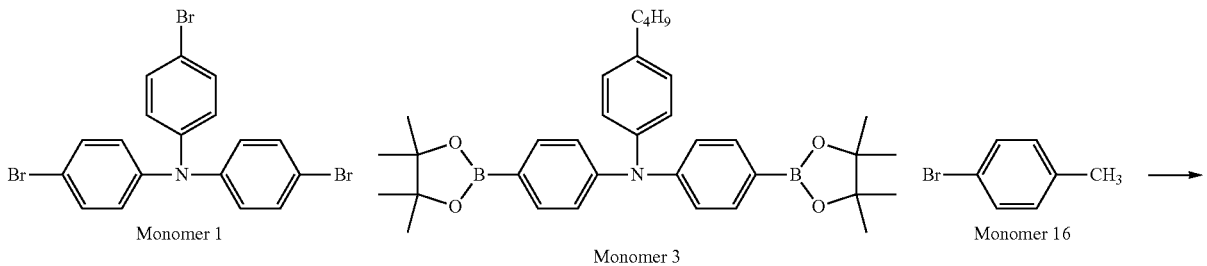

Comparative Example Oligomer 2: No Branched Structure 1

A comparative oligomer 2 was synthesized in the same manner as in Oligomer Synthesis Example 2, except that the monomers added were replaced by monomer 3 shown below (2.0 mmol), monomer 4 shown below (1.6 mmol), and monomer B shown below (0.8 mmol). The molecular weight measured by GPC (relative to polystyrene standards) was Mw=10200 and Mn=6700, and the yield was 60.8%.

[Chemical Formula 50]

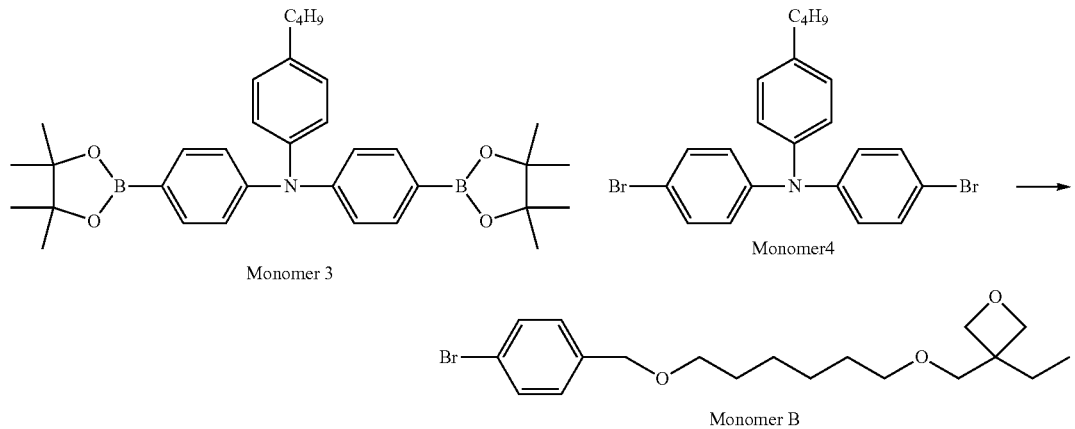

Monomer 3

Monomer 4

Monomer B

Comparative Example Oligomer 3: No Branched Structure 2

A comparative oligomer 3 was synthesized in the same manner as in Oligomer Synthesis Example 2, except that the monomers added were replaced by monomer 17 shown below (2.0 mmol), monomer 15 shown below (1.6 mmol), and monomer B shown below (0.8 mmol). The molecular weight measured by GPC (relative to polystyrene standards) was Mw=2800 and Mn=1600, and the yield was 13.2%.

[Chemical Formula 51]

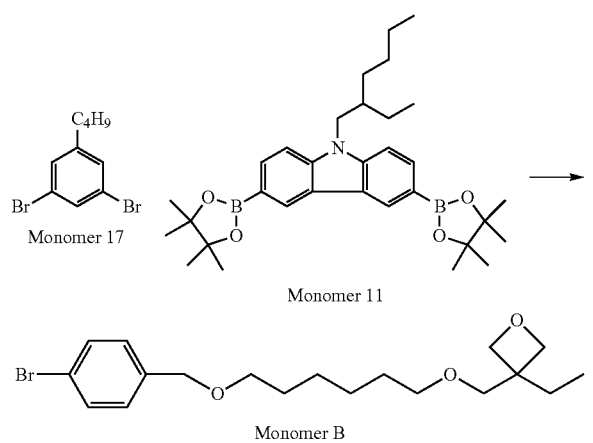

Monomer 17

Monomer 11

Monomer B (Evaluation of Polymerizability)

A coating solution prepared by mixing a toluene solution (400 µL) of an oligomer (4.5 mg) and a toluene solution (100 µL) of an ionic compound 1 (0.45 g) represented by the following formula, was spin coated on a quartz plate at 3000 rpm. Subsequently, the quartz plate was heated on a hot plate at 90° C. for 10 minutes, and thereby a polymerization reaction was carried out. After the heating, the quartz plate was immersed in toluene solvent for one minute, and the quartz plate was washed. The residual film ratio was measured from the ratio of the absorbance (Abs) values at the absorption maximum (λmax) in the UV-vis spectra obtained before and after the washing.

Residual film ratio (%)=Abs after washing/Abs before washing×100

[Chemical Formula 52]

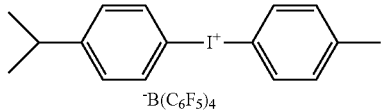

Ionic compound 1

TABLE 3

|  | Residual film ratio (%) |
| --- | --- |
| Oligomer 2 | 96.5 |
| Oligomer 3 | 95.3 |
| Oligomer 4 | 99.4 |
| Oligomer 5 | 100 |
| Oligomer 6 | 98.9 |
| Oligomer 7 | 96.3 |
| Oligomer 9 | 92.4 |
| Oligomer 12 | 98.6 |
| Oligomer 13 | 99.4 |
| Oligomer 14 | 99.4 |
| Oligomer 15 | 83.4 |
| Oligomer 18 | 86.6 |
| Comparative Oligomer 1 | 11.2 |
| Comparative Oligomer 2 | 23.1 |
| Comparative Oligomer 3 | 6.6 |

Since the oligomers according to the present invention are subjected to polymerization and insolubilization at low temperature, the oligomers are suitable for resin substrates which have low heat resistance and high thermal expansion. A multilayered structure can be produced on a resin substrate using the materials of the present invention, and thus high performance organic electronic elements can be manufactured at low cost.

Production of Organic EL Element: Example in which Hole Transport Layer is Polymerized Layer (Organic Thin Film)

Example 1

A PEDOT:PSS dispersion liquid (manufactured by Starck-Vtech, Ltd., AI4083 LVW142) was spin coated at 1500 min$^{-1}$ on a glass substrate having an ITO pattern with a width of 1.6 mm, and the glass substrate was heated to dry on a hot plate at 200° C. for 10 minutes in air. Thus, a hole injection layer (40 nm) was formed. The experiment thereafter was carried out in a dry nitrogen environment.

Subsequently, a coating solution prepared by mixing the oligomer A (4.5 mg) obtained as described above, a photoinitiator (0.13 mg) which was the ionic compound 1, and toluene (1.2 mL), was spin coated at 3000 min$^{-1}$ on the hole injection layer, and then the coating solution was irradiated with light (3 J/cm$^2$) using a metal halide lamp. The coating solution was cured by heating on a hot plate at 180° C. for 60 minutes, and thus a hole transport layer (40 nm) was formed.

Subsequently, the glass substrate thus obtained was transferred into a vacuum deposition apparatus, and CBP+Ir (piq)$_3$ (40 nm), BAlq (10 nm), Alq$_3$ (30 nm), LiF (film thickness 0.5 nm), and Al (film thickness 100 nm) were deposited in this order.

After electrodes were formed, the substrate was moved into a dry nitrogen environment without being exposed to the atmosphere. The substrate was bonded with a sealing glass, which was an alkali-free glass having a thickness of 0.7 mm and having a spot facing with a size of 0.4 mm, and an ITO substrate using a photocurable epoxy resin, and thereby the assembly was sealed. Thus, a polymer type organic EL element having a multilayer structure was produced. The subsequent operation was carried out at room temperature (25° C.) in the atmosphere.

ITO of this organic EL element was used as the positive electrode, while Al was used as the negative electrode, and a voltage was applied to the element. Red light emission was observed at 4 V, and the current efficiency at a luminance of 1000 cd/m$^2$ was 5.0 cd/A. Furthermore, the current voltage characteristics were measured with a micro current meter manufactured by Hewlett-Packard Development Company, L.P. 4140B, and the emission luminance was measured using a luminance meter manufactured by Photo Research, Inc., Pritchard 1980B.

Furthermore, in regard to the lifetime characteristics, the luminance was measured with BM-7 manufactured by Topcon Corporation, while a static current was applied, and the time taken by the luminance to decrease by half from the initial luminance (1000 cd/m$^2$) was measured, which was found to be 50 hours.

Comparative Example 1

An organic EL element was produced in the same manner as in Example 1, except that a hole transport layer was not formed. A voltage was applied to this organic EL element, and red light emission was observed at 4 V. The current efficiency at a luminance of 1000 cd/m$^2$ was 4.1 cd/A, and an efficiency which was 1.2 times higher was obtained in Example 1. Furthermore, the lifetime characteristics were measured, and the luminance decreased by half in 4 hours. Thus, Example 1 had a lifetime that was 13 times longer.

Example 2

Production of Organic EL Element: Example in which Hole Transport Layer is Polymerized Layer (Organic Thin Film) (Low Temperature Curing, Heat Treatment Only)

An element was produced in the same manner as in Example 1, except that a coating solution prepared by mixing the oligomer 13 (4.5 mg) obtained as described above, the initiator (the same as in Example 1) (0.45 mg), and toluene (1.2 mL) was spin coated at 3000 min$^{-1}$ on the hole injection layer, the coating solution was cured by heating on a hot plate at 120° C. for 10 minutes, and thus a hole transport layer (40 nm) was formed. ITO of this organic EL element was used as the positive electrode, while Al was used as the negative electrode, and a voltage was applied. Red light emission was observed at 4.0 V, and the current efficiency at a luminance of 1000 cd/m$^2$ was 5.0 cd/A. Further, the lifetime characteristics were measured, and the luminance decreased by half in 140 hours.

Production of Organic EL Element: Example in which Hole Injection Layer is Polymerized Layer Example 3

A coating solution prepared by mixing the oligomer A (4.5 mg) obtained as described above, the photoinitiator (the same as in Example 1) (0.13 mg), and toluene (500 µL) was spin coated at 3000 min$^{-1}$ on a glass substrate having an ITO pattern with a width of 1.6 mm. The operation thereafter was carried out in a dry nitrogen environment.

Subsequently, the coating solution was irradiated with light (3 J/cm) using a metal halide lamp, and was cured by heating on a hot plate for 15 minutes at 120° C. and for 60 minutes at 180° C. Thus, a hole injection layer (40 nm) was formed.

Next, sealing was carried out in the same manner as in Example 1, while depositing CBP+Ir(piq)$_3$ (40 nm), BAlq (10 nm), Alq$_3$ (30 nm), LiF (film thickness 0.5 nm), and Al (film thickness 100 nm) in this order.

ITO of this organic EL element was used as the positive electrode, while Al was used as the negative electrode, and a voltage was applied to the element. Red light emission was observed at 4 V, and the current efficiency at a luminance of 1000 cd/m$^2$ was 5.5 cd/A.

Furthermore, the time taken by the luminance to decrease by half from the initial luminance (1000 cd/m$^2$) was measured, which was found to be 80 hours.

The efficiency was 1.3 times, and the lifetime was 20 times, as compared with the Comparative Example 1 in which the hole injection layer was formed from a conventional PEDOT:PSS dispersion liquid.

Example 4

Production of Organic EL Element: Example in which Hole Injection Layer is Polymerized Layer (Low Temperature Curing, Heat Treatment Only)

The present Example was carried out in a dry nitrogen environment. An element was produced in the same manner as in Example 1, except that a coating solution prepared by mixing the oligomer 5 (4.5 mg) obtained as described above, the initiator (the same as in Example 1) (0.45 mg), and toluene (1.2 mL) was spin coated at 3000 min on a glass substrate having an ITO pattern with a width of 1.6 mm, the coating solution was cured by heating on a hot plate at 120° C. for 10 minutes, and thus a hole transport layer (40 nm) was formed. ITO of this organic EL element was used as the positive electrode, while Al was used as the negative electrode, and a voltage was applied to the element. Red light emission was observed at 3.5 V, and the current efficiency at a luminance of 1000 cd/m² was 6.0 cd/A. Furthermore, the lifetime characteristics were measured, and the luminance decreased by half in 250 hours. From a comparison of Examples 1 to 4 with Comparative Example 1, it is understood that the organic EL elements of the Examples were superior to the Comparative Example in terms of the emission efficiency and the emission lifetime. In this regard, it is speculated that when the polymerized layer according to the present invention is applied as a hole injection layer or a hole transport layer, holes are efficiently injected and transported to the light emitting layer, and therefore, the emission efficiency is enhanced, while the emission lifetime is extended.

Production of White Organic EL Element and Lighting Device

Example 51

A hole injection layer (40 nm) was formed in the same manner as in Example 1 using a PEDOT:PSS dispersion liquid, while a polymerized layer (hole transport layer) was formed in the same manner as in Example 1 using the oligomer A and the photoinitiator (the same as in Example 1).

Subsequently, a mixture of CDBP (15 mg), FIr(pic) (0.9 mg), Ir(ppy)3 (0.9 mg), (btp)2Ir(acac) (1.2 mg) and dichlorobenzene (0.5 mL) was spin coated at 3000 rpm under nitrogen, and subsequently the mixture was dried for 5 minutes at 80° C. Thus, a light emitting layer (40 nm) was formed. Furthermore, BAlq (10 nm), Alq₃ (30 nm), LiF (film thickness 0.5 am), and Al (film thickness 100 nm) were deposited in this order in the same manner as in Example 1, and the assembly was subjected to sealing. Thus, an organic EL element and lighting device was produced.

A voltage was applied to this white organic EL element and lighting device, and uniform white light emission was observed.

Comparative Example 2

A white organic EL element and lighting device was produce in the same manner as in Example 5, except that the polymerized layer was not formed.

A voltage was applied to this white organic EL element and lighting device. White light emission was observed, but the emission lifetime was only one-fourth of that of Example 5.

From a comparison between Example 5 and Comparative Example 2, it is understood that when the polymerized layer according to the present invention was inserted, a white organic EL element and a lighting device can be stably driven.

Example 6

(Evaluation of Polymerizability)

A coating solution prepared by mixing a toluene solution (400 μL) of compound 1 (4.5 mg) shown below and an ethyl acetate solution (100 μL) of ionic compound 1 (0.45 g) shown below, was spin coated on a quartz plate at 3000 rpm. Subsequently, the quartz plate was heated on a hot plate at 120° C. for 10 minutes, and thus a polymerization reaction was carried out. After the heating, the quartz plate was immersed in a mixed solvent of toluene:ethyl acetate (4:1) for one minute, and the quartz plate was washed. The residual film ratio was measured from the ratio of the absorbance (Abs) values at the absorption maximum (λmax) in the UV-vis spectra obtained before and after washing.

Before washing: λmax=383 nm, Abs=0.229
After washing: λmax=383 nm, Abs=0.228

Residual film ratio (%)=Abs after washing/Abs before washing×100=0.228/0.229×100=99.6

[Chemical Formula 53]

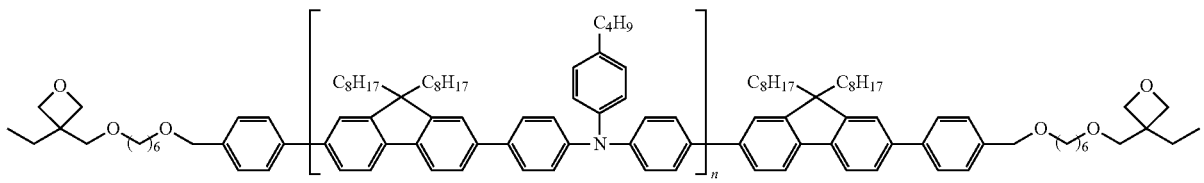

Compound 1 (Mw=8,200, Mw/Mn=1.44, n represents an integer of 1 or greater)

[Chemical Formula 54]

Ionic compound 1

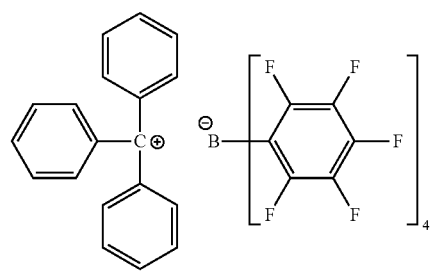

Example 7

The same procedure as in Example 6 was carried out, except that the heating temperature on the hot plate was set to 180° C., and the residual film ratio was measured.

Example 8

The same procedure as in Example 6 was carried out, except that the following ionic compound 2 was used instead of the ionic compound 1, and the residual film ratio was measured.

[Chemical Formula 55]

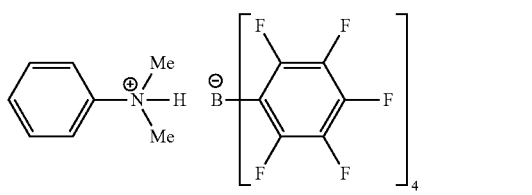

Ionic compound 2

Example 91

The same procedure as in Example 8 was carried out, except that the heating temperature on the hot plate was set to 180° C., and the residual film ratio was measured.

Comparative Example 3

The same procedure as in Example 6 was carried out, except that the following ionic compound 3 was used instead of the ionic compound 1, and the residual film ratio was measured.

[Chemical Formula 56]

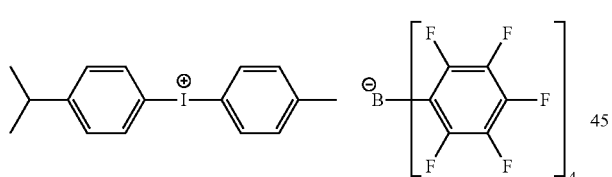

Ionic compound 3

Comparative Example 4

The same procedure as in Comparative Example 3 was carried out, except that the heating temperature on the hot plate was set to 180° C., and the residual film ratio was measured.

Comparative Example 5

The same procedure as in Example 6 was carried out, except that the following ionic compound 4 was used instead of the ionic compound 1, and the residual film ratio was measured.

[Chemical Formula 57]

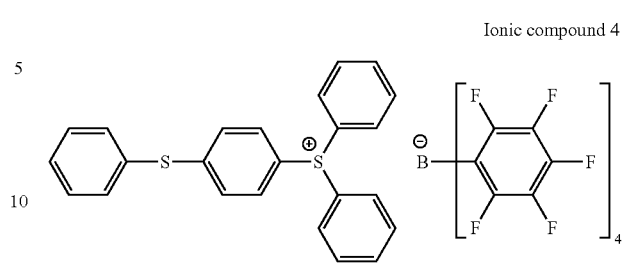

Ionic compound 4

Comparative Example 6

The same procedure as in Comparative Example 5 was carried out, except that the heating temperature on the hot plate was set to 180° C., and the residual film ratio was measured.

Comparative Example 7

The same procedure as in Example 6 was carried out, except that the following ionic compound 5 was used instead of the ionic compound 1, and the residual film ratio was measured.

[Chemical Formula 58]

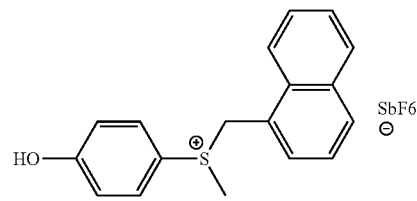

Ionic compound 5

Comparative Example 81

The same procedure as in Comparative Example 7 was carried out, except that the heating temperature on the hot plate was set to 180° C., and the residual film ratio was measured. The results obtained by using the various ionic compounds and evaluating the residual film ratios at 120° C. and 180° C. are summarized in Table 4. It is understood that when the ionic compounds according to the present invention were used, the effect is underway at low temperature, as compared with the case of using conventional onium salt type curing agents.

TABLE 4

| Item | Residual film ratio after 120° C.-10 min (%) | Residual film ratio after 180° C.-10 min (%) |
| --- | --- | --- |
| Example 6 | 99.6 | 99.6 |
| Example 7 | 99.6 | 99.6 |
| Example 8 | 99.1 | 99.6 |
| Example 9 | 99.1 | 99.6 |
| Comparative Example 3 | 5.2 | 99.1 |
| Comparative Example 4 | 5.2 | 99.1 |
| Comparative Example 5 | 0.9 | 12.3 |

TABLE 4-continued

| Item | Residual film ratio after 120° C.-10 min (%) | Residual film ratio after 180° C.-10 min (%) |
|---|---|---|
| Comparative Example 6 | 0.9 | 12.3 |
| Comparative Example 7 | 65.8 | 95.0 |
| Comparative Example 8 | 65.8 | 95.0 |

Example 10

A coating solution prepared by mixing a toluene solution (400 μL) of the compound 1 (4.5 mg) and an ethyl acetate solution (100 μL) of the ionic compound 1 (0.45 g), was spin coated at 3000 rpm on a glass substrate having an ITO pattern with a width of 1.6 mm. The subsequent experiment was carried out in a dry nitrogen environment. Subsequently, the coating solution was cured by heating on a hot plate at 180° C. for 10 minutes, and thus a hole injection layer (40 nm) was formed.

Subsequently, a toluene solution (1.0% by mass) of a mixture composed of polymer 1 (75 parts by mass), polymer 2 (20 parts by mass) and polymer 3 (5 parts by mass), which are represented by the following structural formulas, was spin coated at 3000 rpm on the hole injection layer. The coating solution was heated on a hot plate at 80° C. for 5 minutes, and thus a polymer light emitting layer (thickness 80 nm) was formed. The hole injection layer and the light emitting layer could be laminated without dissolving each other.

[Chemical Formula 59]

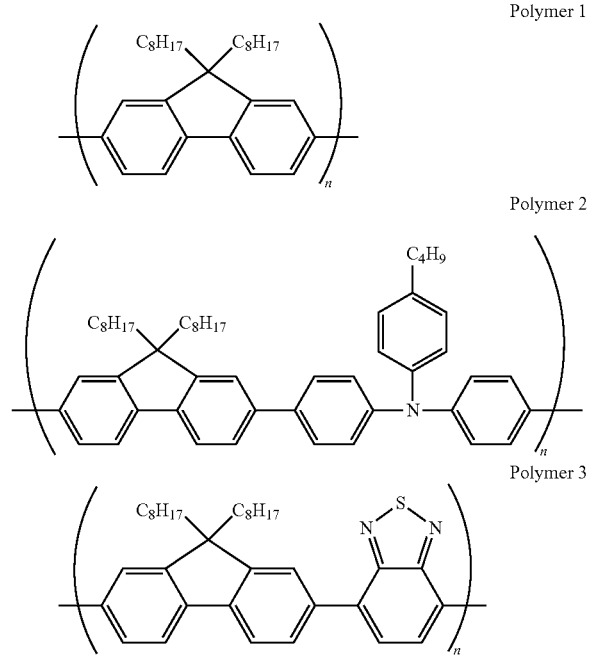

(wherein n represents an integer of 1 or greater.)

Furthermore, the glass substrate thus obtained was transferred into a vacuum deposition apparatus, and electrodes were formed on the light emitting layer using Ba (film thickness 3 nm) and Al (film thickness 100 nm) in this order.

After the formation of electrodes, the substrate was moved into a dry nitrogen environment without being exposed to the atmosphere, and the substrate was bonded with a sealing glass, which was an alkali-free glass having a thickness of 0.7 mm and having a spot facing with a size of 0.4 mm, and an ITO-patterned glass substrate using a photocurable epoxy resin, and thereby the assembly was sealed. Thus, a polymer type organic EL element having a multilayer structure was produced. The subsequent experiment was carried out at room temperature (25° C.) in the atmosphere.

ITO of this organic EL element was used as the positive electrode, while Al was used as the negative electrode, and a voltage was applied to the element. Green light emission was observed at about 3 V, the current efficiency at a luminance of 5000 cd/m$^2$ was 9.1 cd/A, and the driving voltage was 4.9 V. Furthermore, in regard to the lifetime characteristics, a static current at a current density of 13 mA/cm$^2$ was applied, and the luminance half-life was measured, which was found to be 340 hours.

Comparative Example 91

A polymer type organic EL element having a multilayer structure was produced in the same manner as in Example 10, except that the ionic compound 1 was changed to the ionic compound 3. ITO of this organic EL element was used as the positive electrode, while Al was used as the negative electrode, and a voltage was applied to the element. Green light emission was observed at about 3.5 V. The current efficiency at a luminance of 5000 cd/m$^2$ was 6.9 cd/A, and the driving voltage was 5.9 V. Furthermore, in regard to the lifetime characteristics, a static current at a current density of 14 mA/cm$^2$ was applied, and the luminance half-life was measured, which was found to be 70 hours. When compared with Example 10, the driving voltage was higher, and the luminance half-life was also shorter to a large extent.

DESCRIPTION OF REFERENCE NUMERALS

1 Light emitting layer
2 Anode
3 Hole injection layer
4 Cathode
5 Electron injection layer
6 Hole transport layer
7 Electron transport layer
8 Substrate

The invention claimed is:

1. An organic electronic material comprising a polymer or oligomer which has a structure branching in three or more directions, has at least one polymerizable substituent, has a number average molecular weight of 3,000 or more, and has a partial structure represented by one of the following formulas (E) and (G):

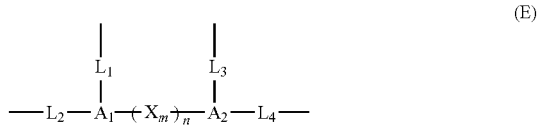

(E)

-continued

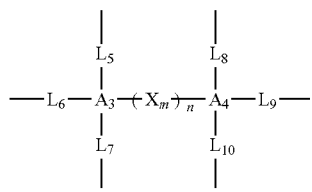
(G)

wherein A1 and A2 each independently represents a trivalent linking group represented by formula (1), (2), (5), or (6) shown below; A3 and A4 each independently represents a tetravalent linking group represented by formula (3), (4), (7), (8), (9), or (10) shown below; L1 to L10 each independently represents a divalent linking group; Xm represents a divalent linking group; n represents an integer of 1 or greater; and m represents 1 or an integer from 1 to n; with a proviso that if the polymer or oligomer has a partial structure represented by formula (E) and A1 and A2 each independently represents a trivalent linking group represented by formula (1), the polymer or oligomer comprises a structure containing one or more selected from an aromatic amine moiety, a carbazole moiety, and a thiophene moiety,

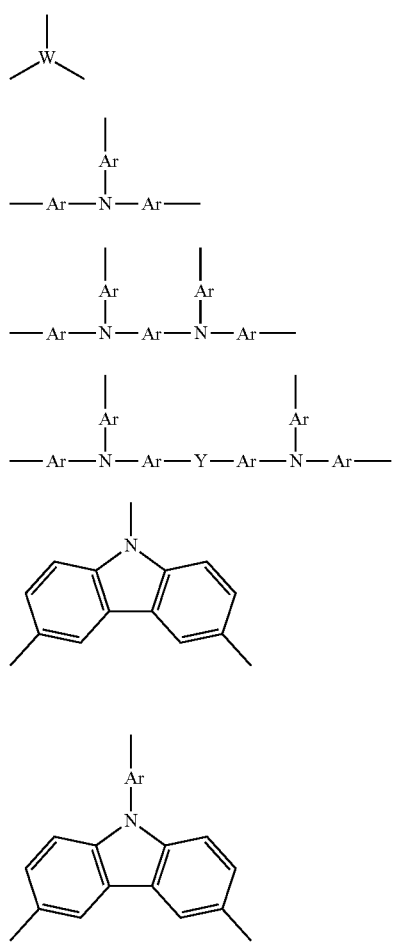

-continued

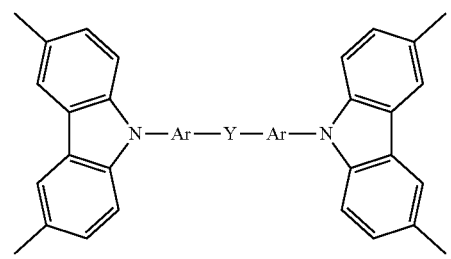
(7)

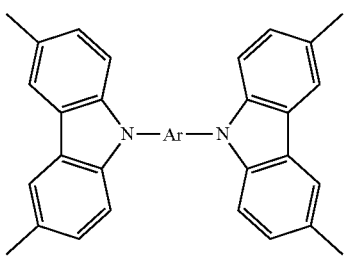
(8)

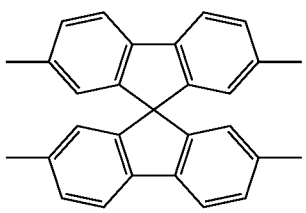
(9)

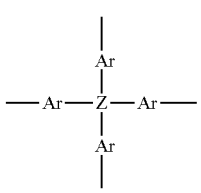
(10)

wherein each Ar independently represents a divalent linking group, each representing an optionally substituted arylene group or heteroarylene group having 2 to 30 carbon atoms; W represents a trivalent linking group obtained by excluding a hydrogen atom from an optionally substituted arylene group or heteroarylene group having 2 to 30 carbon atoms; each Y independently represent a divalent linking group; and Z represents any one of a carbon atom, a silicon atom and a phosphorus atom.

2. The organic electronic material according to claim 1, wherein Y in the formula (4) or (7) is a divalent linking group represented by one of the following formulas:

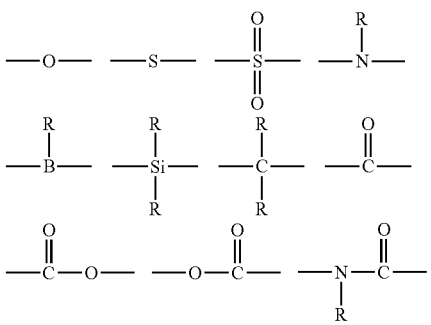

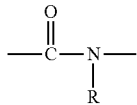

wherein each R independently a hydrogen atom, an optionally substituted, linear, cyclic or branched alkyl group having 1 to 22 carbon atoms, or an optionally substituted aryl group or heteroaryl group having 2 to 30 carbon atoms.

3. The organic electronic material according to claim 1, wherein the polymer or oligomer contains at least one charge transporting group.

4. The organic electronic material according to claim 1, wherein the polymerizable substituent is introduced into an end of the polymer or oligomer.

5. The organic electronic material according to claim 1, wherein three or more of the polymerizable substituents are introduced into one molecule of the polymer or oligomer.

6. The organic electronic material according to claim 1, wherein the polymerizable substituent is any one of an oxetane group, an epoxy group, a vinyl group, an acrylate group and a methacrylate group.

7. The organic electronic material according to claim 1, wherein the number average molecular weight of the polymer or oligomer is from 3,000 to 1,000,000.

8. The organic electronic material according to claim 1, wherein the polydispersity of the polymer or oligomer is greater than 1.0.

9. The organic electronic material according to claim 1, further comprising a dopant.

10. The organic electronic material according to claim 1, further comprising a polymerization initiator.

11. The organic electronic material according to claim 10, wherein the polymerization initiator is a thermal polymerization initiator.

12. The organic electronic material according to claim 10, wherein the polymerization initiator is an ionic compound.

13. The organic electronic material according to claim 11, wherein the polymerization initiator also functions as a dopant.

14. An ink composition comprising the organic electronic material according to claim 1.

15. An organic thin film produced using the organic electronic material according to claim 1.

16. An organic electronic element comprising the organic thin film according to claim 15.

17. An organic electroluminescent element comprising the organic thin film according to claim 15.

18. A display element comprising the organic electroluminescent element according to claim 17.

19. A lighting device comprising the organic electroluminescent element according to claim 17.

20. A display device comprising the lighting device according to claim 19, and a liquid crystal element as a display unit.

21. An organic thin film produced using the ink composition according to claim 14.

22. The organic electronic material according to claim 6, wherein the polymerizable substituent is linked to a main chain of the polymer or oligomer via an alkyl chain comprising an ether bond and having 1 to 8 carbon atoms.

23. The organic electronic material according to claim 1, wherein L1 to L10 each independently represents a divalent linking group represented by any of the following formulae:

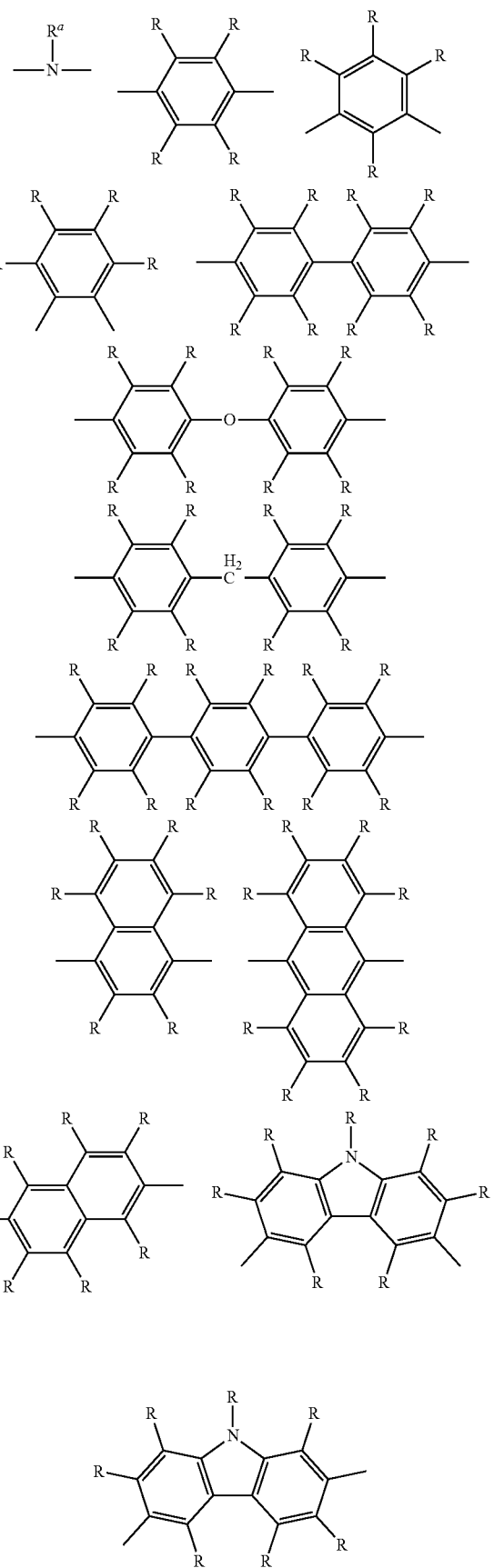

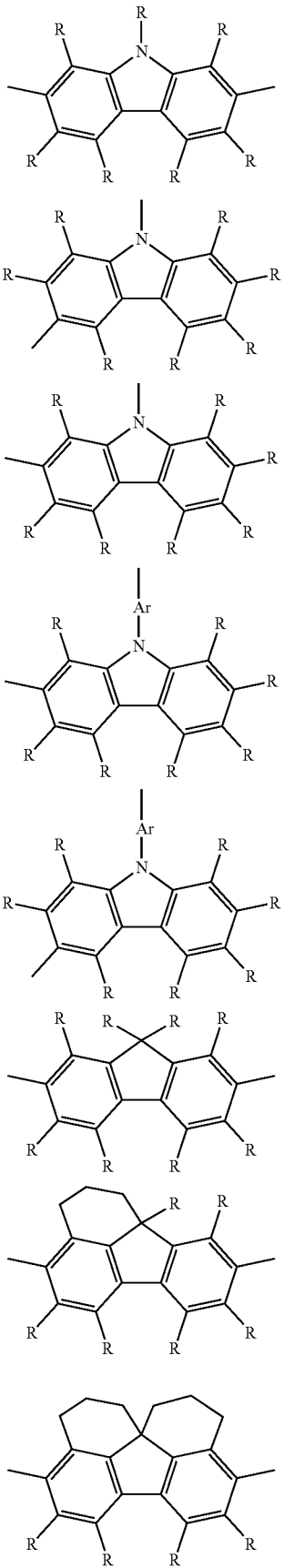
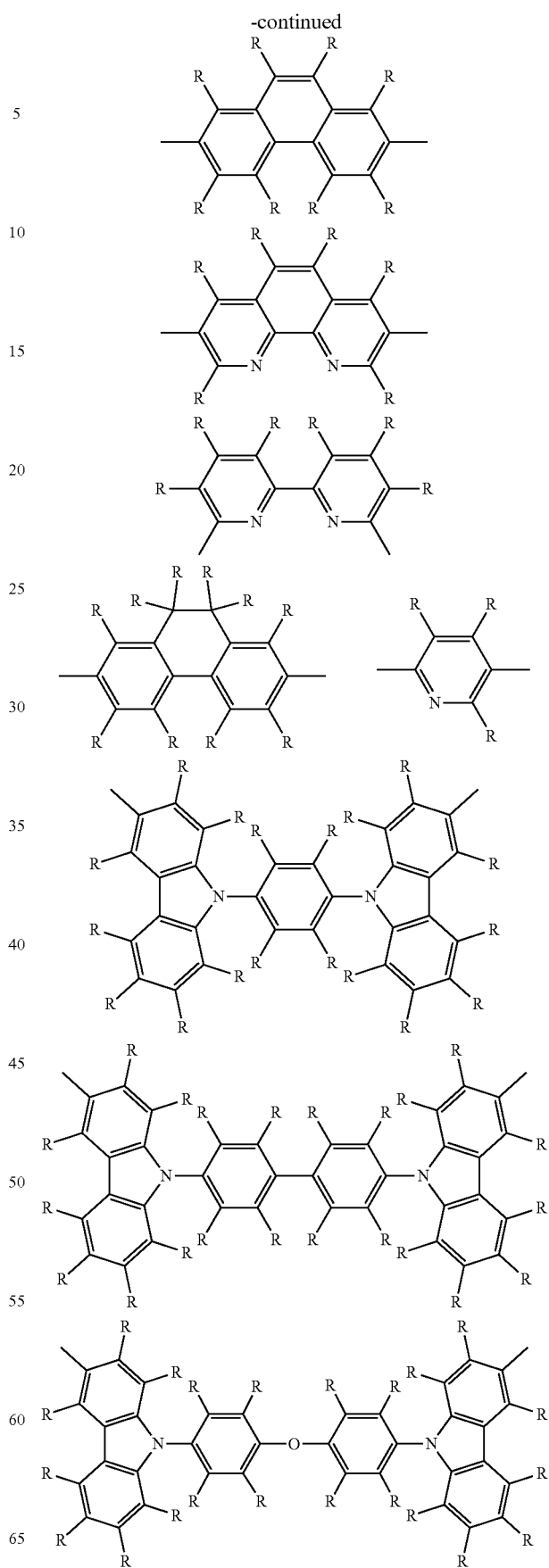

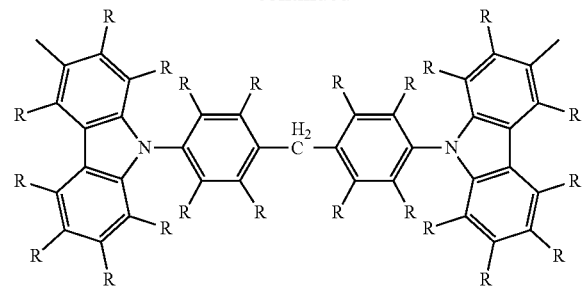
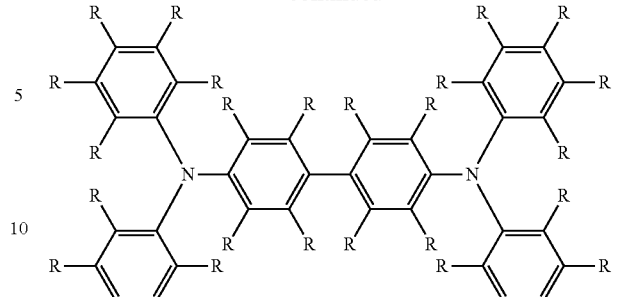
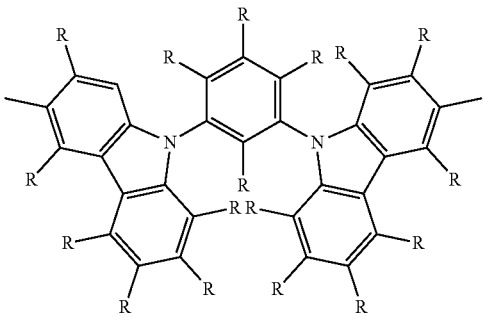
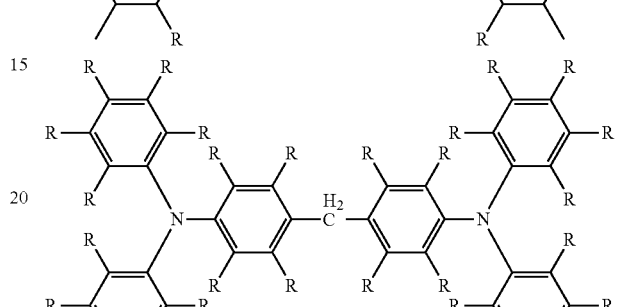
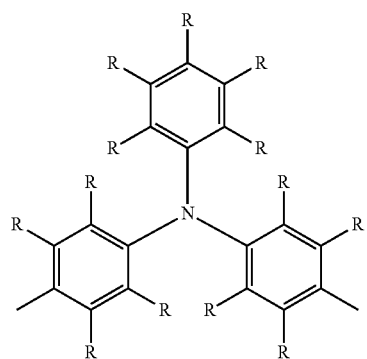
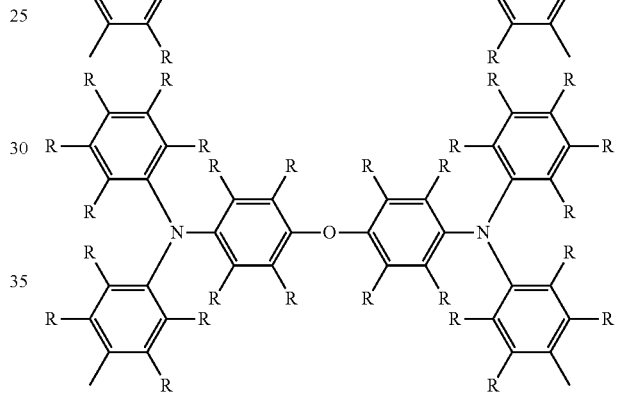
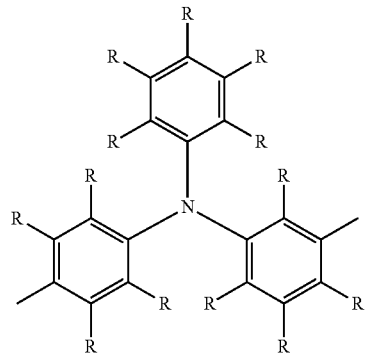
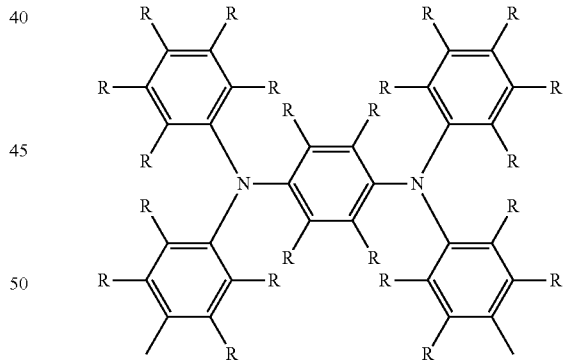
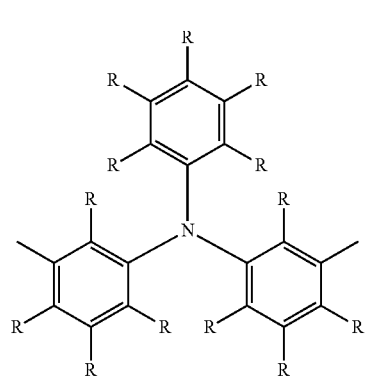
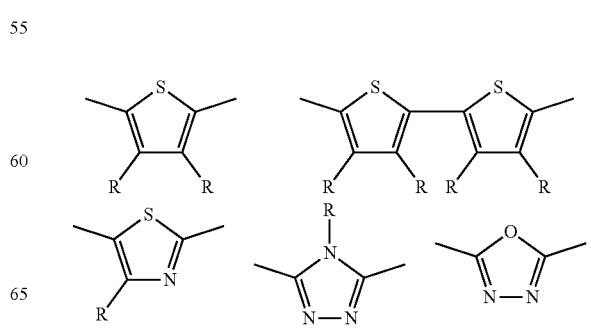

-continued

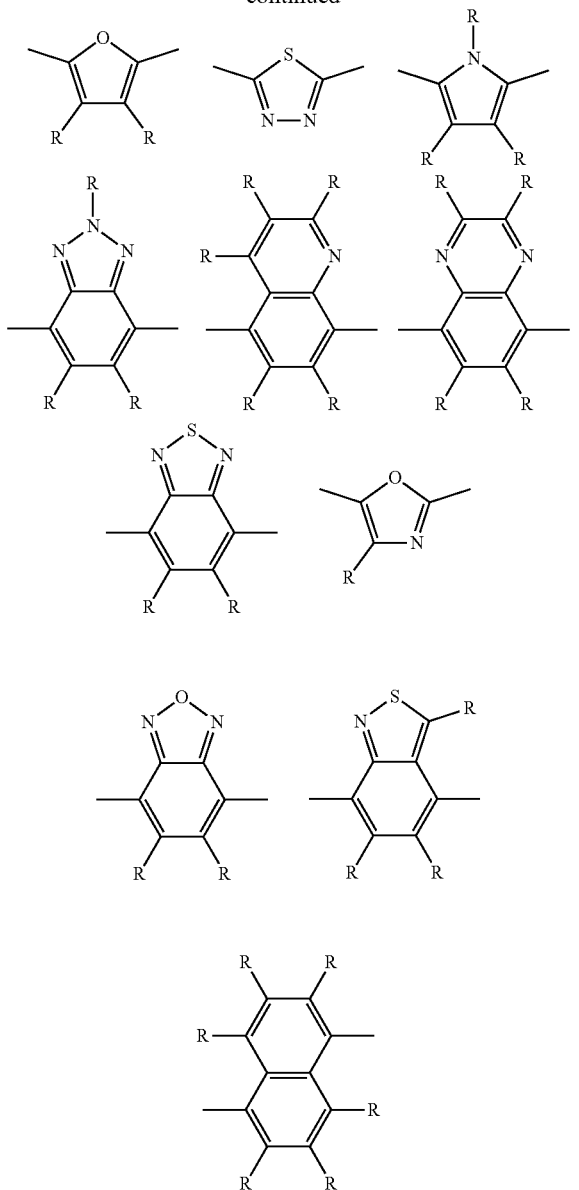

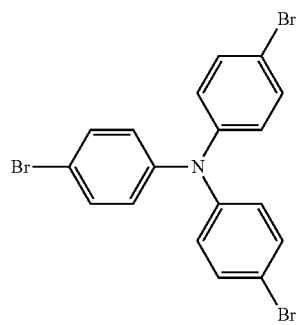

Monomer 1

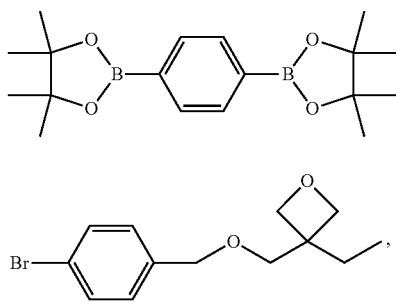

Monomer 2

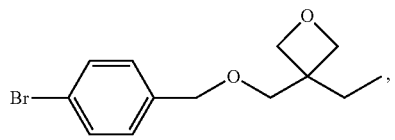

Monomer A (ii) a compound formed by a reaction including the following monomer 1, monomer 3, monomer 4, and monomer B as reactants:

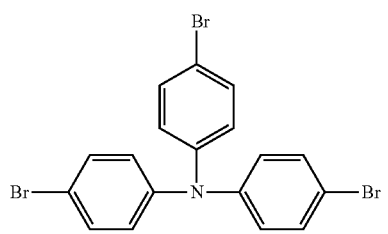

Monomer 1

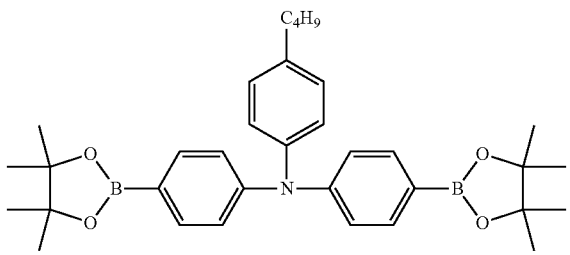

Monomer 3

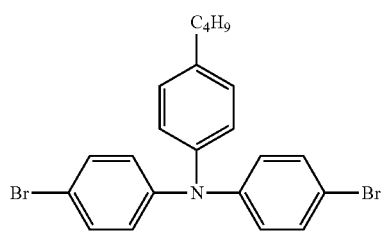

Monomer 4 wherein Ra represents a hydrogen atom, an optionally substituted linear, cyclic or branched alkyl group having 1 to 22 carbon atoms, or an optionally substituted aryl group or heteroaryl group having 2 to 30 carbon atoms; each R independently represents a hydrogen atom, a halogen atom, a linear, cyclic or branched alkyl group having 1 to 22 carbon atoms, an alkenyl group, an alkynyl group, an alkoxy group, or an optionally substituted aryl group or heteroaryl group having 2 to 30 carbon atoms; adjacent R's may be joined to form a ring; and each Ar independently represents an optionally substituted arylene group or heteroarylene group having 2 to 30 carbon atoms.

24. The organic electronic material according to claim 1, wherein the polymer or oligomer comprises at least one of:

(i) a compound formed by a reaction including the following monomer 1, monomer 2, and monomer A as reactants:

Monomer B
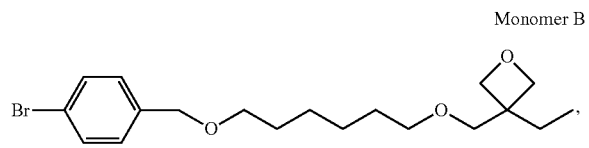

(iii) a compound formed by a reaction including the following monomer 1, monomer 3, and monomer B as reactants:

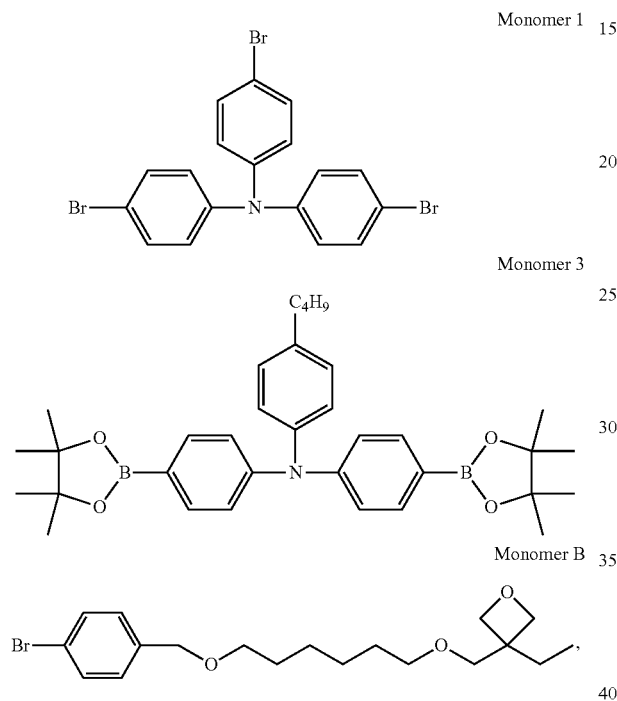

Monomer 1

Monomer 3

Monomer B (iv) a compound formed by a reaction including the following monomer 5, monomer 3, and monomer B as reactants:

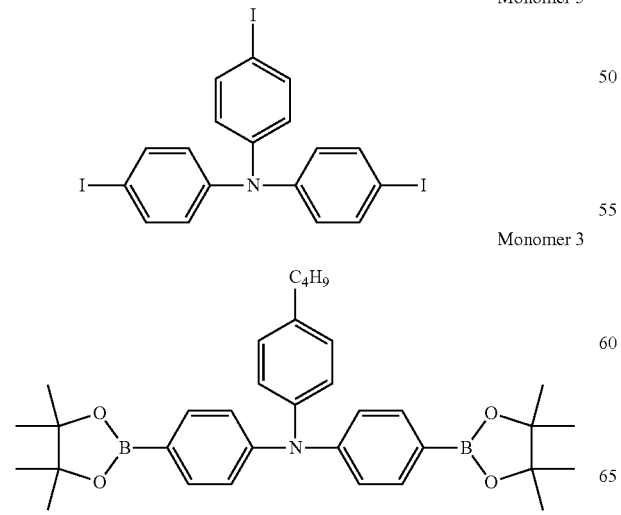

Monomer 5

Monomer 3

Monomer B
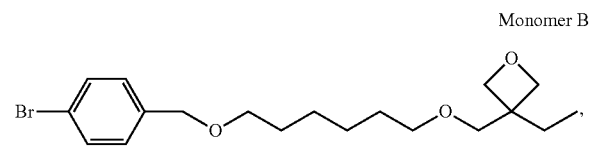

(v) a compound formed by a reaction including the following monomer 6, monomer 3, and monomer B as reactants:

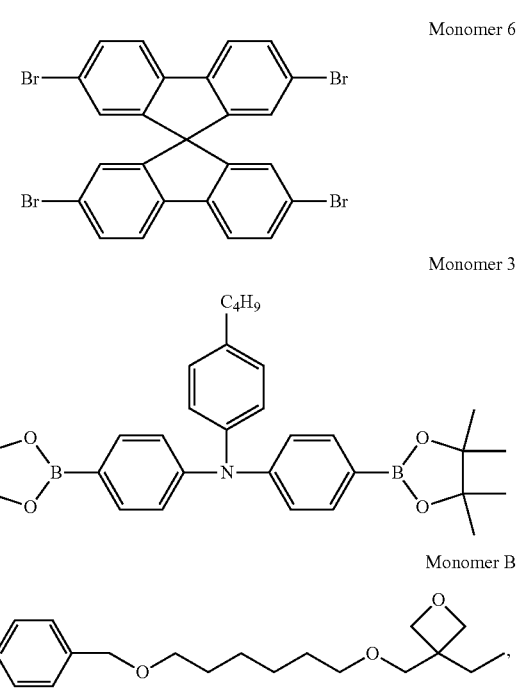

Monomer 6

Monomer 3

Monomer B (vi) a compound formed by a reaction including the following monomer 7, monomer 3, and monomer B as reactants:

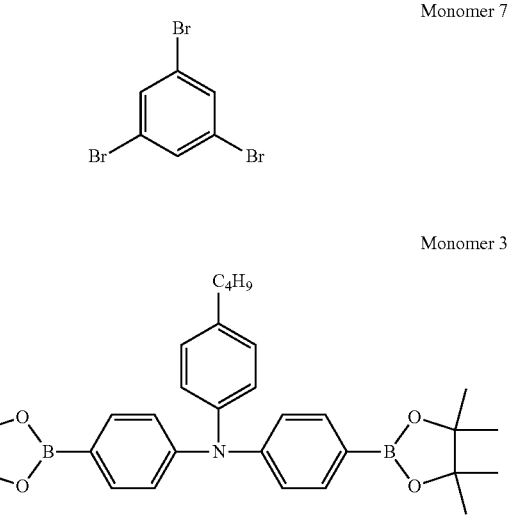

Monomer 7

Monomer 3

115

-continued

Monomer B

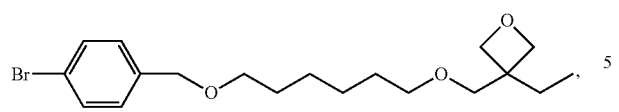

(vii) a compound formed by a reaction including the following monomer 8, monomer 3, and monomer B as reactants:

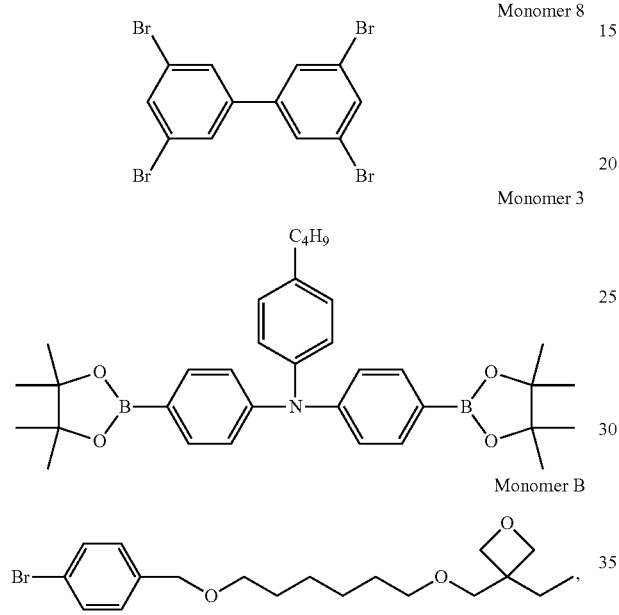

Monomer 8

Monomer 3

Monomer B (viii) a compound formed by a reaction including the following monomer 1, monomer 9, and monomer B as reactants:

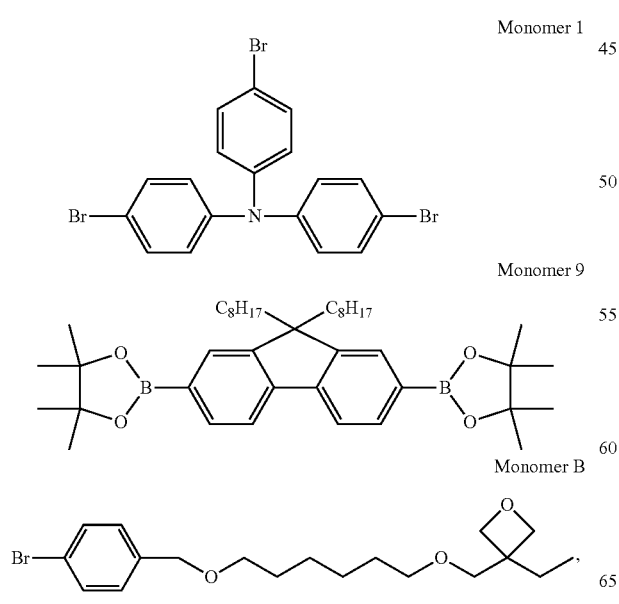

Monomer 1

Monomer 9

Monomer B

116

(ix) a compound formed by a reaction including the following monomer 1, monomer 9, monomer 10, and monomer B as reactants:

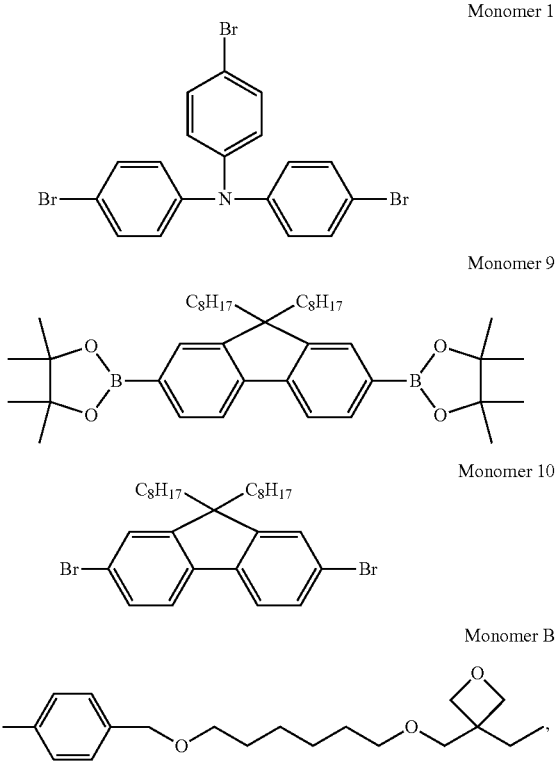

Monomer 1

Monomer 9

Monomer 10

Monomer B (x) a compound formed by a reaction including the following monomer 7, monomer 11, and monomer B as reactants:

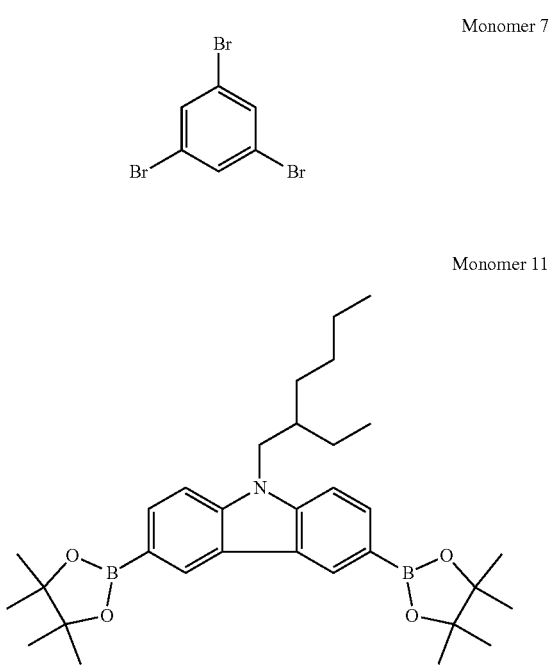

Monomer 7

Monomer 11

Monomer B

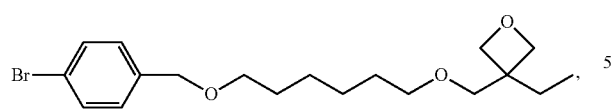

(xi) a compound formed by a reaction including the following monomer 12, monomer 13, and monomer B as reactants:

Monomer 12

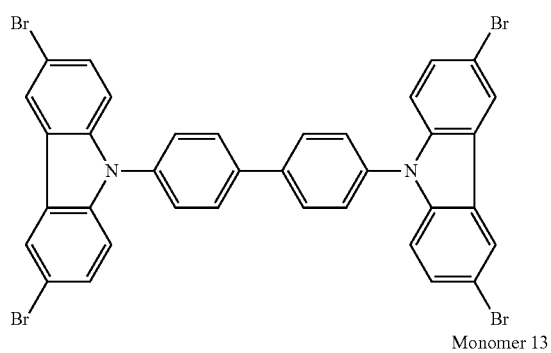

Monomer 13

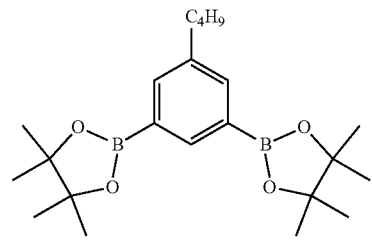

Monomer B

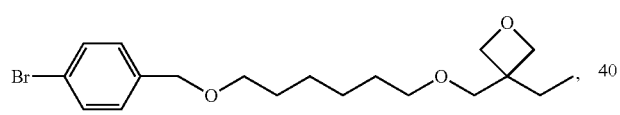

(xii) a compound formed by a reaction including the following monomer 6, monomer 9, monomer 14, and monomer B as reactants:

Monomer 6

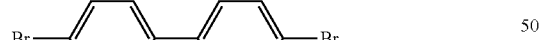

Monomer 9

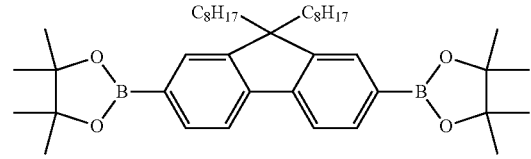

Monomer 14

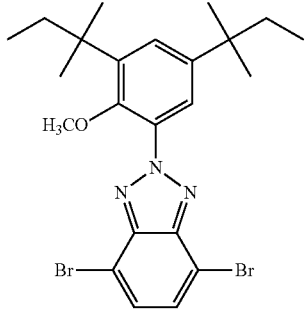

Monomer B

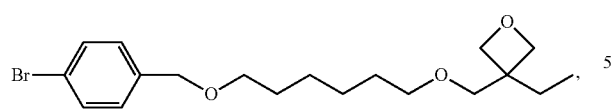

and (xiii) a compound formed by a reaction including the following monomer 6, monomer 15, and monomer B as reactants:

Monomer 6

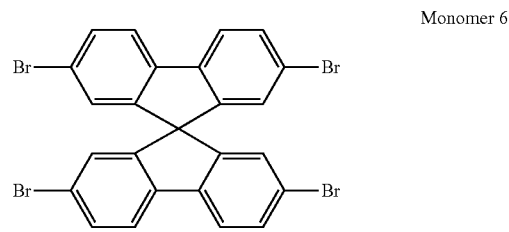

Monomer 15

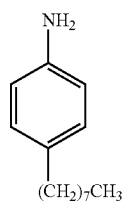

Monomer B

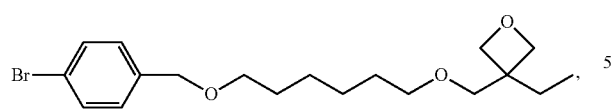

25. The organic electroluminescent element according to claim 17, wherein the organic thin film is at least one of a hole transport layer and a light emitting layer.

* * * * *